United States Patent
Fujita et al.

(10) Patent No.: US 9,799,836 B2
(45) Date of Patent: Oct. 24, 2017

(54) LIGHT EMITTING ELEMENT, LIGHT EMITTING DEVICE, AUTHENTICATION DEVICE, AND ELECTRONIC DEVICE

(71) Applicant: SEIKO EPSON CORPORATION, Tokyo (JP)

(72) Inventors: Tetsuji Fujita, Nagano (JP); Hidetoshi Yamamoto, Nagano (JP); Yuiga Hamade, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 276 days.

(21) Appl. No.: 14/628,975

(22) Filed: Feb. 23, 2015

(65) Prior Publication Data
US 2015/0249213 A1 Sep. 3, 2015

(30) Foreign Application Priority Data

Feb. 28, 2014 (JP) .................................. 2014-039914

(51) Int. Cl.
*H01L 51/00* (2006.01)
*H01L 51/50* (2006.01)

(52) U.S. Cl.
CPC ........ *H01L 51/008* (2013.01); *H01L 51/0054* (2013.01); *H01L 51/0072* (2013.01); *H01L 51/508* (2013.01); *H01L 2251/308* (2013.01)

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,294,869 | A | 3/1994 | Tang et al. |
| 5,449,564 | A | 9/1995 | Nishio et al. |
| 5,449,654 | A | 9/1995 | Prin et al. |

(Continued)

FOREIGN PATENT DOCUMENTS

| | | |
|---|---|---|
| EP | 0281381 B1 | 7/1992 |
| JP | 63-264692 A | 11/1988 |

(Continued)

OTHER PUBLICATIONS

Debad et al.; Dibenzotetraphenylperiflanthene: Synthesis, Photophysical Properties, and Electrogenerated Chemiluminescence; Journal of the American Chemical Society 118; 1996; pp. 2374-2379.

(Continued)

*Primary Examiner* — Robert S Loewe
(74) *Attorney, Agent, or Firm* — Global IP Counselors, LLP

(57) ABSTRACT

Provided are a light emitting element with a high efficiency and a long life that emits light in a near-infrared region, and a light emitting device, authentication device and electronic device that include the light emitting element. A light emitting element (1) according to one aspect of the invention includes an anode (3), a cathode (8), and a light emitting layer (5) that is provided between the anode (3) and the cathode (8) and that emits light by conducting current between the anode (3) and the cathode (8). The light emitting layer (5) includes a pyrromethene-based boron complex as a light emitting material and a tetracene-based material as a host material for retaining the light emitting material.

14 Claims, 10 Drawing Sheets

(56) References Cited

U.S. PATENT DOCUMENTS

| | | | |
|---|---|---|---|
| 6,004,685 A | 12/1999 | Antoniadis et al. | |
| 6,680,131 B1 | 1/2004 | Ishibashi et al. | |
| 6,805,978 B2 | 10/2004 | Murase et al. | |
| 8,778,510 B2 | 7/2014 | Okuda et al. | |
| 2003/0082406 A1 | 5/2003 | Murase et al. | |
| 2004/0185300 A1* | 9/2004 | Hatwar | H01L 51/5064 428/690 |
| 2005/0208327 A1* | 9/2005 | Begley | C09K 11/06 428/690 |
| 2007/0092759 A1* | 4/2007 | Begley | H01L 51/0058 428/690 |
| 2008/0102534 A1* | 5/2008 | Ulrich | C07F 5/02 436/172 |
| 2012/0037890 A1 | 2/2012 | Okuda et al. | |
| 2012/0262057 A1* | 10/2012 | Fujita | C07D 471/04 313/504 |
| 2012/0267615 A1* | 10/2012 | Fujita | C09K 11/06 257/40 |
| 2013/0037784 A1* | 2/2013 | Yamamoto | C07D 487/04 257/40 |
| 2014/0076403 A1* | 3/2014 | Forrest | H01L 51/008 136/263 |
| 2015/0236226 A1* | 8/2015 | Fujita | H01L 33/504 257/98 |
| 2016/0018405 A1* | 1/2016 | Chiu | G01N 33/588 436/501 |

FOREIGN PATENT DOCUMENTS

| | | | | |
|---|---|---|---|---|
| JP | 02-255788 A | 10/1990 | | |
| JP | 03-162481 A | 7/1991 | | |
| JP | 03-177486 A | 8/1991 | | |
| JP | 05-032966 A | 2/1993 | | |
| JP | 05-214334 A | 8/1993 | | |
| JP | 05-258859 A | 10/1993 | | |
| JP | 06-136359 A | 5/1994 | | |
| JP | 06-145146 A | 5/1994 | | |
| JP | 06-240246 A | 8/1994 | | |
| JP | 10-030295 A | 2/1998 | | |
| JP | 11-233261 A | 8/1999 | | |
| JP | 2000-091073 A | 3/2000 | | |
| JP | 2000-091973 A | 3/2000 | | |
| JP | 2000-310538 A | 11/2000 | | |
| JP | 2001-110570 A | 4/2001 | | |
| JP | 2003-012676 A | 1/2003 | | |
| JP | 2005-053900 A | 3/2005 | | |
| JP | 4000893 B2 | 10/2007 | | |
| JP | WO 2009084548 A1 * | 7/2009 | | C08G 61/02 |
| JP | 2010-061824 A | 3/2010 | | |
| JP | 2013-105665 A | 5/2013 | | |
| WO | 2010/009098 A1 | 9/2010 | | |

OTHER PUBLICATIONS

Kawabe et al.; Electroluminescence of Green Light Region in Doped Anthracene; Japanese Journal of Applied Physics 10; 1971; pp. 527-528.

Qian et al.; Near-Infrared Organic Compounds and Emerging Applications; Chemistry Asian Journal 5; 2010; pp. 1006-1029.

\* cited by examiner

LIGHT EMITTING ELEMENT, LIGHT EMITTING DEVICE, AUTHENTICATION DEVICE, AND ELECTRONIC DEVICE

This application claims the benefit of Japanese Patent Application No. 2014-039914, filed on Feb. 28, 2014. The content of the aforementioned application is incorporated herein by reference in its entirety.

BACKGROUND

1. Technical Field

The present invention relates to a light emitting element, a light emitting device, an authentication device, and an electronic device.

2. Related Art

An organic electroluminescent element (so-called organic EL element) is a light emitting element having a structure in which at least one light emitting organic layer is interposed between an anode and a cathode. In such a light emitting element, electrons are injected into a light emitting layer from the cathode side and positive holes are injected into the same from the anode side by applying an electric field between the cathode and the anode, and thus the electrons and the positive holes recombine with each other in the light emitting layer to produce excitons. When the excitons return to the ground state, corresponding energy is released as light. A light emitting element that emits light in a long wavelength region exceeding 700 nm is known as such a light emitting element (see JP-A-2000-091973 and JP-A-2001-110570, for example).

For example, in the light emitting element described in JP-A-2000-091973 and JP-A-2001-110570, a material in which an amine serving as an electron donor and a nitrile group serving as an electron acceptor coexist as functional groups in its molecule is used as a dopant in the light emitting layer to make the wavelength of emitted light longer.

Moreover, it has been known that a pyrromethene-based boron complex is used as a light emitting material (see JP-A-2005-053900 and JP-A-2013-105665, for example).

However, no element with a high efficiency and a long life that emits light in a near-infrared region could be realized before.

Moreover, it has been desired that a light emitting element with a high efficiency and a long life that performs surface light emission in a near-infrared region is realized as, for example, a light source for biometric authentication for authenticating individuals using biological information such as veins and fingerprints.

SUMMARY

An advantage of some aspects of the invention is to provide a light emitting element with a high efficiency and a long life that emits light in a near-infrared region, and a light emitting device, authentication device and electronic device that include the light emitting element.

Such an advantage is achieved by the following invention.

A light emitting element according to an aspect of the invention includes an anode, a cathode, and a light emitting layer that is provided between the anode and the cathode and that emits light by conducting current between the anode and the cathode. The light emitting layer includes a compound represented by the following formula (1) as a light emitting material and a compound represented by the following formula IRH-1 as a host material for retaining the light emitting material.

[Chemical Formula 1]

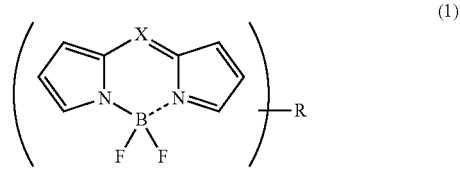

(1)

[In the formula (1), X represents a carbon atom to which hydrogen binds, or a nitrogen atom, and R represents a hydrogen atom, an alkyl group, an aryl group that may have a substituent group, an allyl group, an alkoxy group, or a heterocyclic group.]

[Chemical Formula 2]

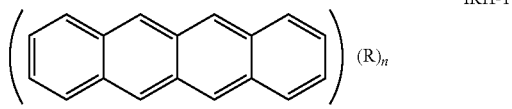

IRH-1

[In the formula IRH-1, n represents a natural number from 1 to 12, and each R independently represents a hydrogen atom, an alkyl group, an aryl group that may have a substituent group, or an arylamino group.]

With the light emitting element configured in this manner, a compound represented by the formula (1) (pyrromethene-based boron complex) is used as a light emitting material, thus making it possible to cause the light emitting element to emit light in a long wavelength region exceeding 700 nm (in a near-infrared region).

Moreover, a tetracene-based material is used as a host material, thus making it possible to efficiently transfer energy from the host material to the light emitting material. Therefore, it is possible to cause the light emitting element to have a superior light emission efficiency.

Also, a tetracene-based material has a superior stability (durability) against electrons and holes, thus making it possible to realize a long life for the light emitting layer, and in turn, to realize a long life for the light emitting element.

In the light emitting element according to an aspect of the invention, it is preferable that the host material is a compound represented by the following formula IRH-2.

[Chemical Formula 3]

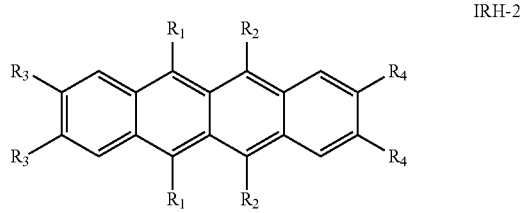

IRH-2

[In the formula IRH-2, $R_1$ to $R_4$ independently represent a hydrogen atom, an alkyl group, an aryl group that may have a substituent group, or an arylamino group. Moreover, $R_1$ to $R_4$ may be the same as or different from each other.]

This makes it possible to suppress an increase in voltage during continuous drive, to further enhance the light emission efficiency of the light emitting element, and to realize a long life for the light emitting element.

In the light emitting element according to an aspect of the invention, it is preferable that the host material is a compound represented by the following formula IRH-3.

[Chemical Formula 4]

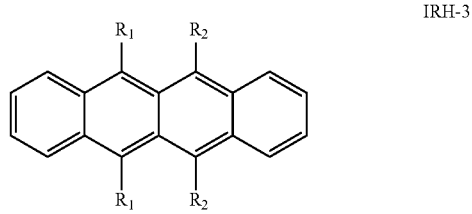

IRH-3

[In the formula IRH-3, $R_1$ and $R_2$ independently represent a hydrogen atom, an alkyl group, an aryl group that may have a substituent group, or an arylamino group. Moreover, $R_1$ and $R_2$ may be the same as or different from each other.]

This makes it possible to suppress an increase in voltage during continuous drive, to further enhance the light emission efficiency of the light emitting element, and to realize a long life for the light emitting element.

In the light emitting element according to an aspect of the invention, it is preferable that the host material is constituted by a carbon atom and a hydrogen atom.

This makes it possible to prevent the host material and the light emitting material from unintendedly interacting with each other. Therefore, it is possible to enhance the light emission efficiency of the light emitting element. Also, it is possible to enhance the durability of the host material against electrons and positive holes. This makes it possible to realize a long life for the light emitting element.

In the light emitting element according to an aspect of the invention, it is preferable that the light emitting material is contained in the light emitting layer in an amount of 0.25 wt % or more to 1.0 wt % or less.

This makes it possible to cause the light emitting element to have a superior balance between its light emission efficiency and life span.

It is preferable that the light emitting element according to an aspect of the invention includes an electron transporting layer that is provided between the light emitting layer and the cathode and that includes a compound having an anthracene skeleton.

This makes it possible to efficiently transport and inject electrons to/into the light emitting layer. As a result, it is possible to enhance the light emission efficiency of the light emitting element.

In the light emitting element according to an aspect of the invention, it is preferable that the electron transporting layer includes a first electron transporting layer that includes an azaindolizine-based compound having an azaindolizine skeleton and an anthracene skeleton in a molecule thereof, and a second electron transporting layer that is provided between the first electron transporting layer and the light emitting layer and that includes an anthracene-based compound. The anthracene-based compound has an anthracene skeleton in a molecule thereof and is constituted by a carbon atom and a hydrogen atom.

This makes it possible to efficiently transport and inject electrons to/into the light emitting layer, and to suppress the deterioration of the electron transporting layer. As a result, it is possible to enhance the light emission efficiency of the light emitting element, and to realize a long life for the light emitting element.

In the light emitting element according to an aspect of the invention, it is preferable that the second electron transporting layer is thicker than the first electron transporting layer.

This makes it possible to efficiently transport and inject electrons to/into the light emitting layer, and to suppress the deterioration of the electron transporting layer while suppressing the driving voltage of the light emitting element.

In the light emitting element according to an aspect of the invention, it is preferable that the second electron transporting layer has a thickness of 10 nm or more to 75 nm or less.

This makes it possible to efficiently transport and inject electrons to/into the light emitting layer, and to suppress the deterioration of the electron transporting layer while suppressing the driving voltage of the light emitting element.

In the light emitting element according to an aspect of the invention, it is preferable that the electron transporting layer has a thickness of 55 nm or more to 95 nm or less.

This makes it possible to efficiently transport and inject electrons to/into the light emitting layer while suppressing the driving voltage of the light emitting element.

In the light emitting element according to an aspect of the invention, it is preferable that the light emitting layer has a thickness of 10 nm or more to 50 nm or less.

This makes it possible to realize a long life for the light emitting element while suppressing the driving voltage of the light emitting element.

A light emitting device according to an aspect of the invention includes the light emitting element according to an aspect of the invention.

Such a light emitting device can emit light in a near-infrared region. Moreover, the light emitting device includes the light emitting element with a high efficiency and a long life, and thus is superior in terms of reliability.

An authentication device according to an aspect of the invention includes the light emitting element according to an aspect of the invention.

Such an authentication device can perform biometric authentication using near-infrared light. Moreover, the authentication device includes the light emitting element with a high efficiency and a long life, and thus is superior in terms of reliability.

An electronic device according to an aspect of the invention includes the light emitting element according to an aspect of the invention.

Such an electronic device includes the light emitting element with a high efficiency and a long life, and thus is superior in terms of reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following describes preferred embodiments of a light emitting element, a light emitting device, an authentication device, and an electronic device according to aspects of the invention shown in the accompanying drawings.

Figure 1:
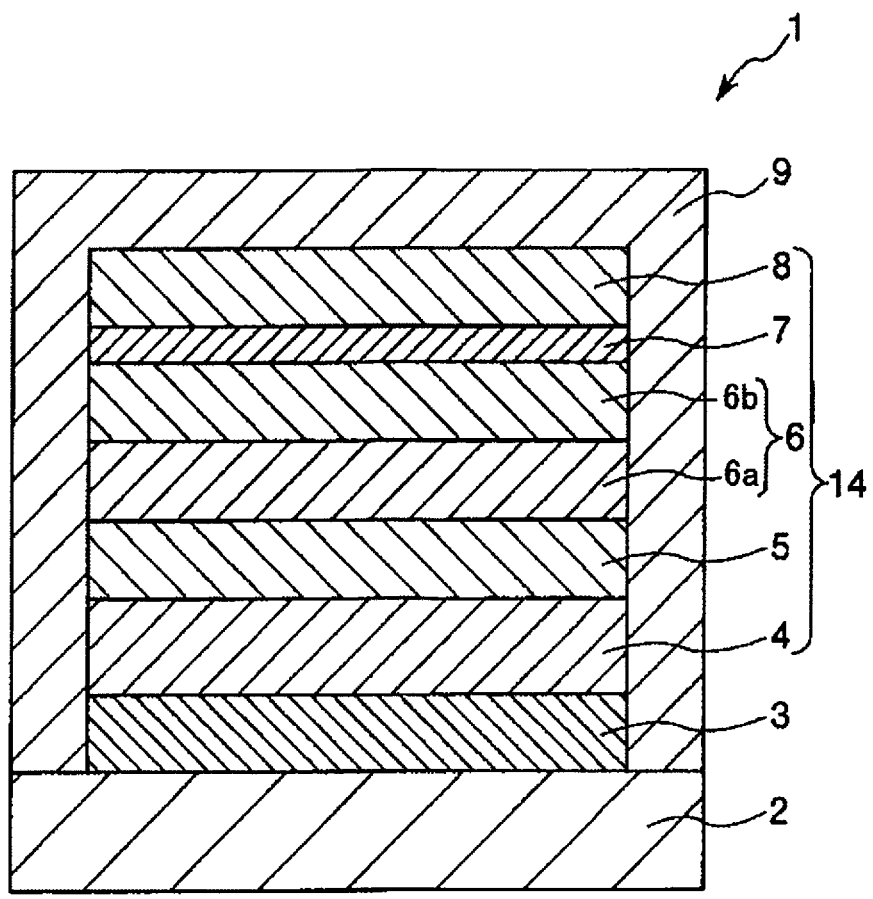
FIG. 1 is a schematic cross-sectional view of a light emitting element according to an embodiment of the invention.

FIG. 1 is a schematic cross-sectional view of a light emitting element according to an embodiment of the invention. It should be noted that a description will be given considering the upper side in FIG. 1 as "upper side" and the lower side in FIG. 1 as "lower side" for convenience of explanation hereinafter.

A light emitting element (electroluminescent element) 1 shown in FIG. 1 is obtained by laminating an anode 3, a positive hole injecting layer 4, a light emitting layer 5, an electron transporting layer 6, an electron injecting layer 7, and a cathode 8 in this order. That is, in the light emitting element 1, a laminated body 14, in which the positive hole injecting layer 4, the light emitting layer 5, the electron transporting layer 6, and the electron injecting layer 7 are laminated in this order from the anode 3 side to the cathode 8 side, is interposed between the anode 3 and the cathode 8.

The entire light emitting element 1 is provided on a substrate 2, and is sealed by a sealing member 9.

In this light emitting element 1, electrons are supplied to (injected into) the light emitting layer 5 from the cathode 8 side and positive holes are supplied to (injected into) the light emitting layer 5 from the anode 3 side by applying a driving voltage to the anode 3 and the cathode 8. Then, the positive holes and the electrons recombine with each other in the light emitting layer 5, and excitons are produced due to energy released during the recombination. When the excitons return to the ground state, the energy (fluorescence or phosphorescence) is released (emitted). The light emitting element 1 thereby emits light.

In particular, this light emitting element 1 emits light in a near-infrared region by using a pyrromethene-based boron complex as a light emitting material of the light emitting layer 5 as described later. It should be noted that "near-infrared region" refers to a wavelength region of 700 nm or more to 1500 nm or less in this specification.

The substrate 2 supports the anode 3. Since the light emitting element 1 according to this embodiment has a configuration in which light is emitted from the substrate 2 side (bottom emission type), the substrate 2 and the anode 3 are substantially transparent (colorless and transparent, colored and transparent, or translucent).

Examples of component material of the substrate 2 include resin materials such as polyethylene terephthalate, polyethylene naphthalate, polypropylene, cycloolefin polymer, polyamide, polyether sulfone, polymethyl methacrylate, polycarbonate and polyarylate, and glass materials such as quartz glass and soda glass. These materials can be used alone or in a combination of two or more.

The average thickness of this substrate 2 is preferably about 0.1 to 30 mm, and more preferably about 0.1 to 10 mm, but is not particularly limited thereto.

It should be noted that if the light emitting element 1 has a configuration in which light is emitted from the side opposite to the substrate 2 (top emission type), both a transparent substrate and an opaque substrate can be used as the substrate 2.

Examples of the opaque substrate include a substrate constituted by a ceramic material such as alumina, a metal substrate such as stainless steel that has a surface on which an oxide film (insulating film) is formed, and a substrate constituted by a resin material.

Moreover, in this light emitting element 1, the distance from the anode 3 to the cathode 8 (i.e., the average thickness of the laminated body 14) is preferably 100 to 500 nm, more preferably 100 to 300 nm, and even more preferably 100 to 250 nm. Thus, the driving voltage of the light emitting element 1 can be easily and reliably set within a practical range.

Hereinafter, the respective portions constituting the light emitting element 1 will be described successively.

Anode

The anode 3 is an electrode for injecting positive holes into the positive hole injecting layer 4. It is preferable to use a material that has a large work function and a superior conductivity as a component material of this anode 3.

Examples of the component material of the anode 3 include oxides such as ITO (indium tin oxide), IZO (indium zinc oxide), $In_3O_3$, $SnO_2$, $SnO_2$ containing Sb and ZnO containing Al, and Au, Pt, Ag, and Cu or an alloy thereof. These materials can be used alone or in a combination of two or more.

In particular, it is preferable that the anode 3 is constituted by ITO. ITO is a material that has transparency, has a large work function, and has superior conductivity. This makes it possible to efficiently inject positive holes from the anode 3 into the positive hole injecting layer 4.

Moreover, it is preferable that plasma treatment is performed on the surface of the anode 3 on the positive hole injecting layer 4 side (upper surface in FIG. 1). This makes it possible to enhance the chemical and mechanical stability of the interface between the anode 3 and the positive hole injecting layer 4. As a result, it is possible to enhance the property of injecting the positive holes from the anode 3 into the positive hole injecting layer 4. It should be noted that the plasma treatment will be described in detail in the explanation of a method for producing the light emitting element 1, which will be described later.

The average thickness of this anode 3 is preferably about 10 to 200 nm, and more preferably about 50 to 150 mm, but is not particularly limited thereto.

Cathode

On the other hand, the cathode 8 is an electrode for injecting electrons into the electron transporting layer 6 via the electron injecting layer 7, which will be described later.

It is preferable to use a material that has a small work function as a component material of this cathode 8.

Examples of the component material of the cathode 8 include Li, Mg, Ca, Sr, La, Ce, Er, Eu, Sc, Y, Yb, Ag, Cu, Al, Cs and Rb, or an alloy thereof. These materials can be used alone or in a combination of two or more (as a multi-layer laminated body, a mixed layer of a plurality of materials, or the like).

In particular, when an alloy is used as the component material of the cathode 8, it is preferable to use an alloy containing a stable metallic element such as Ag, Al or Cu, specifically, an alloy such as MgAg, AlLi or CuLi. Using such an alloy as the component material of the cathode 8 makes it possible to enhance the electron injection efficiency and stability of the cathode 8.

The average thickness of this cathode 8 is preferably about 100 to 10000 nm, and more preferably about 100 to 500 mm, but is not particularly limited thereto.

It should be noted that the light emitting element 1 according to this embodiment is a bottom emission type, and therefore, optical transparency is not particularly required for the cathode 8. If the light emitting element 1 according to this embodiment is a top emission type, it is necessary to emit light from the cathode 8 side, and therefore, the average thickness of the cathode 8 is preferably about 1 to 50 nm.

Positive Hole Injecting Layer

The positive hole injecting layer 4 has a function for enhancing the efficiency of positive hole injection from the anode 3 (i.e., it has a positive hole injecting property). This makes it possible to enhance the light emission efficiency of the light emitting element 1. Here, the positive hole injecting layer 4 also has a function for transporting positive holes injected from the anode 3, to the light emitting layer 5 (i.e., it has a positive hole transporting property). Accordingly, the positive hole injecting layer 4 has a positive hole transporting property as described above, and thus can be also referred to as "positive hole transporting layer". It should be noted that a positive hole transporting layer constituted by a material that is different from the positive hole injecting layer 4 (e.g., amine-based compound such as a benzidine derivative) may be separately provided between the positive hole injecting layer 4 and the light emitting layer 5.

This positive hole injecting layer 4 includes a material that has a positive hole injecting property (positive hole injecting material).

Examples of the positive hole injecting material included in this positive hole injecting layer 4 include copper phthalocyanine, and amine-based materials such as 4,4',4"-tris(N, N-phenyl-3-methylphenylamino)triphenylamine (m-MT-DATA) and N,N'-bis-(4-diphenylamino-phenyl)-N,N'-diphenyl-biphenyl-4-4'-diamine, but are not particularly limited thereto.

In particular, it is preferable to use an amine-based material as the positive hole injecting material included in the positive hole injecting layer 4 from the viewpoint of being superior in terms of positive hole injecting property and positive hole transporting property. It is more preferable to use diaminobenzene derivatives, benzidine derivatives (materials having a benzidine skeleton), triamine-based compounds having both a "diaminobenzene" unit and a "benzidine" unit in its molecule, or tetraamine-based compounds (specifically, compounds represented by the following formulas HIL1 to HIL27 for example).

[Chemical Formula 5]

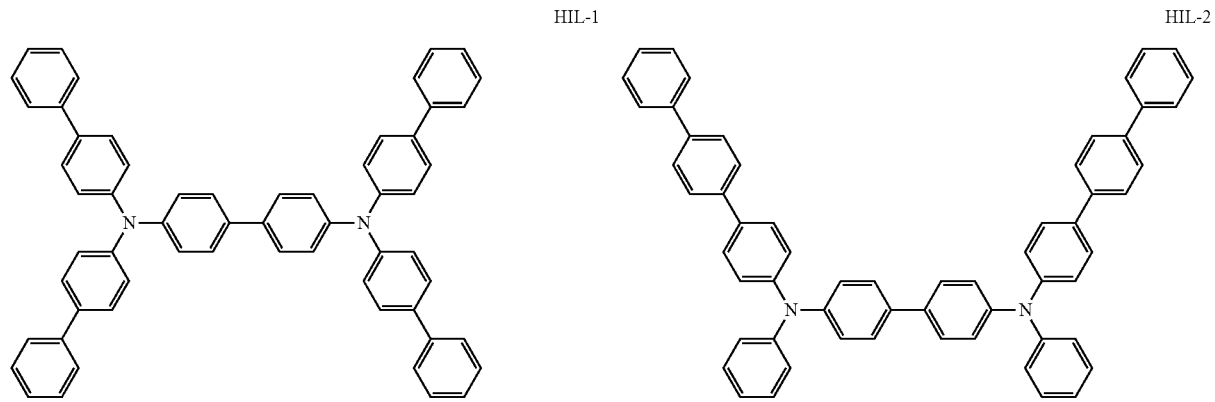

-continued
HIL-3
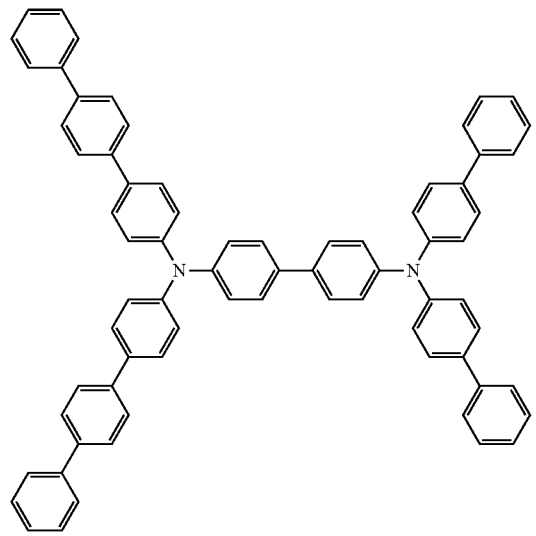
HIL-4
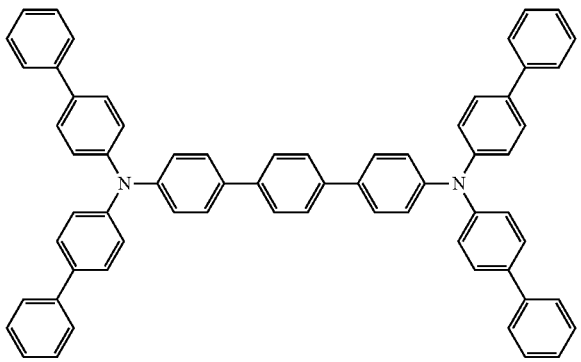
HIL-5
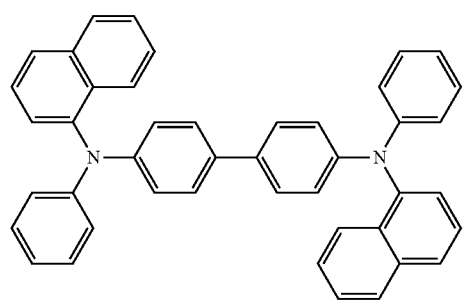
HIL-6
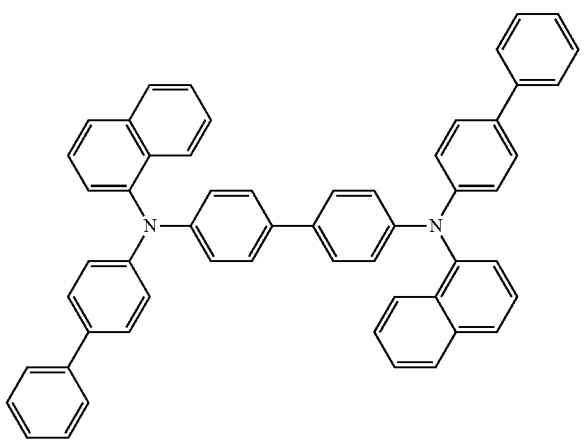
HIL-7
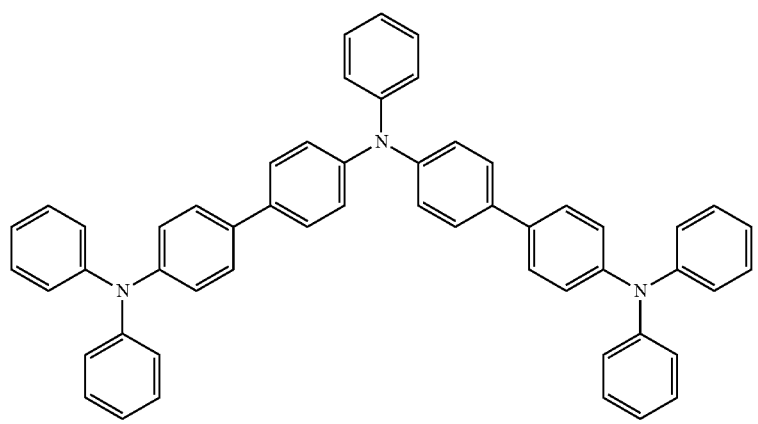

HIL-8
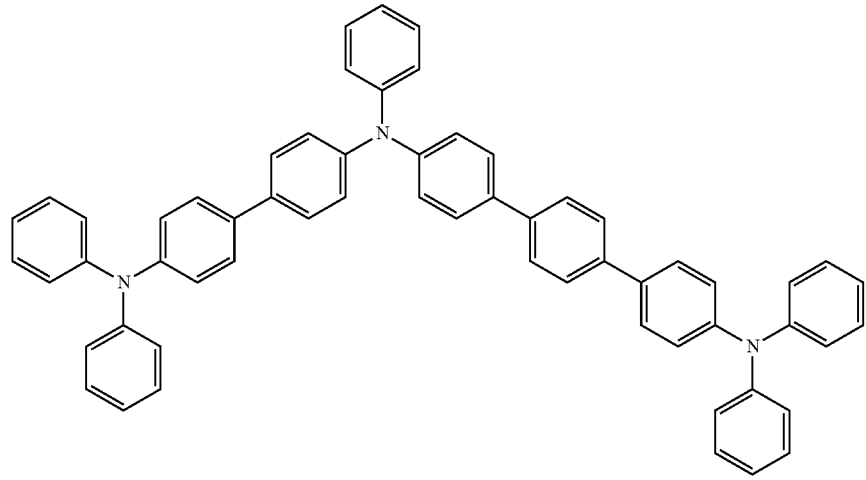
HIL-9
HIL-10
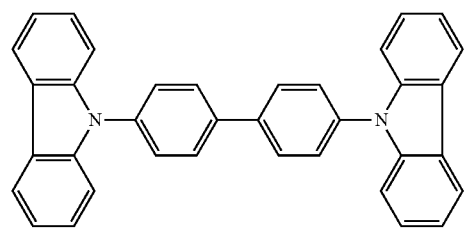
[Chemical Formula 6]
HIL-11
HIL-12
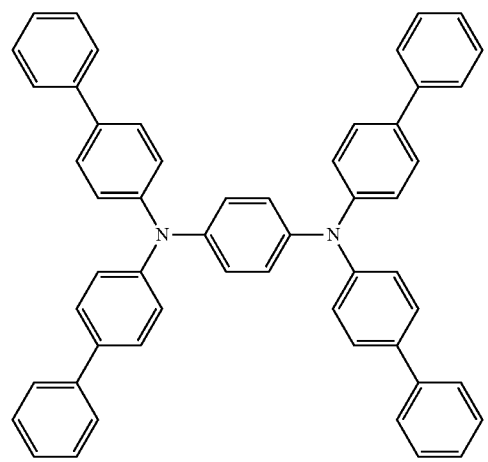
HIL-13
HIL-14
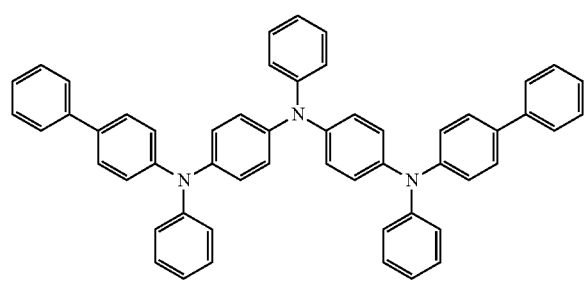
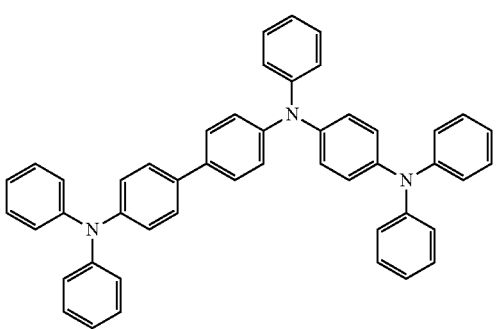

-continued
HIL-15
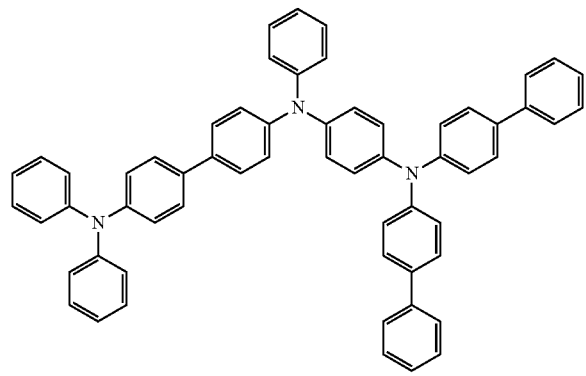
HIL-16
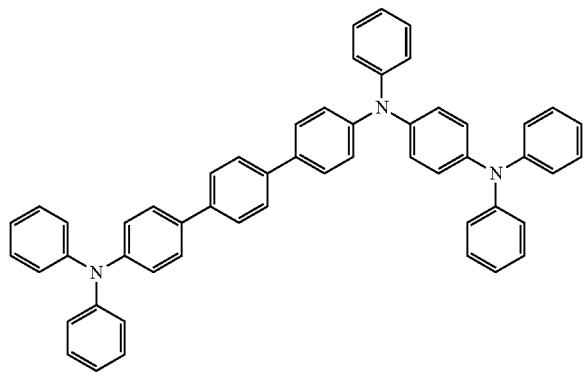
HIL-17
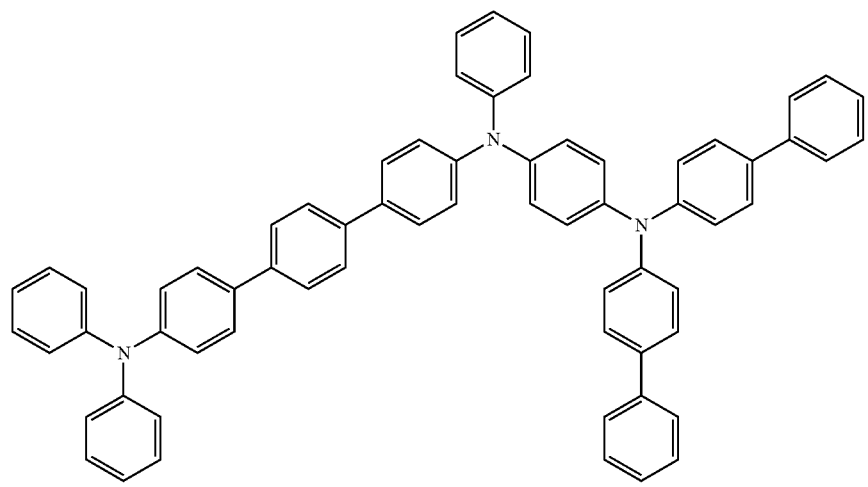
HIL-18
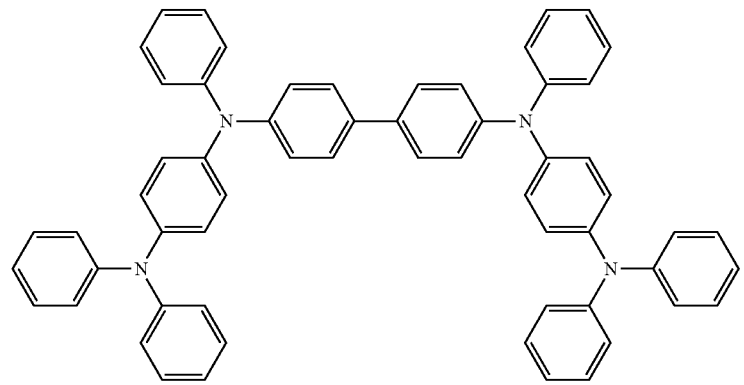
HIL-19
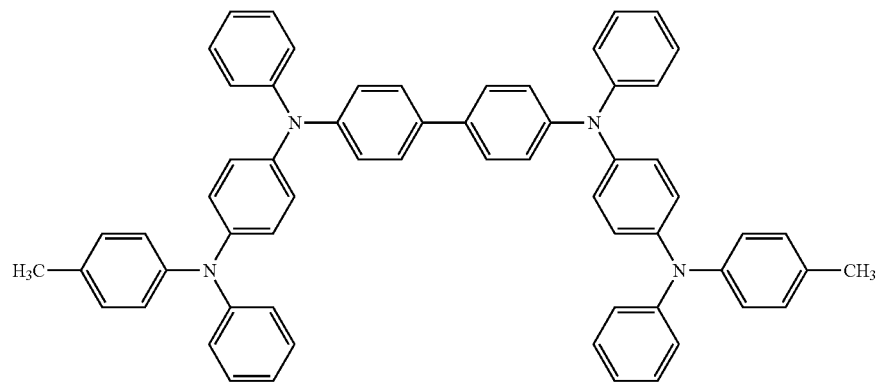

-continued
HIL-20
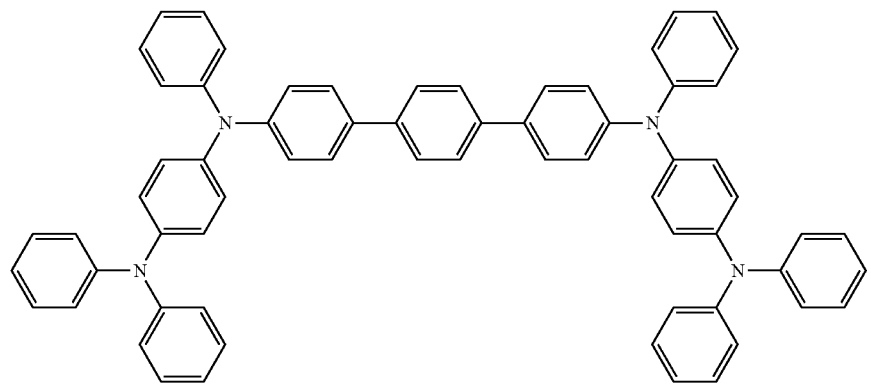
HIL-21
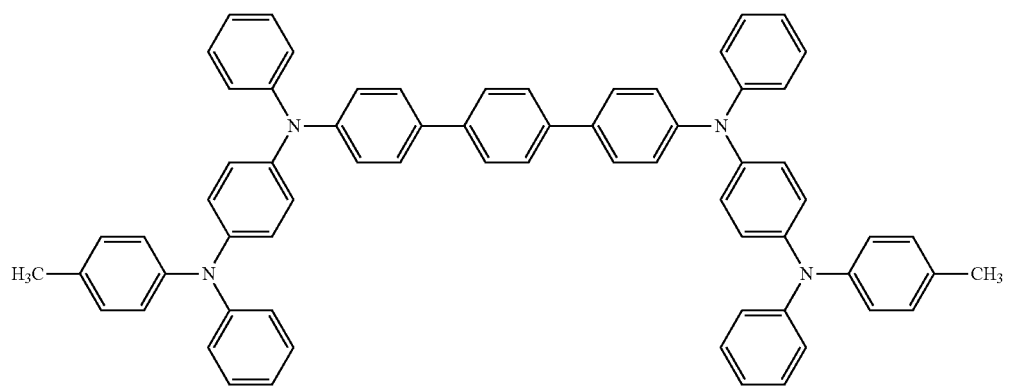
[Chemical Formula 7]
HIL-22
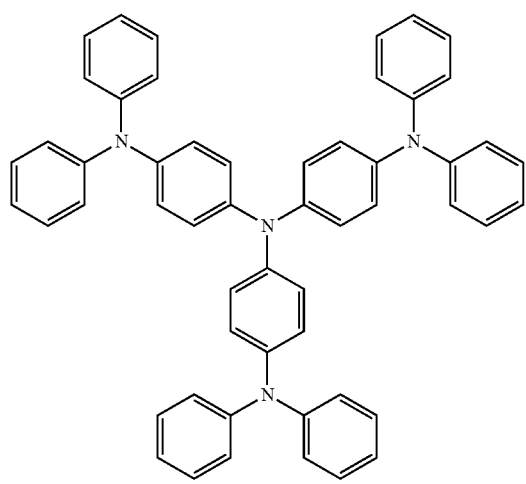
HIL-23
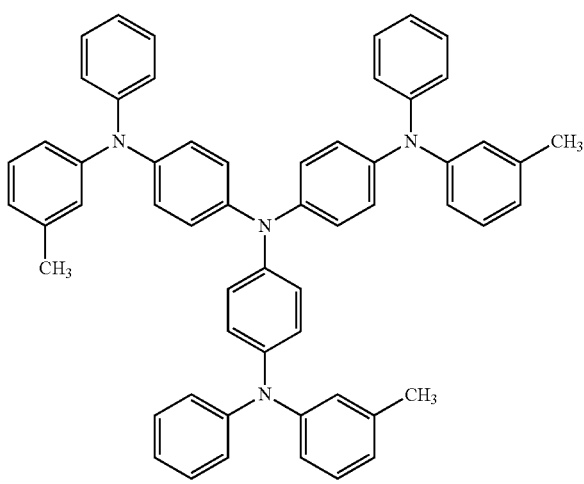

-continued

HIL-24

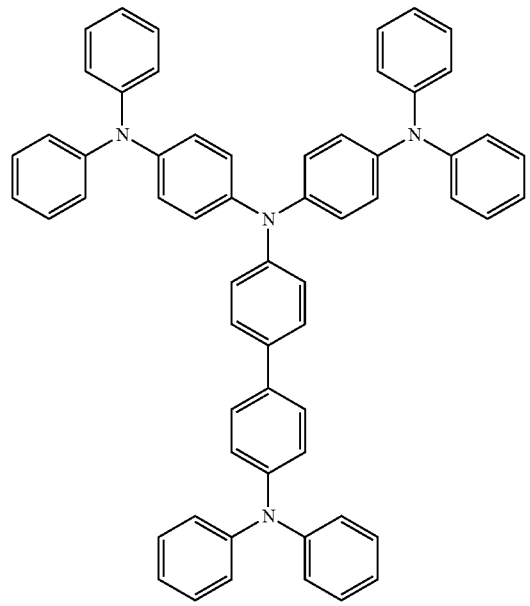

HIL-25

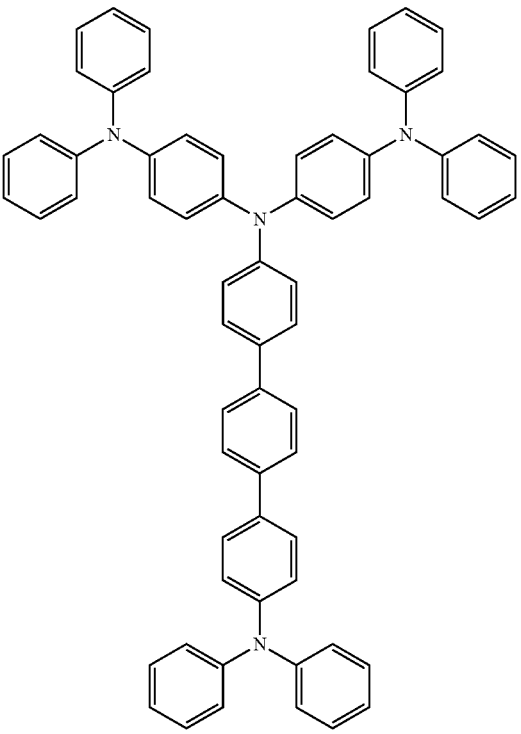

HIL-26

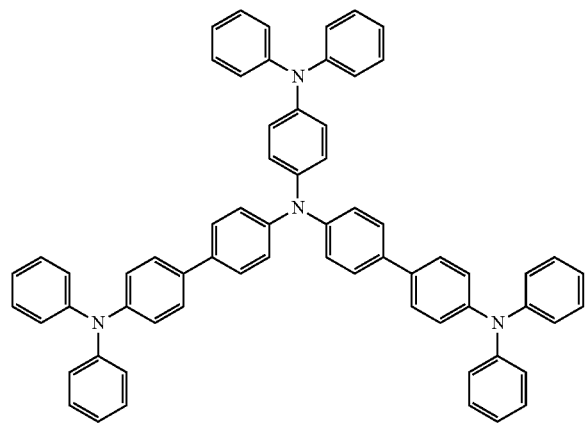

HIL-27

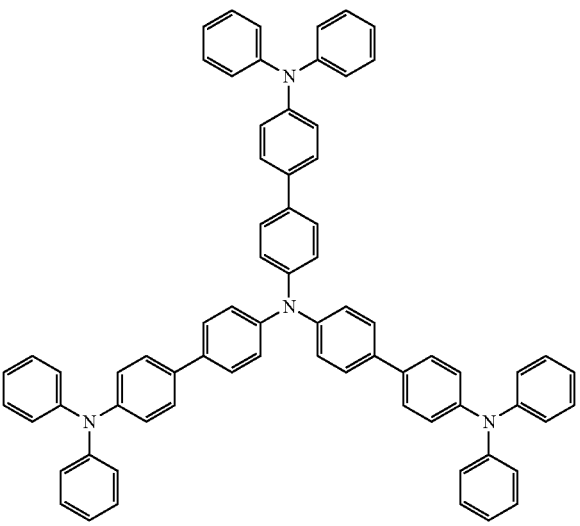

Moreover, it is preferable that the difference between the LUMO of the component material of the positive hole injecting layer 4 and the LUMO of the host material used in the light emitting layer 5 is 0.5 eV or more. This makes it possible to reduce the passage of electrons from the light emitting layer 5 to the positive hole injecting layer 4, and to enhance the light emission efficiency.

In addition, it is preferable that the HOMO of the component material of the positive hole injecting layer 4 is 4.7 eV or more to 5.6 eV or less, and that the LUMO of the component material of the positive hole injecting layer 4 is 2.2 eV or more to 3.0 eV or less.

The average thickness of this positive hole injecting layer 4 is preferably about 5 to 90 nm, and more preferably about 10 to 70 nm, but is not particularly limited thereto.

Light Emitting Layer

The light emitting layer 5 emits light by conducting current between the anode 3 and the cathode 8.

The light emitting layer 5 includes a light emitting material. In particular, this light emitting layer 5 includes a pyrromethene-based boron complex that is a compound represented by the following formula (1) (also referred to as merely "pyrromethene-based boron complex" hereinafter) as a light emitting material.

[Chemical Formula 8]

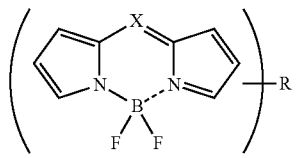

(1)

[In the formula (1), X represents a carbon atom to which hydrogen binds, or a nitrogen atom, and R represents a hydrogen atom, an alkyl group, an aryl group that may have a substituent group, an allyl group, an alkoxy group, or a heterocyclic group.]

Here, preferred examples of the heterocyclic group used as R in the formula (1) include a five-membered heterocyclic group such as pyrrole, furan or thiophene, or a six-membered heterocyclic group such as pyridine, but are not particularly limited thereto.

The light emitting layer 5 including such a pyrromethene-based boron complex can emit light in a wavelength region of 700 nm or more (a near-infrared region).

Moreover, the light emitting material used in the light emitting layer 5 need only be represented by the formula (1) and be capable of emitting light in a near-infrared region. It is preferable to use compounds represented by the following formulas (2) to (6), and more specifically, it is preferable to use compounds represented by the following formulas IRD-1 to IRD-5 or derivatives thereof, for example.

[Chemical Formula 9]

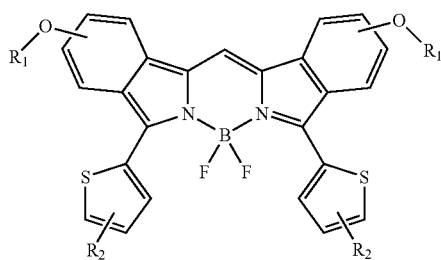

(2)

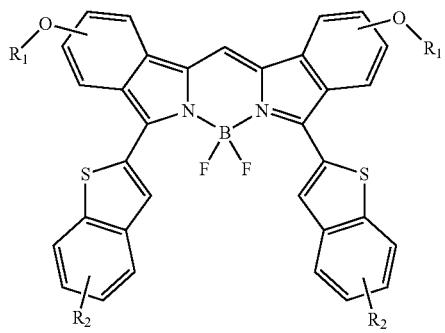

(3)

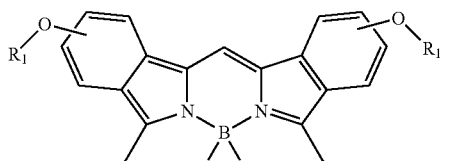

(4)

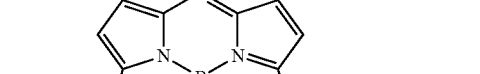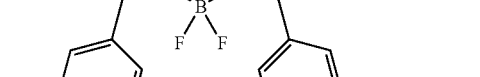

(5)

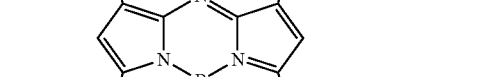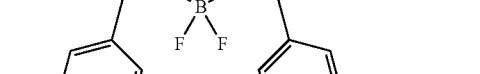

(6)

[In the formulas (2) to (6), each $R_1$ independently represents an alkyl group or aryl group that has one to five carbon atoms, and each $R_2$ independently represents a hydrogen atom, or an alkyl group or aryl group that has one to five carbon atoms.]

[Chemical Formula 10]

IRD-1

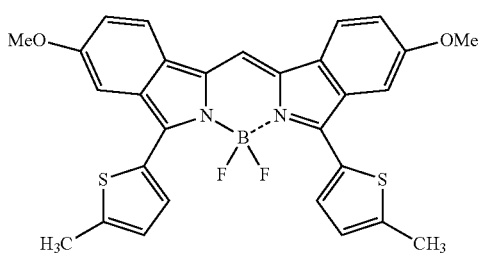

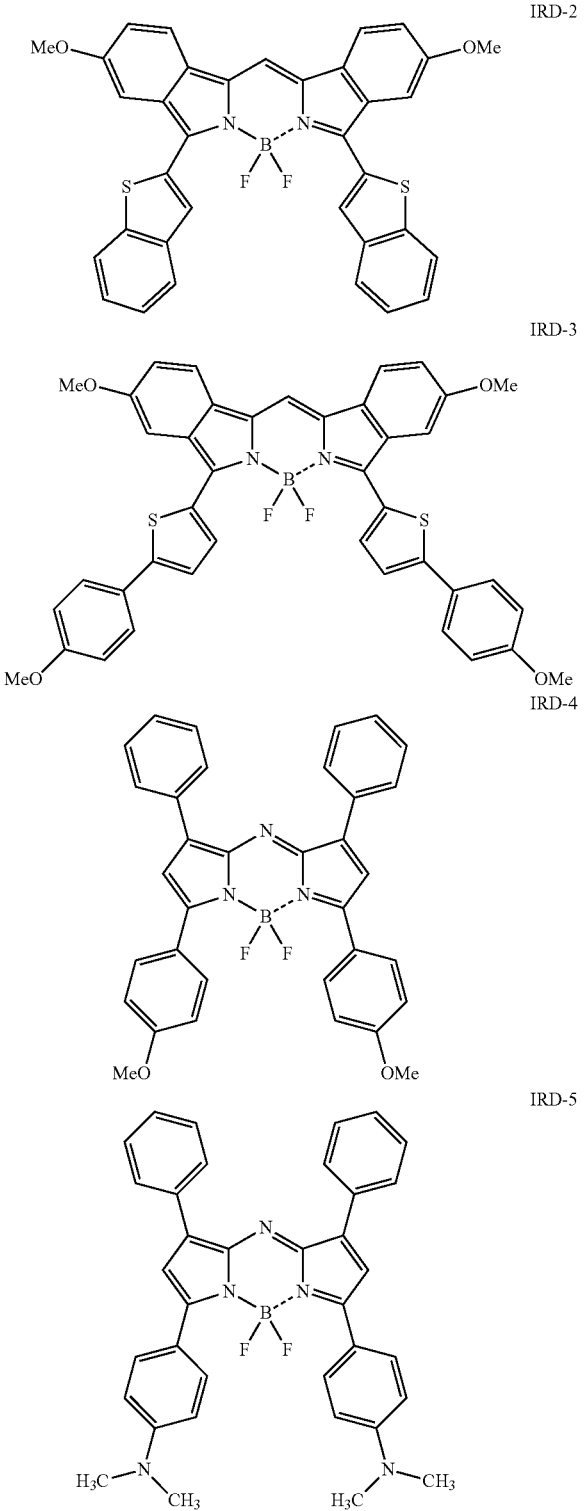

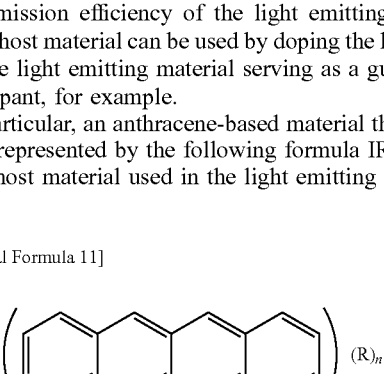

It should be noted that the light emitting layer 5 may include light emitting materials (various fluorescent materials, various phosphorescent materials) other than the above-described light emitting materials.

Moreover, in addition to the above-described light emitting material, the light emitting layer 5 also includes a host material to which this light emitting material is added (or that carries this light emitting material) as a guest material (dopant). This host material has a function for recombining positive holes and electrons to produce excitons, and for transferring the energy of the excitons to the light emitting material (Förster transfer or Dexter transfer) to excite the light emitting material. This makes it possible to enhance the light emission efficiency of the light emitting element 1. Such a host material can be used by doping the host material with the light emitting material serving as a guest material as a dopant, for example.

In particular, an anthracene-based material that is a compound represented by the following formula IRH-1 is used as the host material used in the light emitting layer 5.

[Chemical Formula 11]

[In the formula IRH-1, n represents a natural number from 1 to 12, and each R independently represents a hydrogen atom, an alkyl group, an aryl group that may have a substituent group, or an arylamino group.]

The pyrromethene-based boron complex has a high polarity (a large polarization). Therefore, when it is contained in the light emitting layer at a high concentration in the case where it is used as the light emitting material, concentration quenching, which is a phenomenon in which the light emission efficiency decreases due to the interaction between the light emitting material molecules, is likely to occur.

On the other hand, the tetracene-based material has a low polarity (a small polarization). Therefore, the tetracene-based material can be used as the host material to reduce the interaction between the light emitting material molecules, and to reduce the concentration quenching property.

In contrast, in the case where $Alq_3$, which has a high polarity (a large polarization), is used as the host material for example, both the host material and the light emitting material have a high polarity (a large polarization). Therefore, the light emitting material molecules are likely to interact with each other, and the concentration quenching property becomes higher.

Moreover, in the case where the anthracene-based material, which is an acene-based material similarly to the tetracene-based material, is used as the host material, the effect of reducing the concentration quenching property is exhibited, but the light emission efficiency decreases compared with the case where the tetracene-based material is used as the host material. It is inferred that this is because the energy is insufficiently transferred from the host material to the light emitting material and electrons injected into the LUMO of the host material have a high probability of passing through the host material to the anode side when the anthracene-based material is used as the host material. For this reason, the anthracene-based material is not suitable for the host material.

For this reason, the acene-based material can be used as the host material to enhance the light emission efficiency of the light emitting element 1.

Moreover, the acene-based material has superior durability against electrons and positive holes. Also, the acene-based material has superior thermal stability. This makes it possible to realize a long life for the light emitting element 1. Since the acene-based material has superior thermal stability, it is possible to prevent decomposition of the host material due to the heat produced during the formation of the film when the light emitting layer is formed by a vapor-phase film deposition method. Therefore, it is possible to form the light emitting layer having superior film quality. As a result, in this regard as well, it is possible to enhance the light emission efficiency of the light emitting element 1 and to realize a long life.

Furthermore, since the acene-based material itself is unlikely to emit light, it is possible to prevent the host material from adversely affecting the light emission spectrum of the light emitting element 1.

Moreover, there is no particular limitation on the tetracene-based material used as the host material as long as it is represented by the formula IRH-1 and can exhibit a function as the host material as described above. It is preferable to use a compound represented by the following formula IRH-2, and it is more preferable to use a compound represented by the following formula IRH-3.

[Chemical Formula 12]

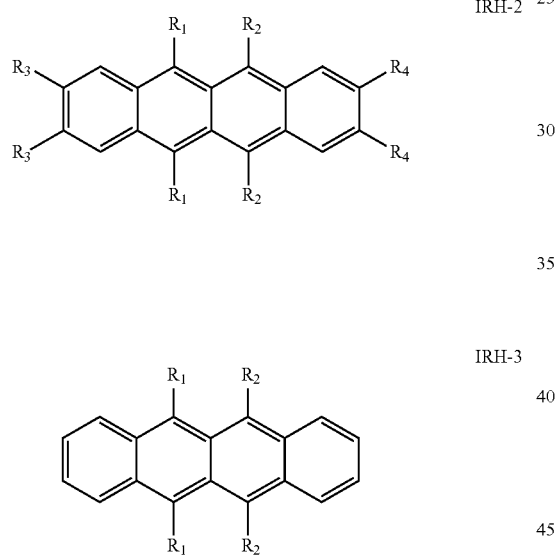

[In the formulas IRH-2 and IRH-3, $R_1$ to $R_4$ independently represent a hydrogen atom, an alkyl group, an aryl group that may have a substituent group, or an arylamino group. Moreover, $R_1$ to $R_4$ may be the same as or different from each other.]

Moreover, it is preferable that the tetracene-based material used as the host material is constituted by carbon atoms and hydrogen atoms. This makes it possible to reduce the polarity of the host material and to prevent the host material and the light emitting material from unintendedly interacting with each other. Therefore, it is possible to enhance the light emission efficiency of the light emitting element 1. Also, it is possible to enhance the durability of the host material against electrons and positive holes. This makes it possible to realize a long life for the light emitting element 1.

Specifically, it is preferable to use compounds represented by the following formulas H-1 to H-27 as the tetracene-based material, for example.

[Chemical Formula 13]

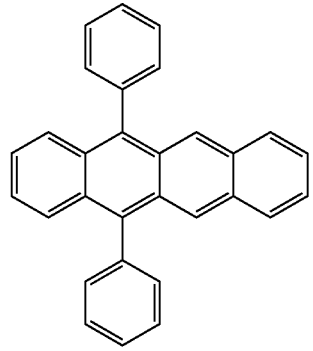

H-1

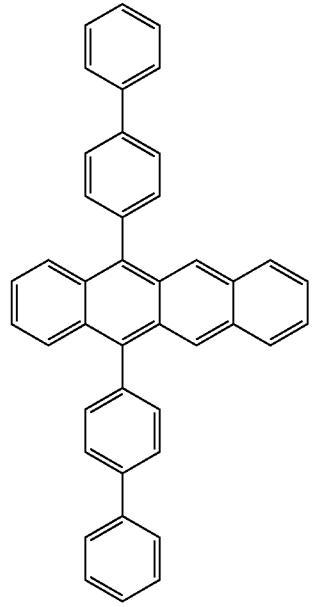

H-2

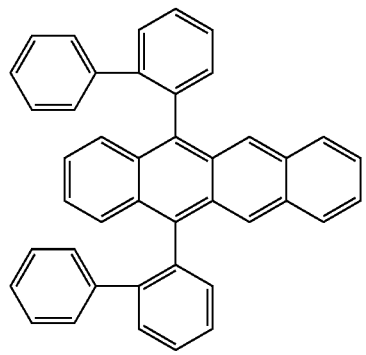

H-3

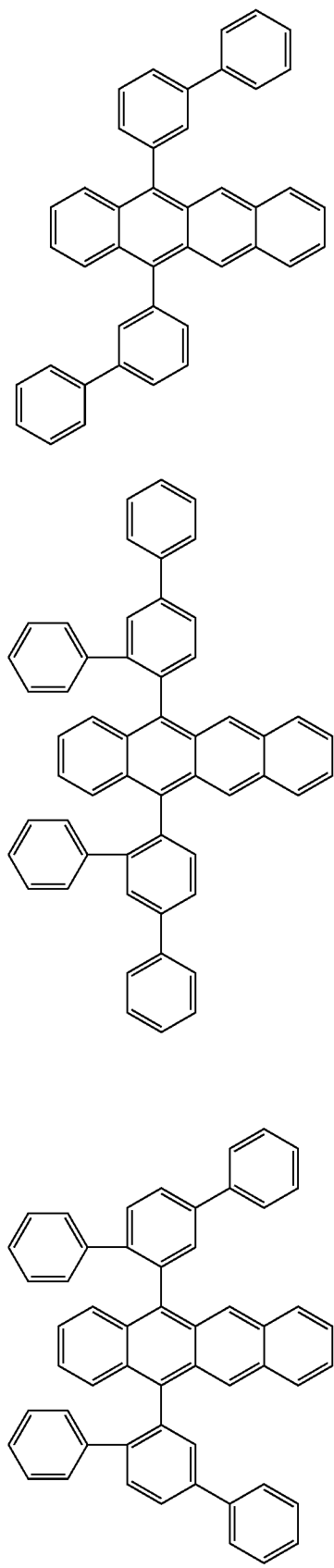
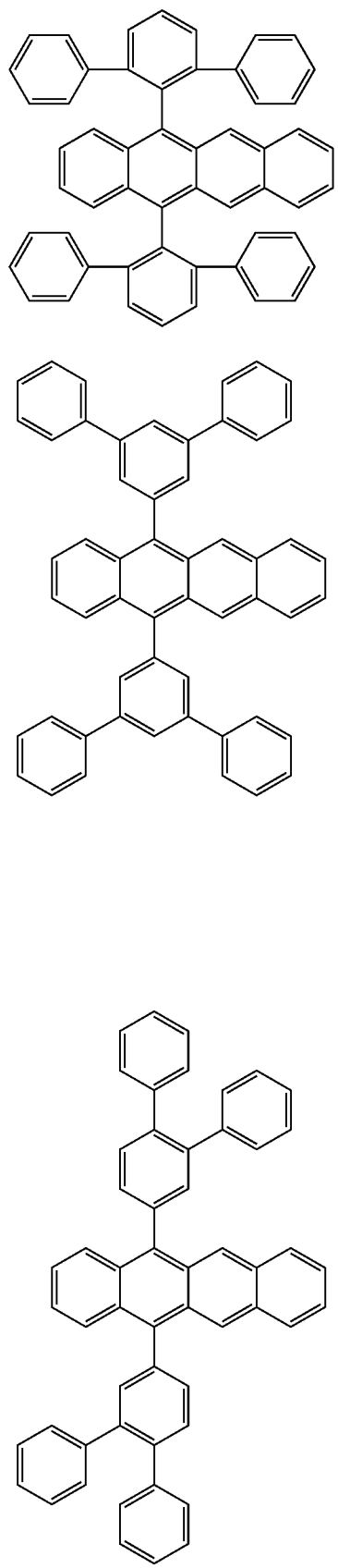

H-10
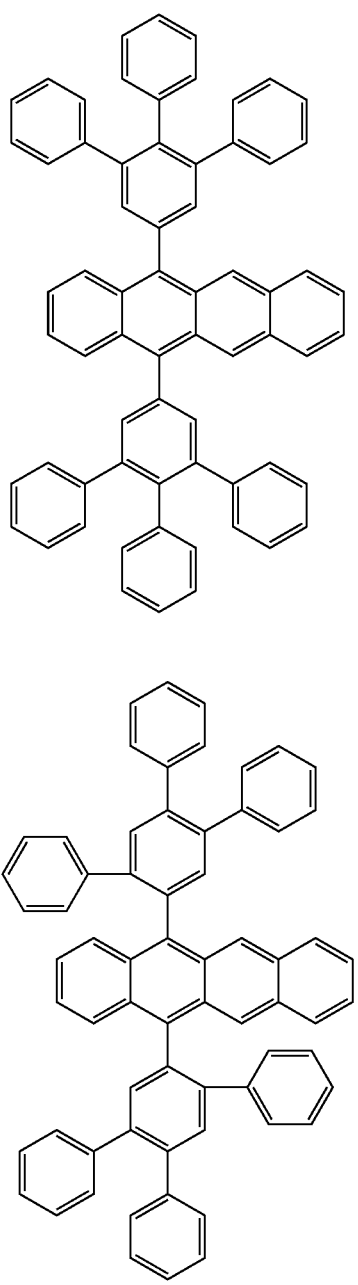
H-11
H-12
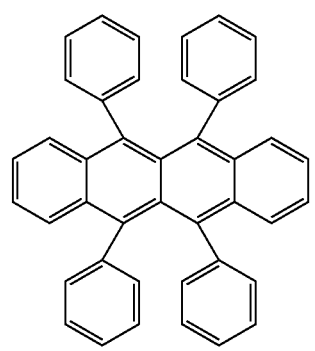
[Chemical Formula 14]
H-13
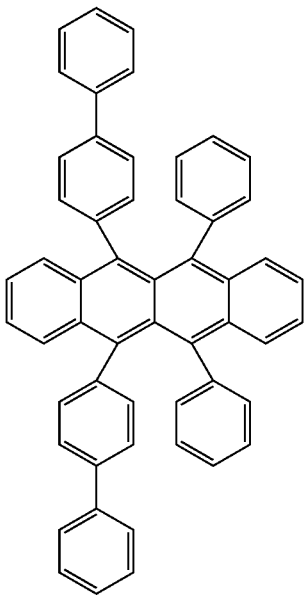
H-14
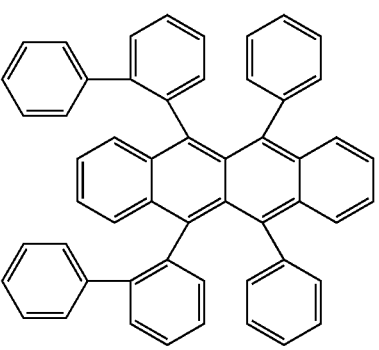
H-15
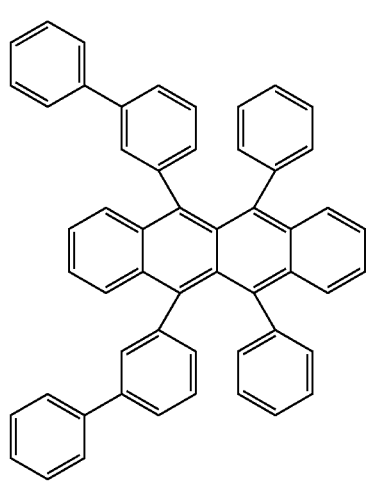

-continued
H-16
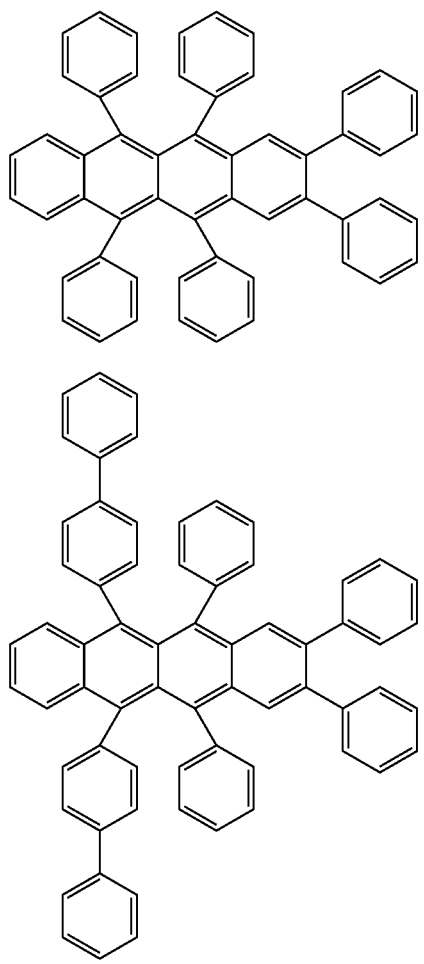
H-17
H-18
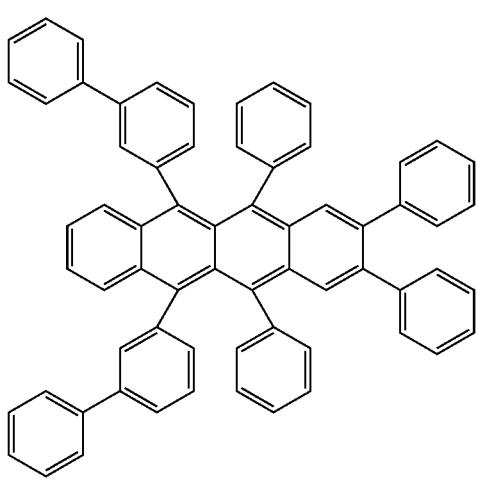
-continued
H-19
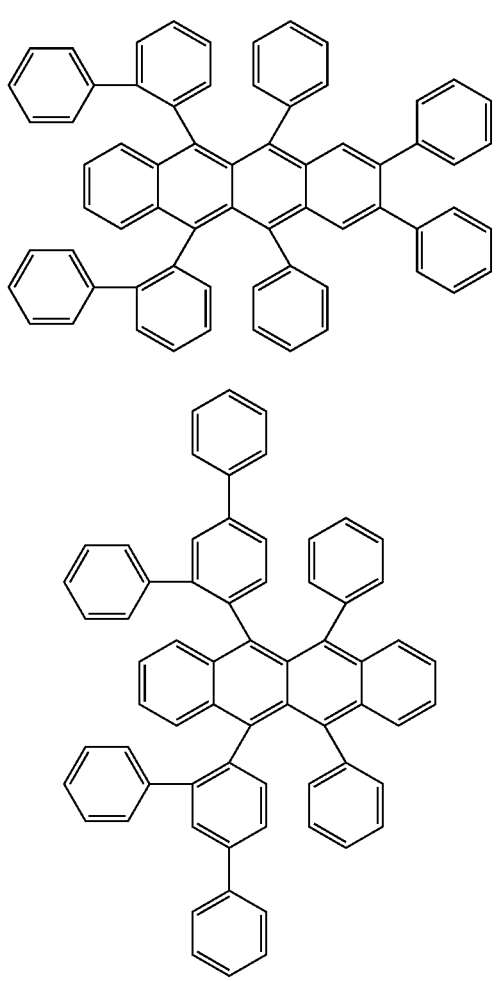
H-20
H-21
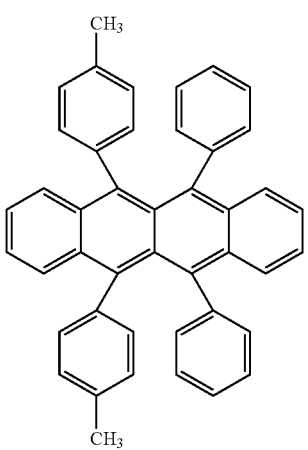

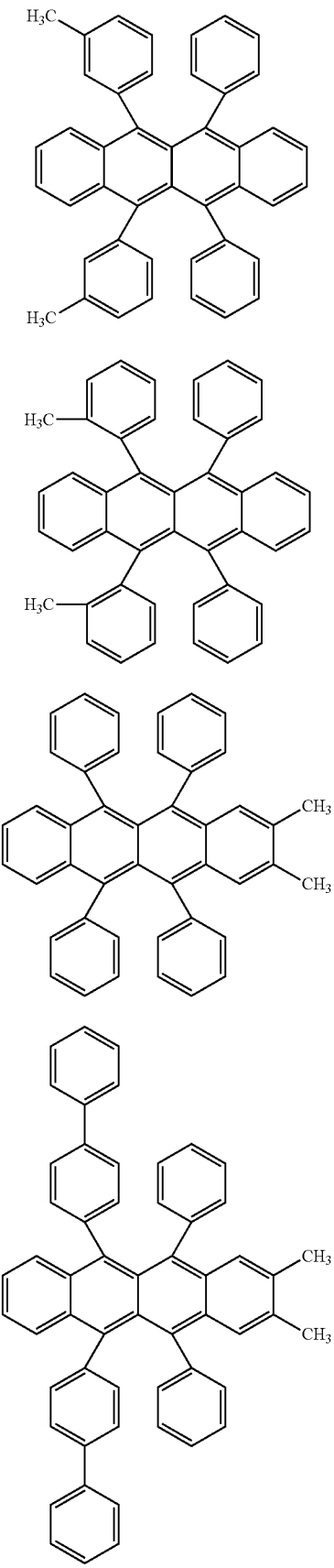

H-22

H-23

H-24

H-25

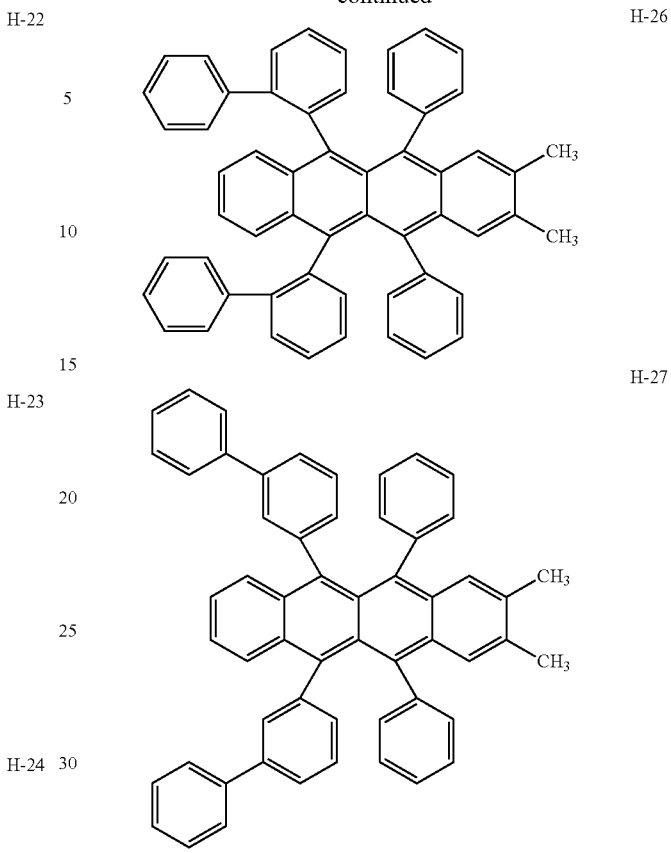

H-26

H-27

In addition, it is preferable that the HOMO of the host material used in the light emitting layer 5 is 5.0 eV or more to 5.8 eV or less, and that the LUMO of the component material of the positive hole injecting layer 4 is 2.5 eV or more to 3.6 eV or less.

The amount (doping amount) of the light emitting material contained in the light emitting layer 5 including such a light emitting material and host material is preferably 0.25 wt % or more to 1.0 wt % or less, more preferably 0.25 wt % or more to 0.75 wt % or less, and even more preferably 0.25 wt % or more to 0.5 wt % or less. This makes it possible to cause the light emitting element 1 to have a superior balance between its light emission efficiency and life span.

Moreover, the average thickness of the light emitting layer 5 is preferably 10 nm or more to 50 nm or less, and more preferably 25 nm or more to 50 nm or less. This makes it possible to realize a long life for the light emitting element 1 while suppressing the driving voltage of the light emitting element 1.

Electron Transporting Layer

The electron transporting layer 6 has a function for transporting electrons to the light emitting layer 5, the electrons being injected from the cathode 8 via the electron injecting layer 7.

Examples of the component material of the electron transporting layer 6 (electron transporting material) include phenanthroline derivatives such as 2,9-dimethyl-4,7-diphenyl-1,10-phenanthroline (BCP), quinoline derivatives such as an organic metal complex having 8-quinolinol such as tris(8-quinolinolato)aluminum ($Alq_3$) or a derivative thereof as a ligand, azaindolizine derivatives, oxadiazole derivatives, perylene derivatives, pyridine derivatives, pyrimidine derivatives, quinoxaline derivatives, diphenylquinone derivatives, nitro-substituted fluorene derivatives, and acene-based materials such as anthracene-based materials. These materials can be used alone or in a combination of two or more.

It is preferable to use compounds having an anthracene skeleton of these materials as the electron transporting material used in the electron transporting layer 6, and in particular, it is more preferable to use azaindolizine-based compounds having an azaindolizine skeleton and an anthracene skeleton in their molecules (also referred to as merely "azaindolizine-based compounds" hereinafter). This makes it possible to efficiently transport and inject electrons to/into the light emitting layer 5. As a result, it is possible to enhance the light emission efficiency of the light emitting element 1.

Moreover, in the case where two or more electron transporting materials are used in combination, the electron transporting layer 6 may be constituted by mixed materials in which two or more electron transporting materials are mixed or may be configured by laminating a plurality of layers that are constituted by different electron transporting materials. The electron transporting layer 6 according to this embodiment has a first electron transporting layer 6b and a second electron transporting layer 6a that is provided between the first electron transporting layer 6b and the light emitting layer 5.

It is preferable to use the azaindolizine-based compound having an azaindolizine skeleton and an anthracene skeleton in its molecule as the compound having an anthracene skeleton that is used as the component material of the first electron transporting layer 6b. Moreover, it is preferable to use the anthracene-based compound that has an anthracene skeleton in its molecule and is constituted by carbon atoms and hydrogen atoms as the compound having an anthracene skeleton that is used as the component material of the second electron transporting layer 6a. This makes it possible to efficiently transport and inject electrons to/into the light emitting layer 5, and to suppress the deterioration of the electron transporting layer 6. As a result, it is possible to enhance the light emission efficiency of the light emitting element 1, and to realize a long life for the light emitting element 1.

Here, it is possible to realize a long life by reducing the thickness of the first electron transporting layer 6b while ensuring the thickness of the electron transporting layer 6 that is necessary for optical light extraction by the second electron transporting layer 6a.

It is preferable that the azaindolizine-based compound used in the electron transporting layer 6 has one or two azaindolizine skeletons and one or two anthracene skeletons in its molecule. This makes it possible to cause the electron transporting layer 6 to have a superior electron transporting property and electron injecting property.

Specifically, it is preferable to use compounds represented by the following formulas ETL1-1 to 24, compounds represented by the following formulas ETL1-25 to 36, and compounds represented by the following formulas ETL1-37 to 56 as the azaindolizine-based compound used in the electron transporting layer 6.

[Chemical Formula 15]

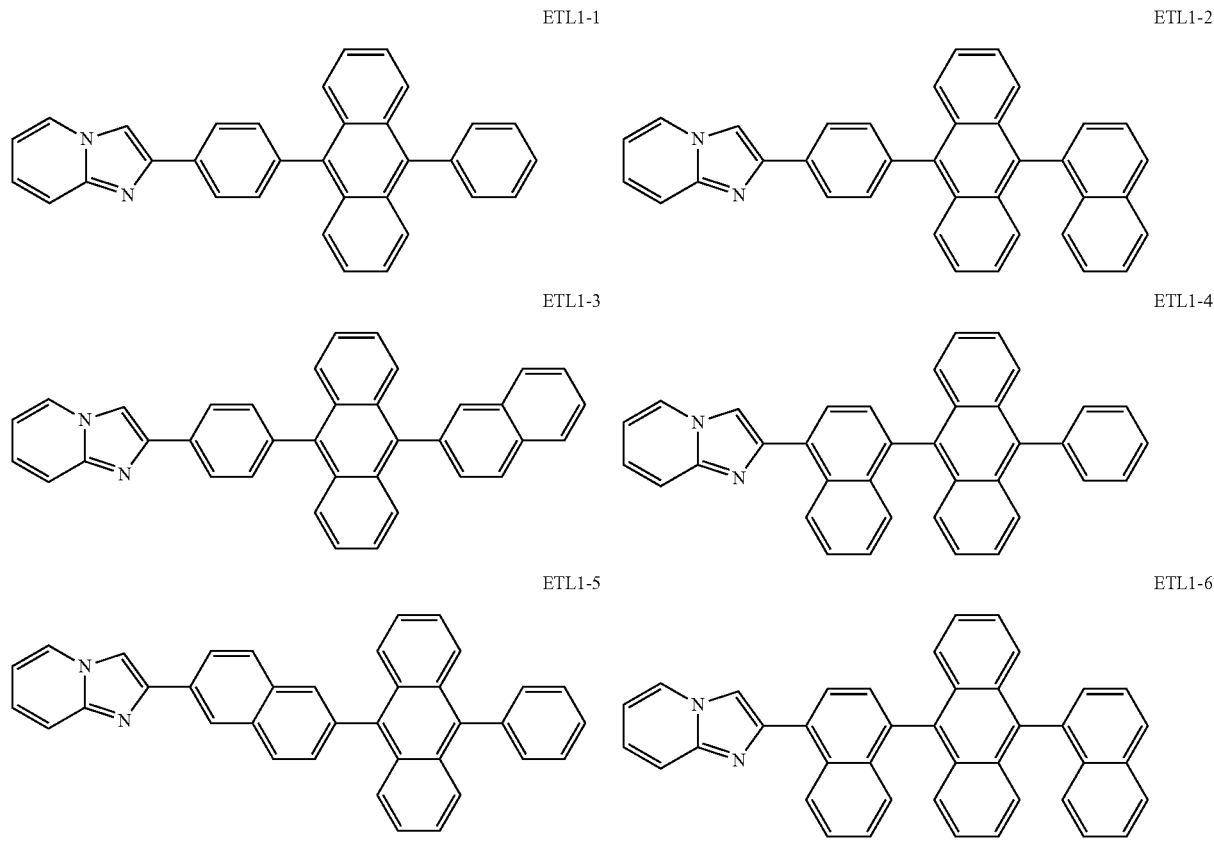

-continued
ETL1-7
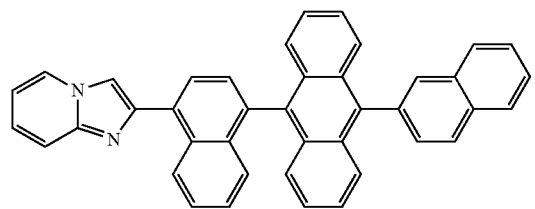
ETL1-8
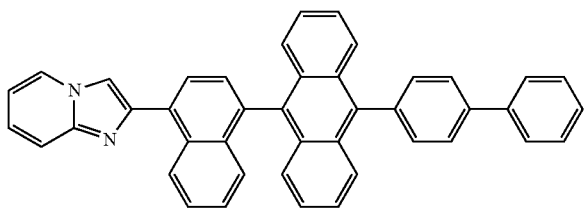
ETL1-9
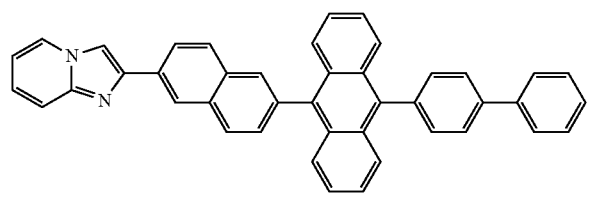
ETL1-10
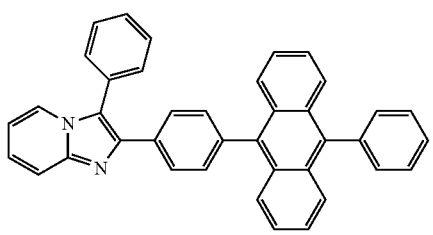
ETL1-11
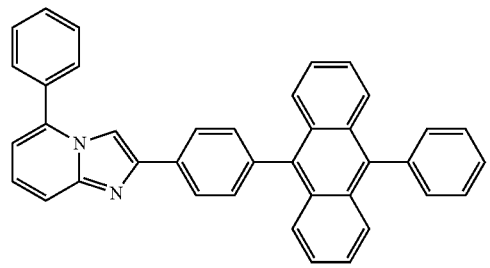
ETL1-12
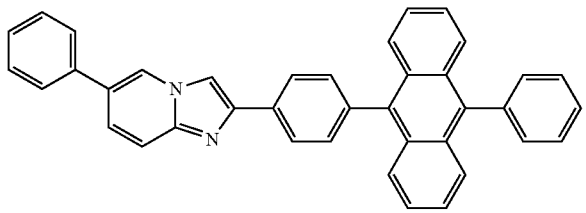
ETL1-13
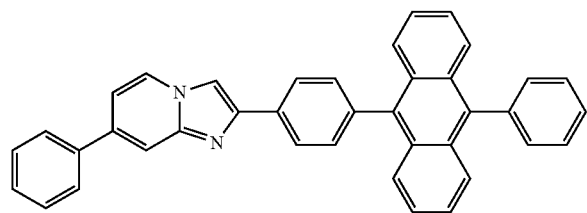
ETL1-14
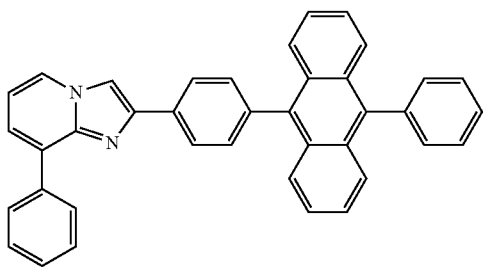
ETL1-15
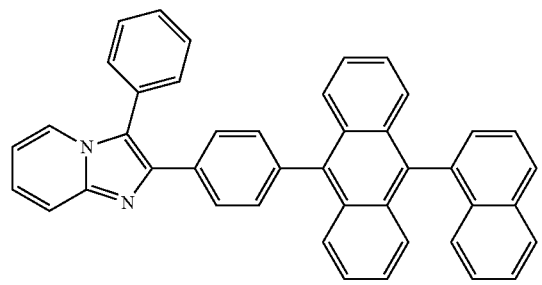
ETL1-16
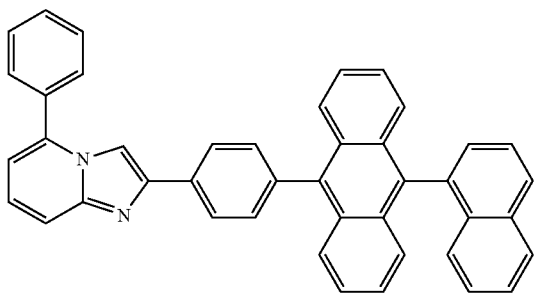
ETL1-17
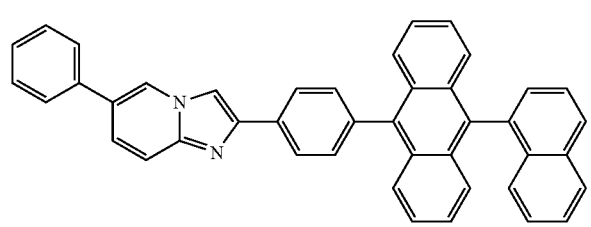
ETL1-18
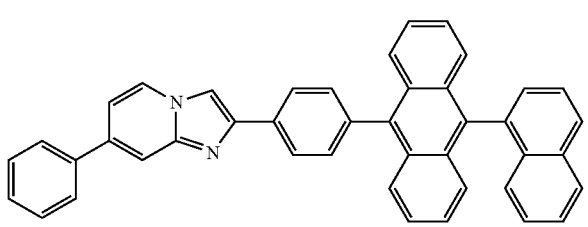

-continued
ETL1-19
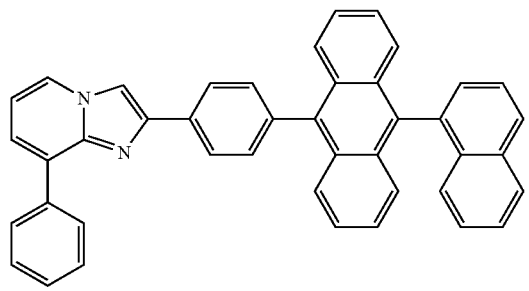
ETL1-20
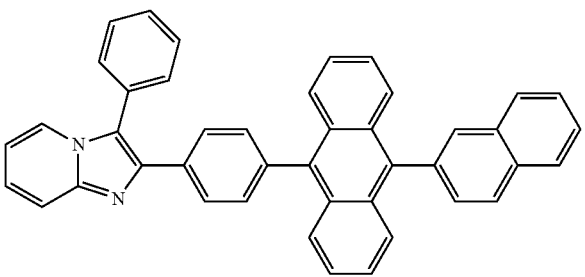
ETL1-21
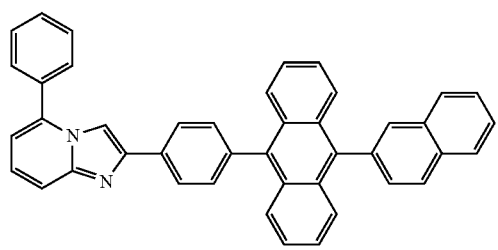
ETL1-22
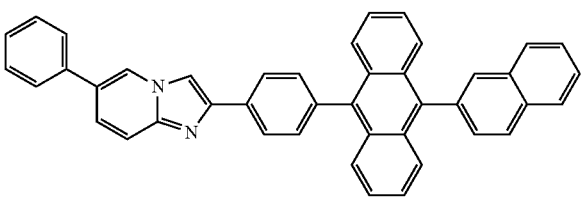
ETL1-23
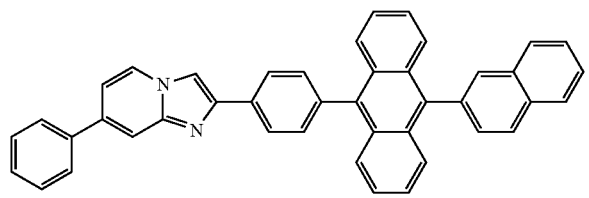
ETL1-24
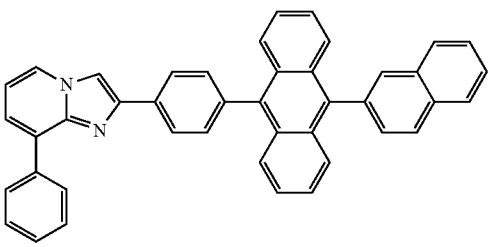
[Chemical Formula 16]
ETL1-25
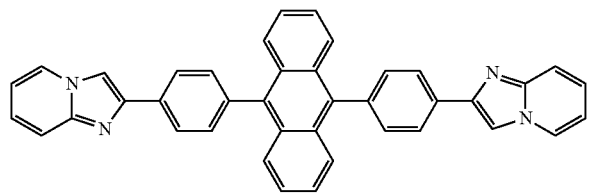
ETL1-26
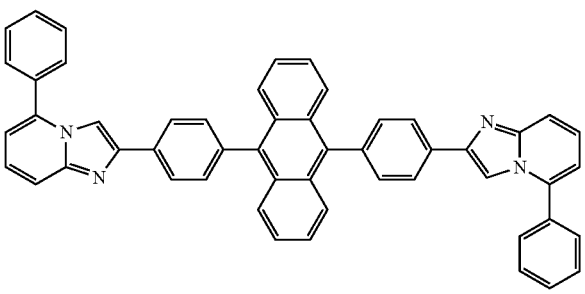
ETL1-27
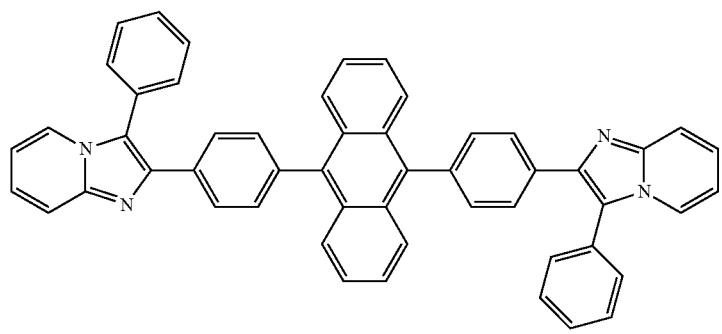

-continued
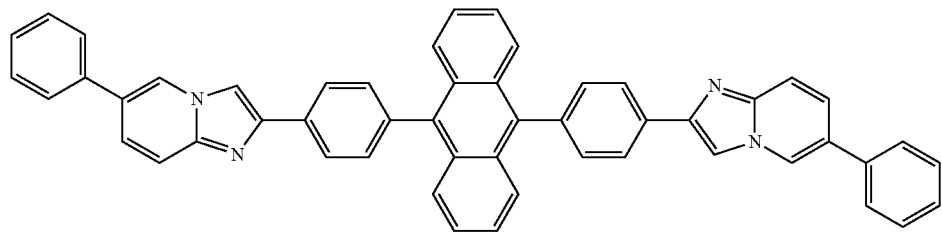
ETL1-28
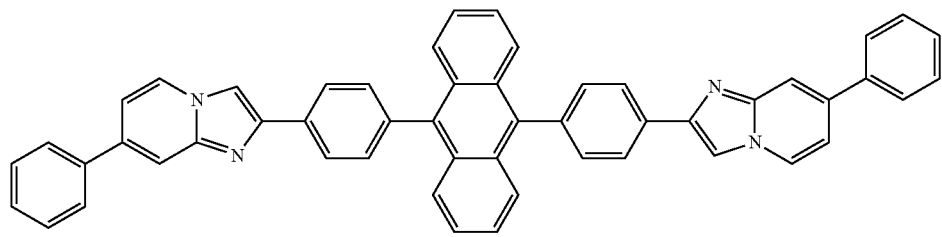
ETL1-29
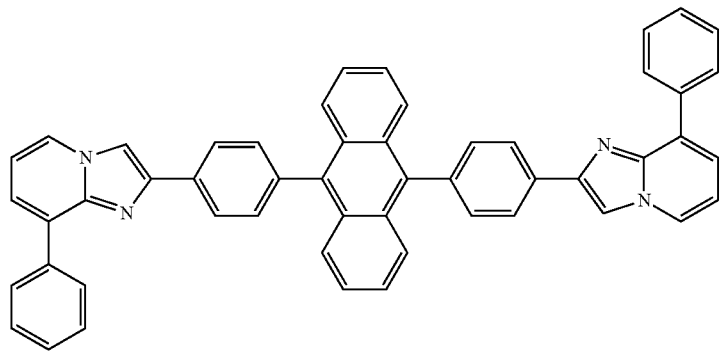
ETL1-30
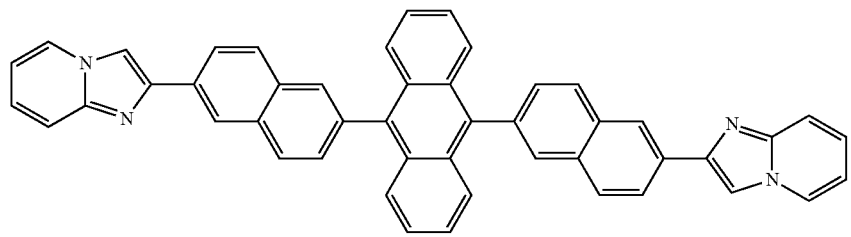
ETL1-31
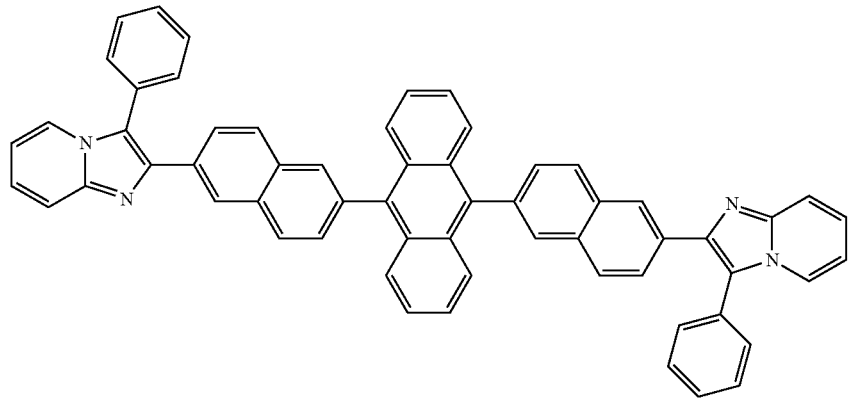
ETL1-32

-continued
ETL1-33
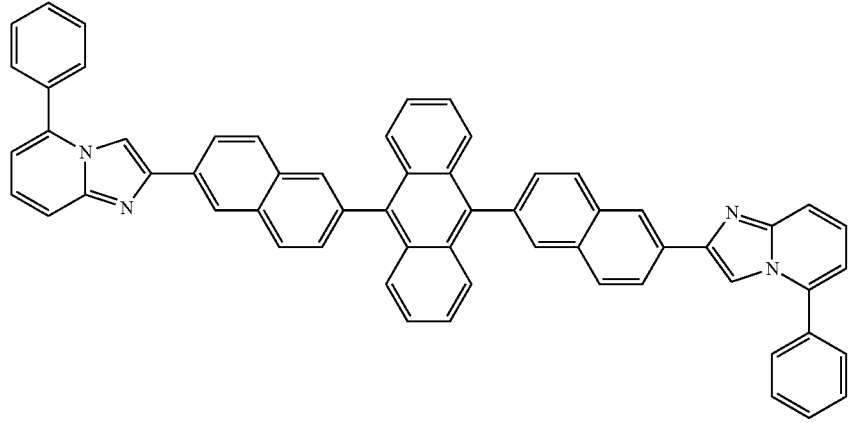
ETL1-34
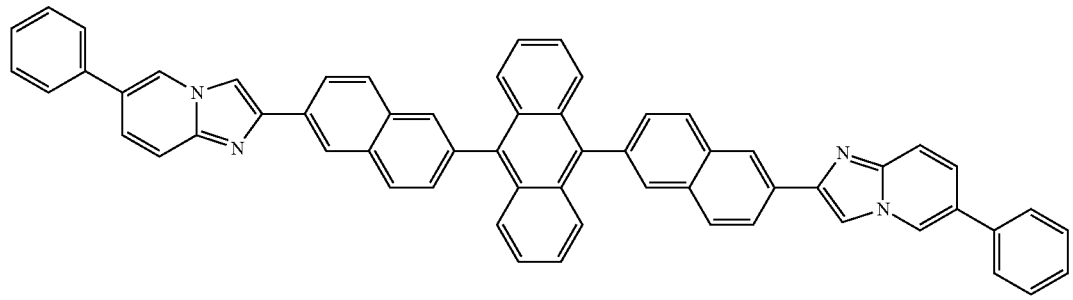
ETL1-35
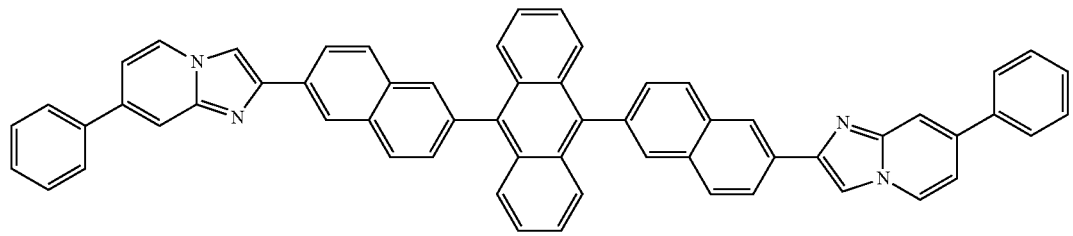
ETL1-36
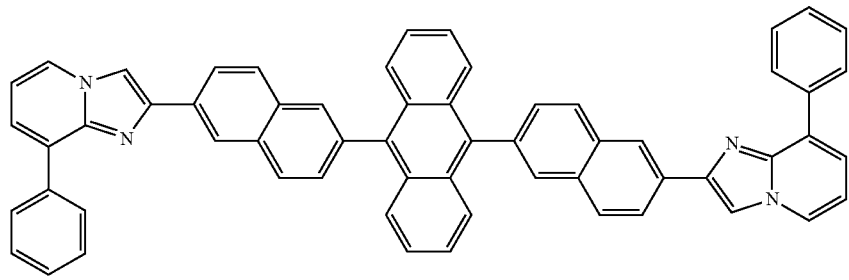
[Chemical Formula 17]
ETL1-37
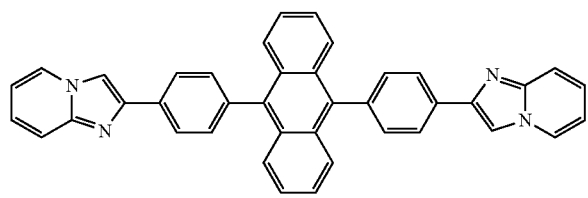
ETL1-38
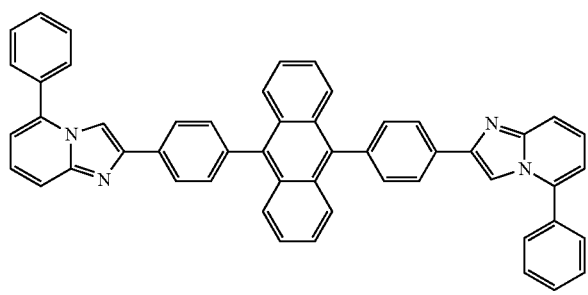

-continued
ETL1-39
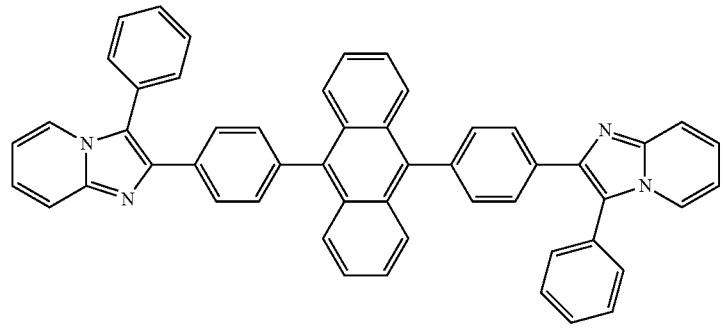
ETL1-40
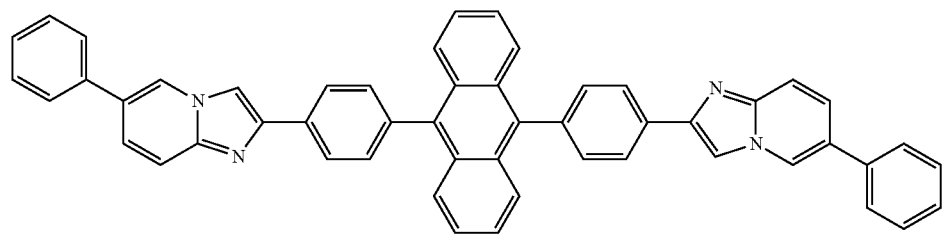
ETL1-41 ETL1-42
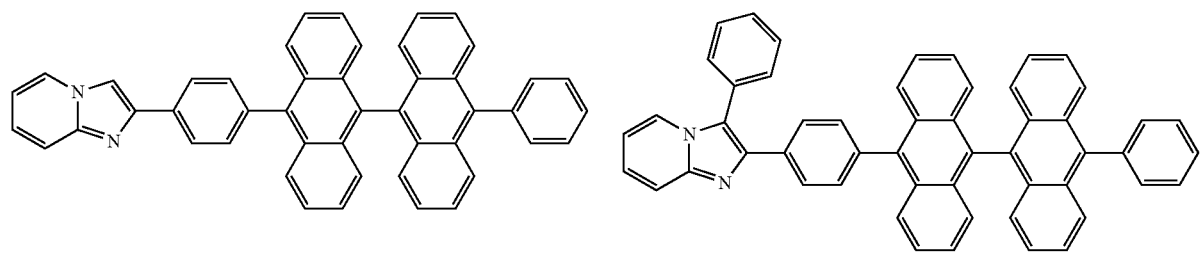
ETL1-43 ETL1-44
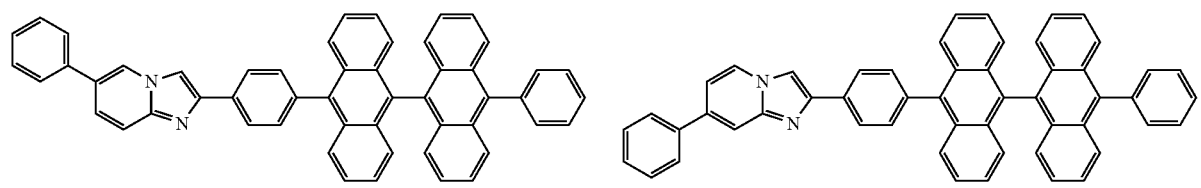
ETL1-45 ETL1-46
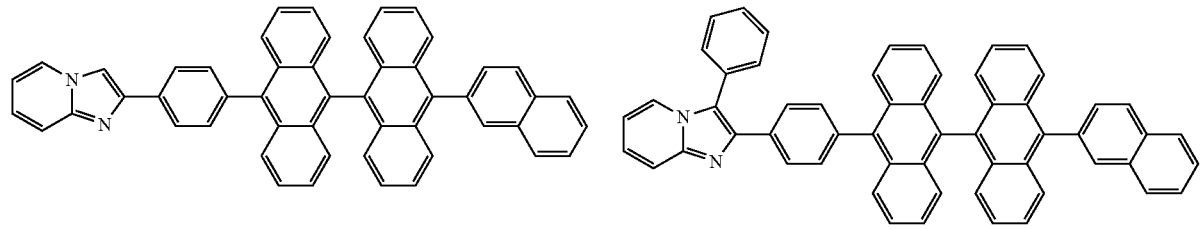
ETL1-47
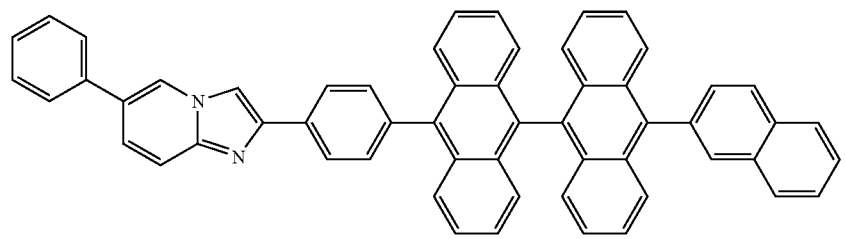

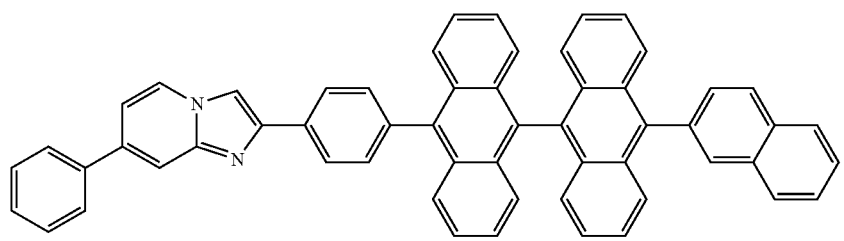
ETL1-48
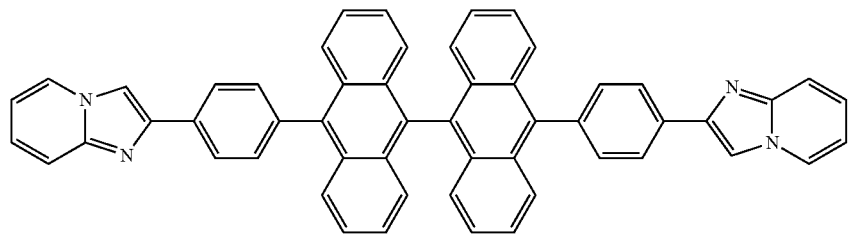
ETL1-49
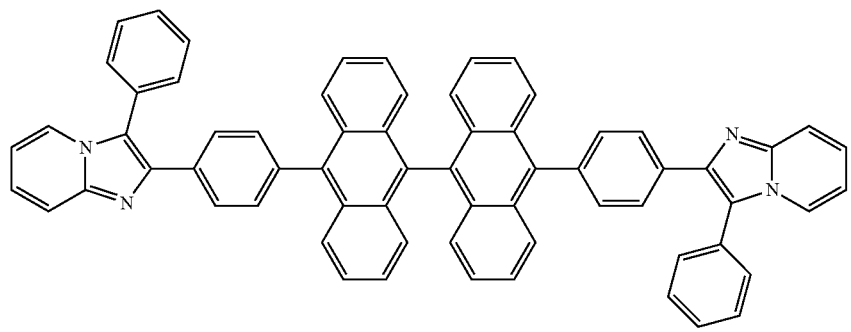
ETL1-50
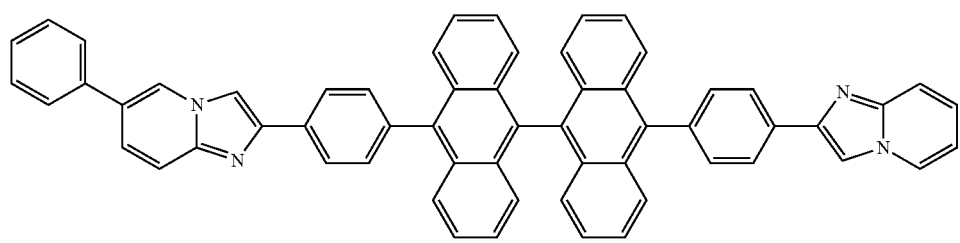
ETL1-51
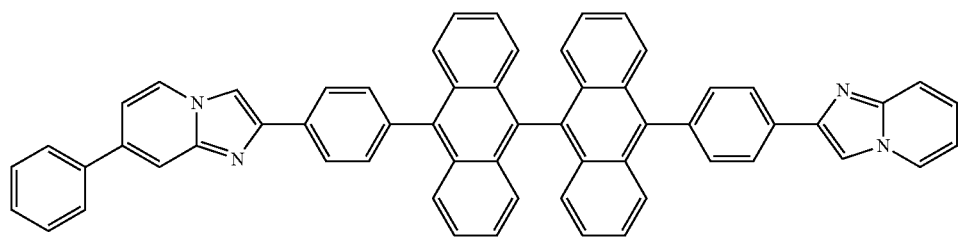
ETL1-52

-continued
ETL1-53
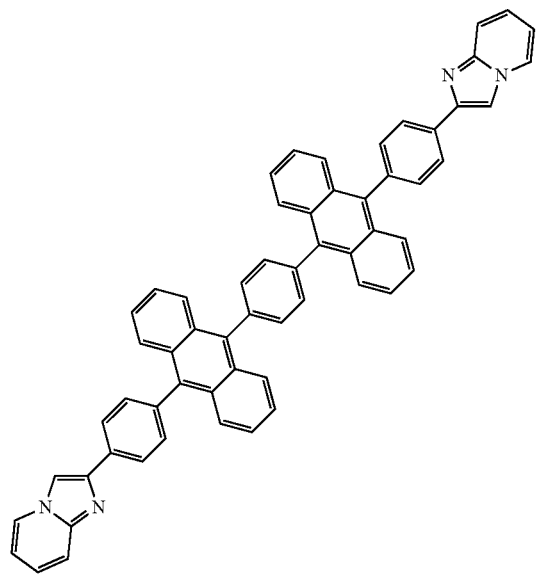
ETL1-54
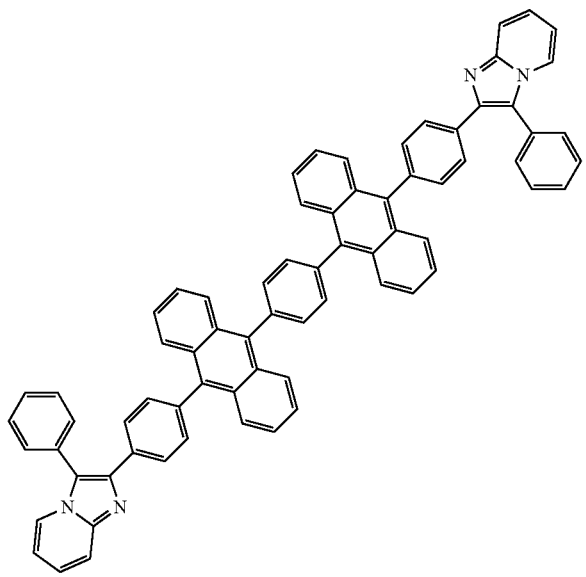
ETL1-55
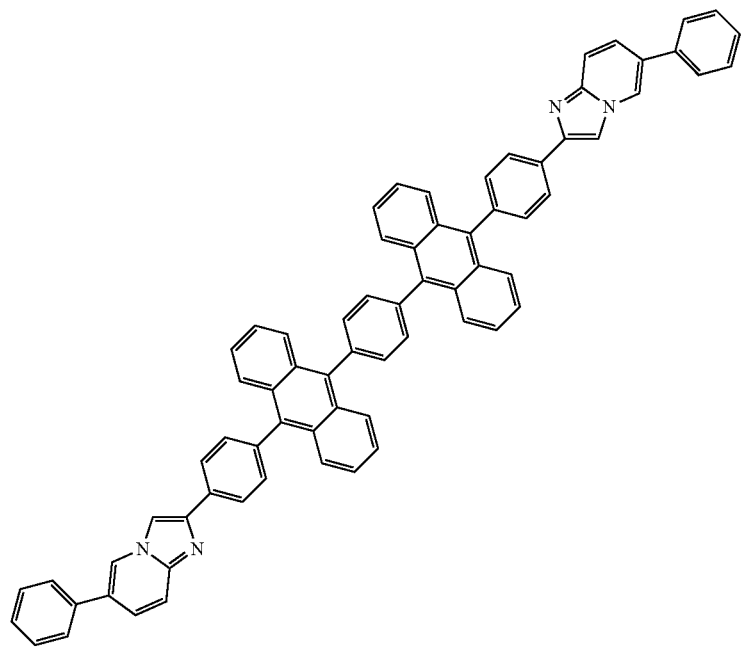

-continued

ETL1-56

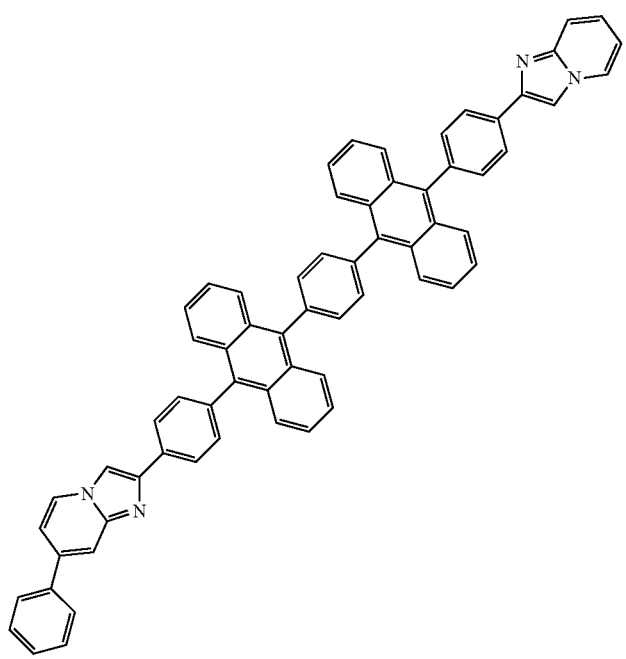

Such azaindolizine-based compounds have a superior electron transporting property and electron injecting property. This makes it possible to enhance the light emission efficiency of the light emitting element 1.

It is thought that the reason why such azaindolizine-based compounds have a superior electron transporting property and electron injecting property is as follows.

The entire molecule of the azaindolizine-based compound having an azaindolizine skeleton and an anthracene skeleton in its molecule is connected with a π conjugated system, and therefore, the electron cloud spreads over the entire molecule.

The azaindolizine skeleton portion of the azaindolizine-based compound has a function for receiving electrons and a function for sending out the received electrons to the anthracene skeleton portion. On the other hand, the anthracene skeleton portion of the azaindolizine-based compound has a function for receiving electrons from the azaindolizine skeleton portion and a function for transferring the received electrons to the neighboring layer on the anode 3 side of the electron transporting layer 6, that is, the light emitting layer 5.

More specifically, the azaindolizine skeleton portion of the azaindolizine-based compound has two nitrogen atoms. One nitrogen atom (on the side near the anthracene skeleton portion) has an $sp^2$ hybrid orbital, and the other nitrogen atom (on the side far from the anthracene skeleton portion) has an $sp^3$ hybrid orbital. The nitrogen atom having an $sp^2$ hybrid orbital constitutes a portion of the conjugated system of the azaindolizine-based compound molecule and serves as the portion for receiving electrons because the nitrogen atom has a higher electronegativity than a carbon atom and attracts electrons more strongly. On the other hand, although the nitrogen atom having an $sp^3$ hybrid orbital does not have a common conjugated system, it has an unshared electron pair, and therefore, the electrons serve as the portion for sending out electrons to the conjugated system of the azaindolizine-based compound molecule.

On the other hand, the anthracene skeleton portion of the azaindolizine-based compound is electrically neutral, and thus can easily receive electrons from the azaindolizine skeleton portion. Moreover, the orbital of the anthracene skeleton portion of the azaindolizine-based compound largely overlaps the orbital of the component material of the light emitting layer 5, in particular, the orbital of the host material (acene-based material), and therefore, the anthracene skeleton portion can easily transfer electrons to the host material of the light emitting layer 5.

Moreover, the azaindolizine-based compound has a superior electron transporting property and electron injecting property as previously described, and as a result, it is possible to reduce the driving voltage of the light emitting element 1.

In addition, the azaindolizine skeleton portion is stable even when the nitrogen atom having an $sp^2$ hybrid orbital is reduced. Also, the azaindolizine skeleton portion is stable even when the nitrogen atom having an spa hybrid orbital is oxidized. Therefore, the azaindolizine-based compound is highly stable against electrons and positive holes. As a result, it is possible to realize a long life for the light emitting element 1.

Moreover, the anthracene-based compound used in the electron transporting layer 6 (in particular, the second electron transporting layer 6a in the case where the electron transporting layer 6 has the second electron transporting layer 6a) need only be a compound represented by the following formula ETL2. It is preferable that the anthracene-based compound is a compound represented by the following formulas ETL2-A, ETL2-B, ETL2-C or ETL2-D, and more specifically, it is preferable that the anthracene-based compounds are compounds represented by the following formulas ETL2-1 to 56.

[Chemical Formula 18]

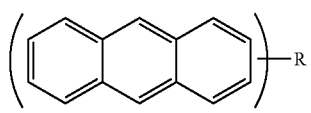

(General formula)
R:
Hydrogen atom
Alkyl group
Aryl that may have a substituent group
Arylamine

ETL2-A

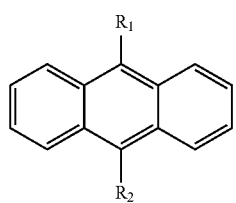

R₁ and R₂ may be the same or may be different.
Hydrogen atom
Alkyl group
Aryl that may have a substituent group
Arylamine

ETL2-B

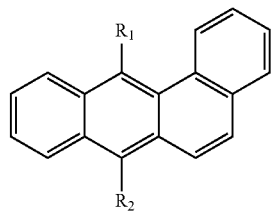

R₁ and R₂ may be the same or may be different.
Hydrogen atom
Alkyl group
Aryl that may have a substituent group
Arylamine

ETL2-C

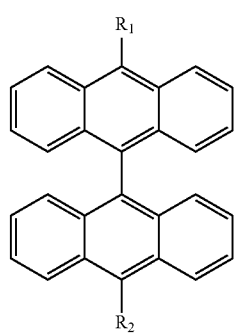

R₁ and R₂ may be the same or may be different.
Hydrogen atom
Alkyl group
Aryl that may have a substituent group
Arylamine

ETL2-D

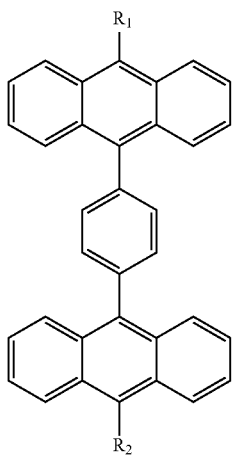

R₁ and R₂ may be the same or may be different.
Hydrogen atom
Alkyl group
Aryl that may have a substituent group
Arylamine

[Chemical Formula 19]

ETL2-1

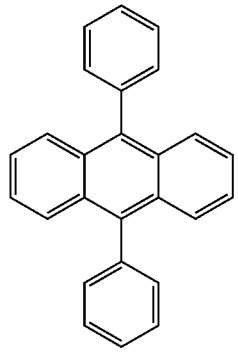

ETL2-2

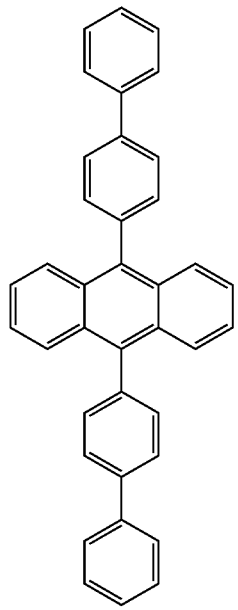

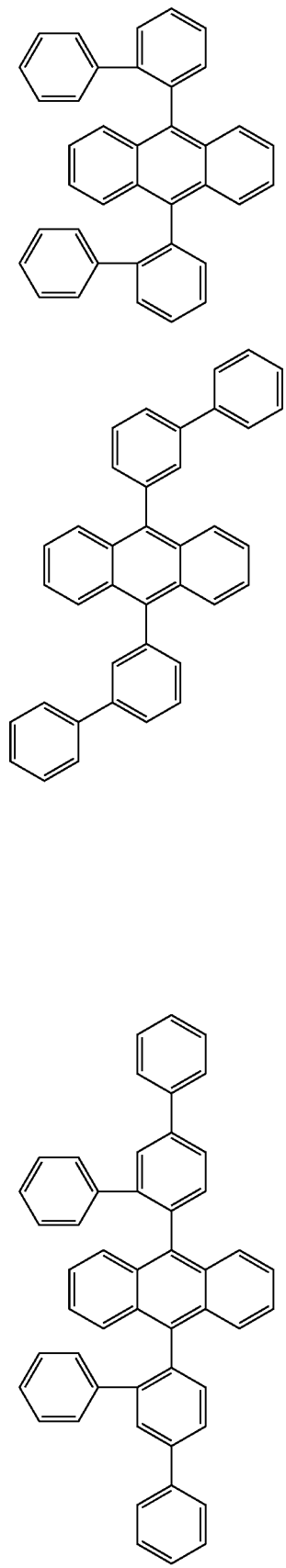
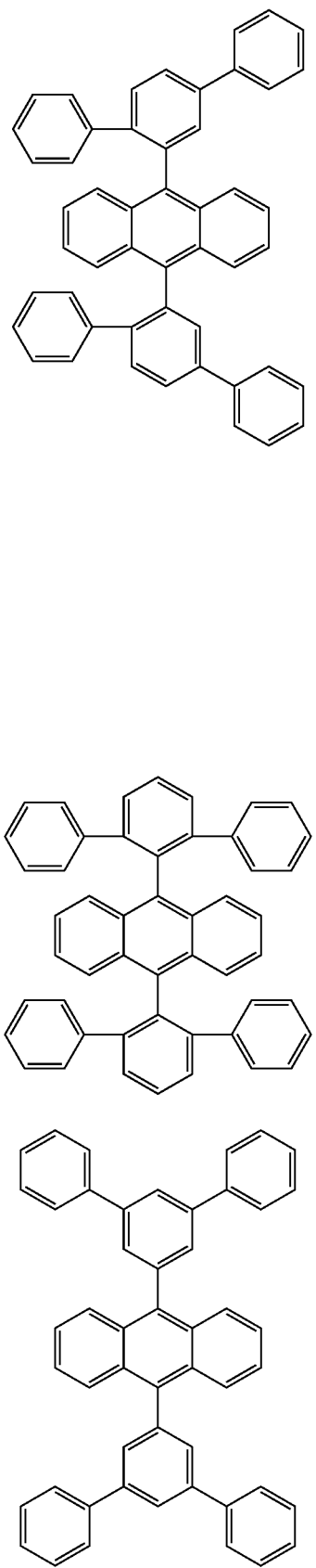

ETL2-9
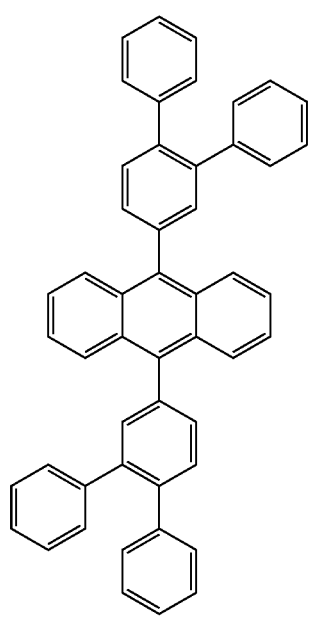
ETL2-10
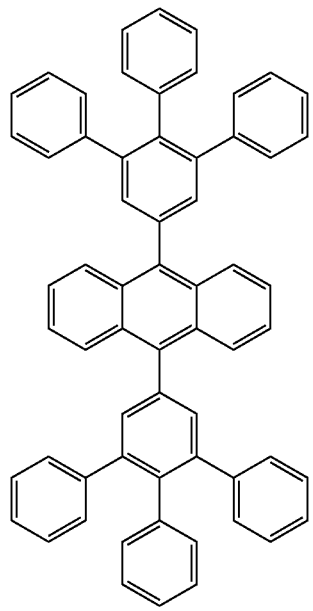
ETL2-11
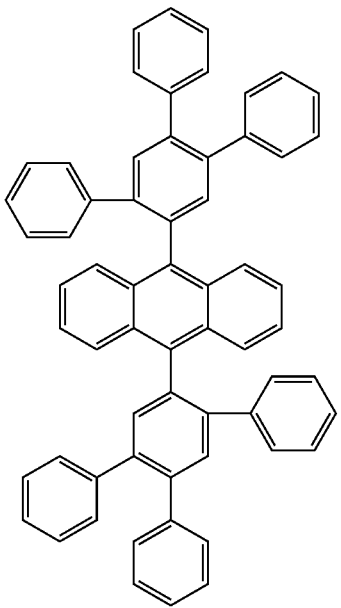
ETL2-12
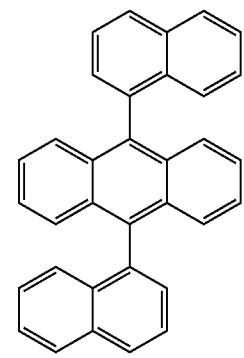
ETL2-13
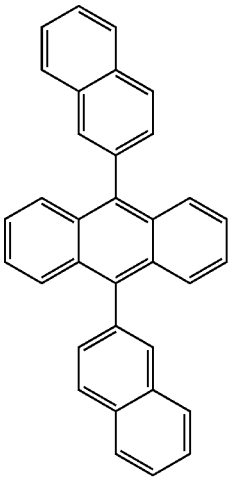

ETL2-14
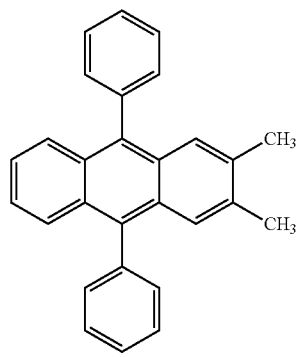
ETL2-15
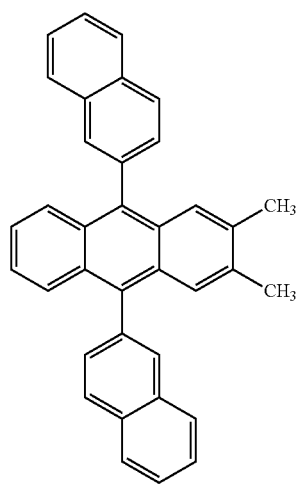
ETL2-16
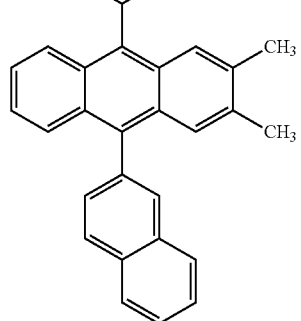
[Chemical Formula 20]
ETL2-17
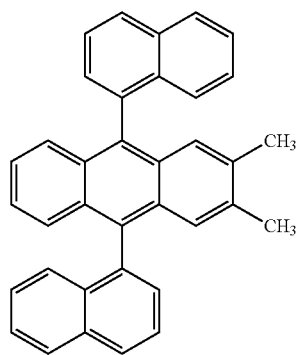
ETL2-18
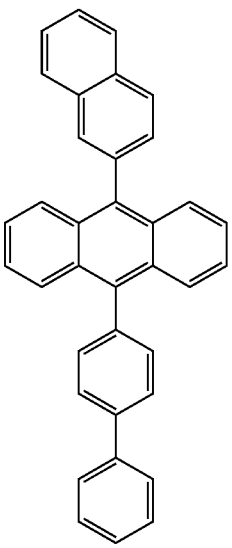
ETL2-19
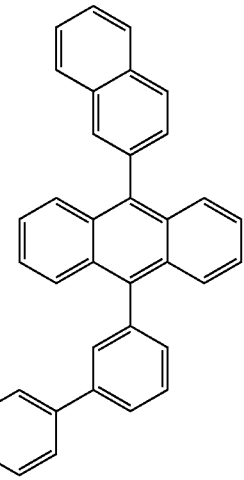
ETL2-20
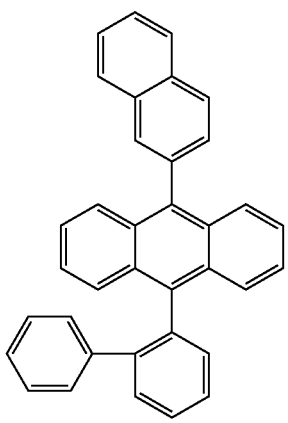

-continued
ETL2-21
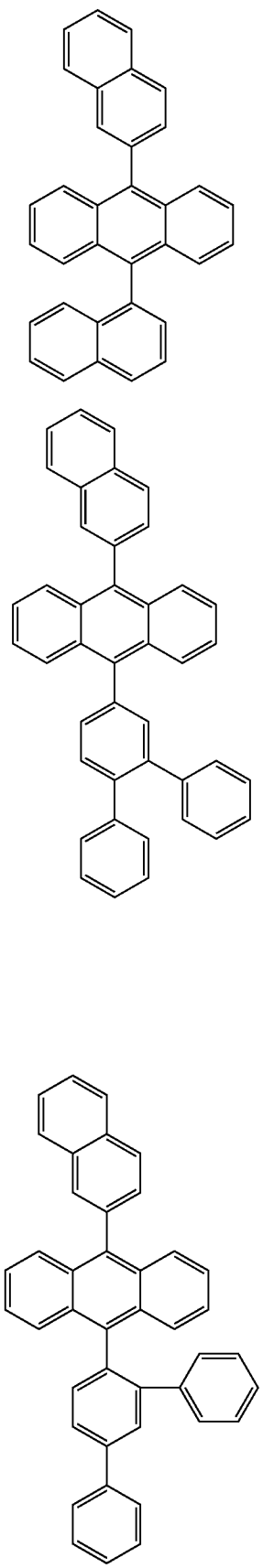
ETL2-22
ETL2-23
ETL2-24
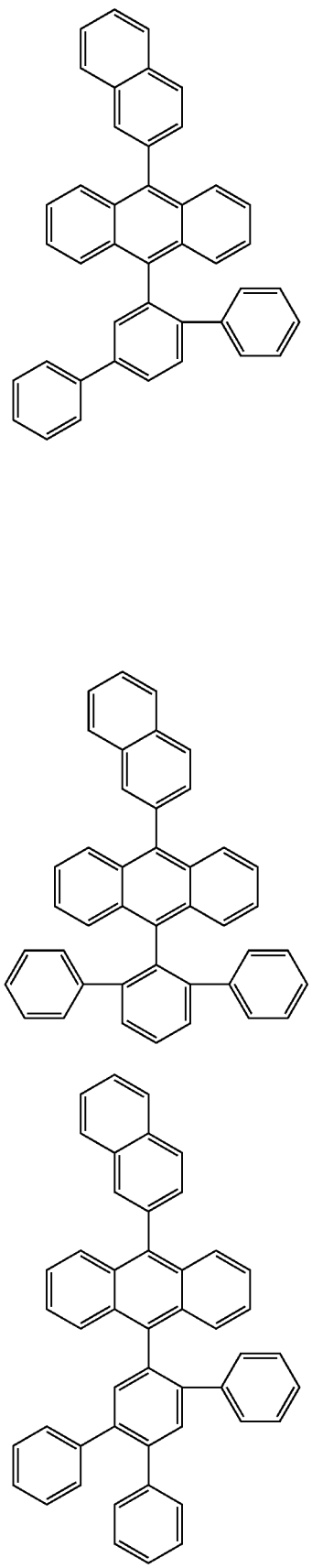
ETL2-25
ETL2-26

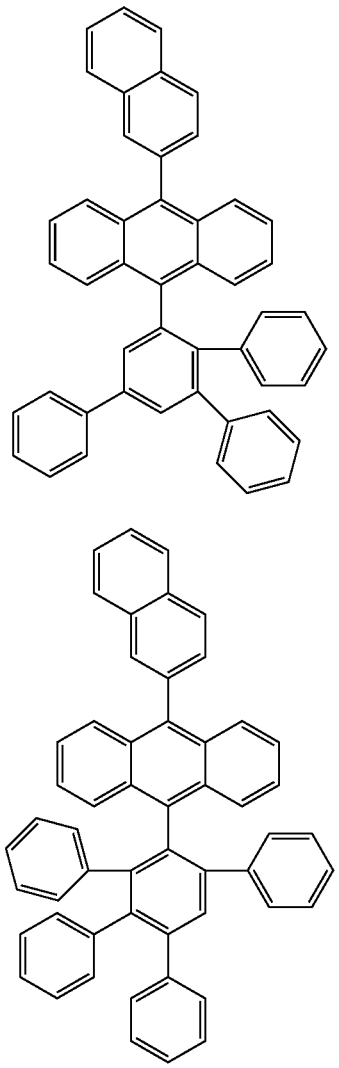
ETL2-27
ETL2-28
ETL2-29
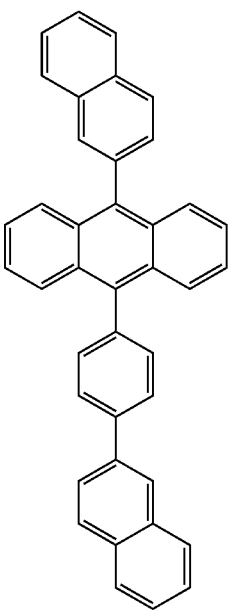
ETL2-30
ETL2-31

-continued
ETL2-32
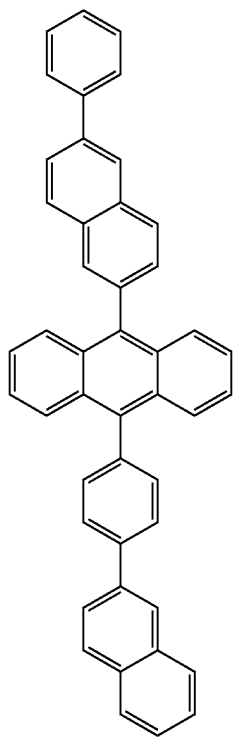
ETL2-34
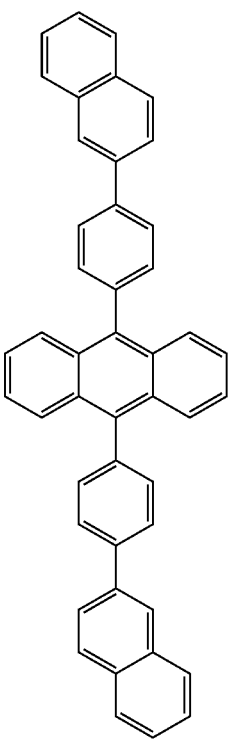
ETL2-33
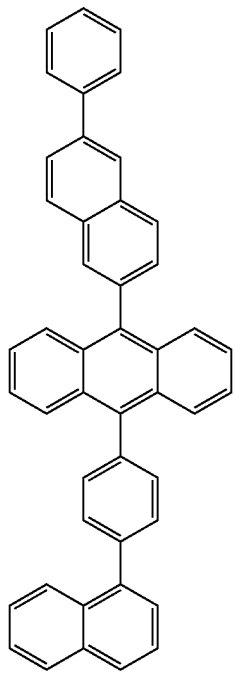
ETL2-35
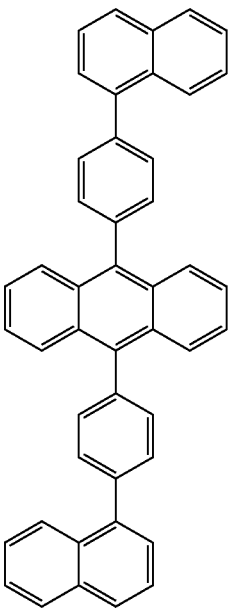

-continued
ETL2-36
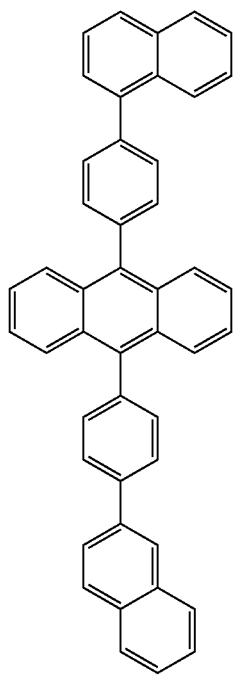
ETL2-38
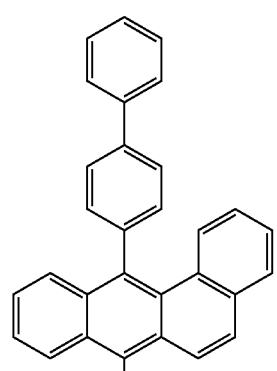
ETL2-39
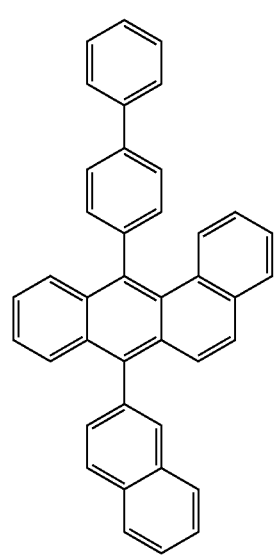
ETL2-40
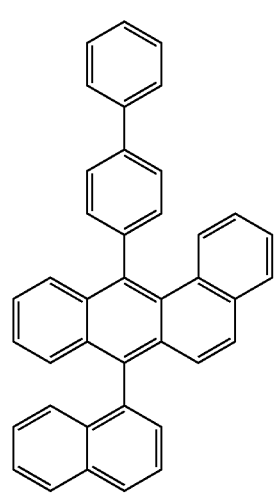
[Chemical Formula 21]
ETL2-37
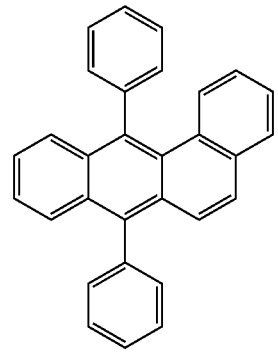

ETL2-41
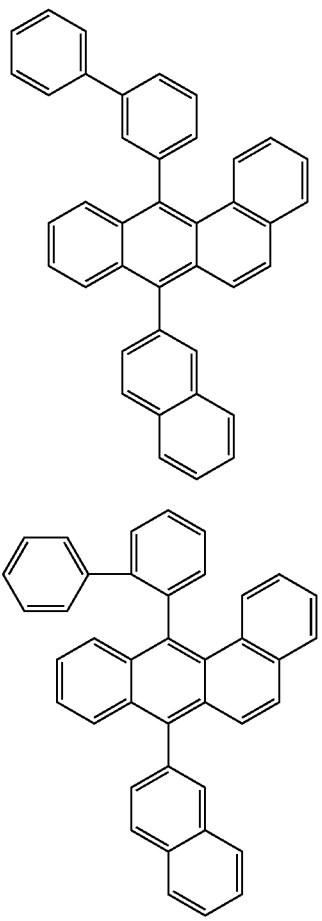
ETL2-42
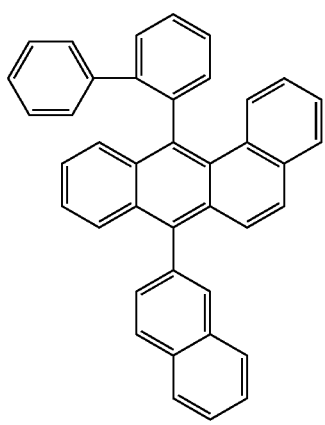
ETL2-43
ETL2-44
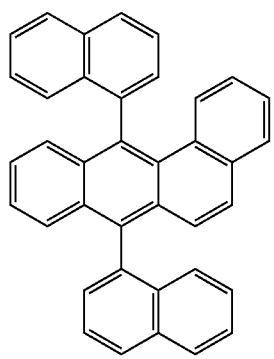
ETL2-45
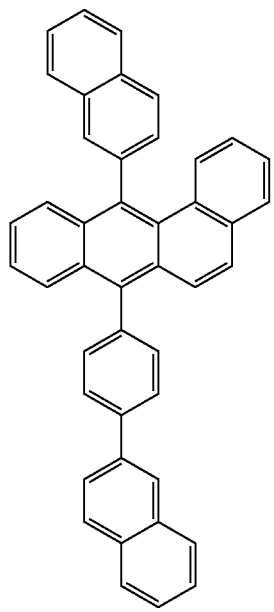
ETL2-46
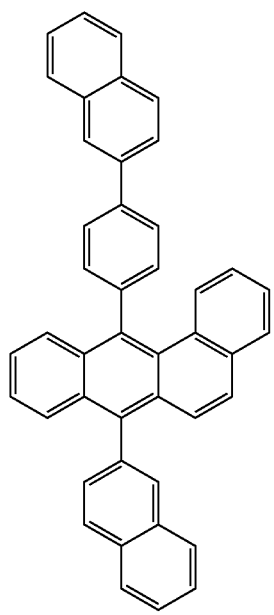

ETL2-47
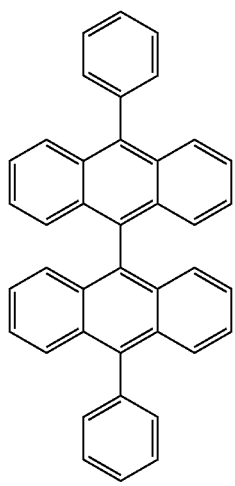
ETL2-48
ETL2-49
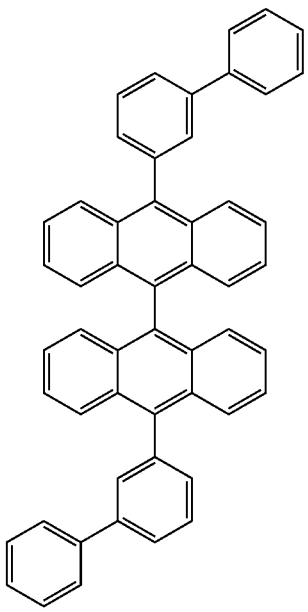
ETL2-50
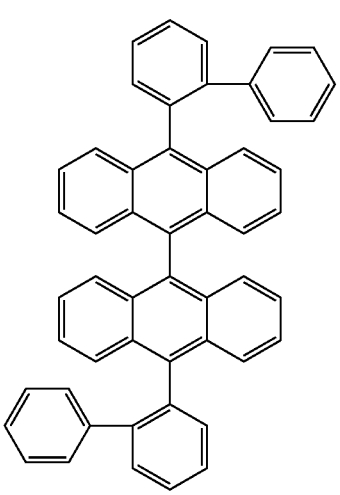

ETL2-51
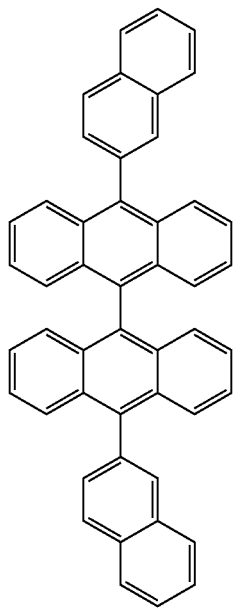
ETL2-52
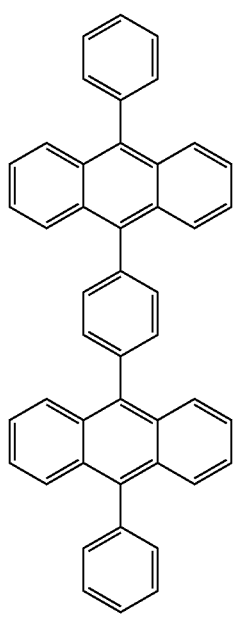
ETL2-53
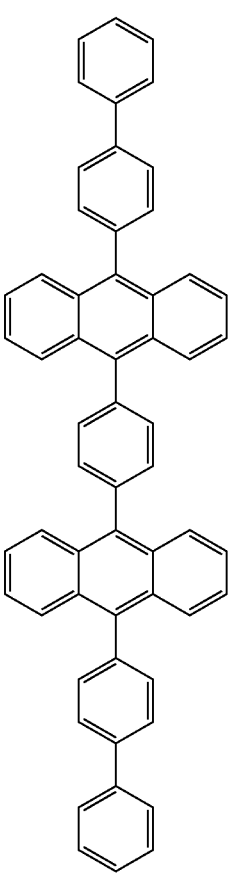
ETL2-54
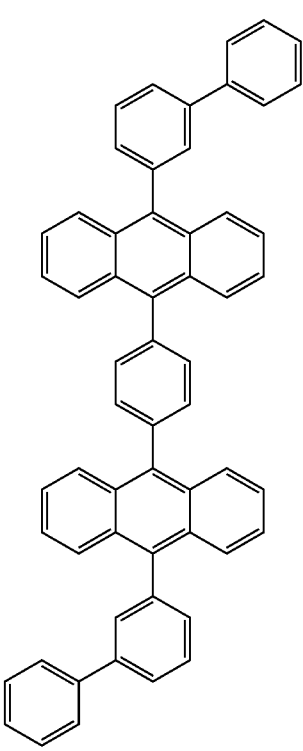

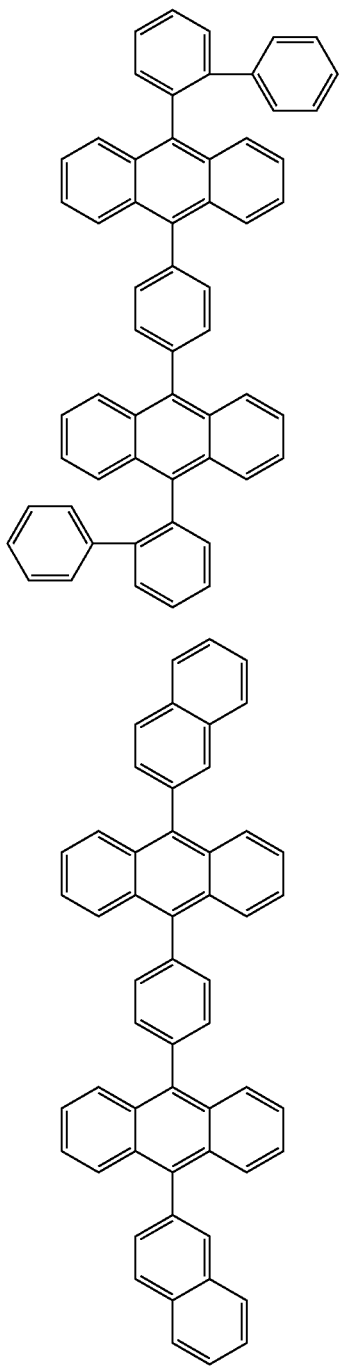

ETL2-55

ETL2-56

Moreover, it is preferable that the difference between the HOMO of the component material of the electron transporting layer 6 (more specifically, the second electron transporting layer 6a) and the HOMO of the host material used in the light emitting layer 5 is 0.2 eV or more. This makes it possible to reduce the passage of positive holes from the light emitting layer 5 to the electron transporting layer 6, and to enhance the light emission efficiency.

In addition, it is preferable that the HOMO of the component material of the second electron transporting layer 6a is 5.5 eV or more to 6.0 eV or less, and that the LUMO of the component material of the second electron transporting layer 6a is 2.5 eV or more to 3.0 eV or less.

Moreover, it is preferable that the HOMO of the component material of the first electron transporting layer 6b is 5.8 eV or more to 6.5 eV or less, and that the LUMO of the component material of the first electron transporting layer 6b is 2.8 eV or more to 3.5 eV or less.

Moreover, it is preferable that the second electron transporting layer 6a is thicker than the first electron transporting layer 6b. This makes it possible to efficiently transport and inject electrons to/into the light emitting layer 5, and to suppress the deterioration of the electron transporting layer 6, while suppressing the driving voltage of the light emitting element 1.

In addition, the specific thickness of the second electron transporting layer 6a is preferably 10 nm or more to 75 nm or less, and more preferably 50 nm or more to 75 nm or less. This makes it possible to efficiently transport and inject electrons to/into the light emitting layer 5, and to suppress the deterioration of the electron transporting layer 6, while suppressing the driving voltage of the light emitting element 1.

Moreover, the thickness of the entire electron transporting layer 6 is preferably 55 nm or more to 95 nm or less, and more preferably 55 nm or more to 80 nm or less. This makes it possible to efficiently transport and inject electrons to/into the light emitting layer 5 while suppressing the driving voltage of the light emitting element 1.

It should be noted that the second electron transporting layer 6a may be omitted.

Electron Injecting Layer

The electron injecting layer 7 has a function for enhancing the efficiency of electron injection from the cathode 8.

Examples of the component material of this electron injecting layer 7 (electron injecting material) include various inorganic insulating materials and various inorganic semiconductor materials.

Examples of such inorganic insulating materials include alkali metal chalcogenides (oxides, sulfides, selenides, tellurides), alkaline earth metal chalcogenides, alkali metal halides, and alkaline earth metal halides. These compounds can be used alone or in a combination of two or more. By forming the electron injecting layer 7 using these materials as a main material, it is possible to further enhance the electron injecting property. In particular, alkali metal compounds (e.g., alkali metal chalcogenides and alkali metal halides) have a very small work function, and therefore, it is possible to provide the light emitting element 1 with a high luminance by forming the electron injecting layer 7 using these compounds.

Examples of the alkali metal chalcogenides include $Li_2O$, $Li_2O_2$, $Na_2S$, $Na_2Se$, and $Na_2O$.

Examples of the alkaline earth metal chalcogenides include CaO, BaO, SrO, BeO, BaS, MgO, and CaSe.

Examples of the alkali metal halides include CsF, LiF, NaF, KF, LiCl, KCl, and NaCl.

Examples of the alkaline earth metal halides include $CaF_2$, $BaF_2$, $SrF_2$, $MgF_2$, and $BeF_2$.

Moreover, examples of the inorganic semiconductor materials include oxides, nitrides and oxynitrides that include at least one of Li, Na, Ba, Ca, Sr, Yb, Al, Ga, In, Cd, Mg, Si, Ta, Sb, and Zn. These compounds can be used alone or in a combination of two or more.

The average thickness of the electron injecting layer 7 is preferably about 0.1 to 1000 nm, more preferably about 0.2 to 100 nm, and even more preferably about 0.2 to 50 nm, but is not particularly limited thereto.

It should be noted that this electron injecting layer 7 may be omitted depending on the component material, the thickness, and the like of the cathode 8 and the electron transporting layer 6.

Sealing Member

The sealing member 9 is provided so as to cover the anode 3, the laminated body 14, and the cathode 8, and has a function for airtightly sealing them to shield them from oxygen and moisture. It is possible to obtain the effect of, for example, enhancing the reliability of the light emitting element 1 and preventing the alteration and deterioration thereof (enhancing the durability) by providing the sealing member 9.

Examples of the component material of the sealing member 9 include Al, Au, Cr, Nb, Ta, Ti, or an alloy thereof, silicon oxide, and various resin materials. It should be noted that in the case where a conductive material is used as the component material of the sealing member 9, an insulating film is preferably provided as necessary between the sealing member 9 and the anode 3, laminated body 14 and cathode 8 in order to prevent a short circuit.

Moreover, the sealing member 9 may be formed in a flat plate shape and disposed to face the substrate 2, and a gap between them may be sealed by a sealing material such as a thermosetting resin.

With the light emitting element 1 configured as described above, it is possible to emit light in a near-infrared region and realize a high efficiency and a long life by using a pyrromethene-based boron complex as the light emitting material of the light emitting layer 5, and using a tetracene-based material as the host material of the light emitting layer 5.

The light emitting element 1 can be manufactured as follows, for example.

[1] First, the substrate 2 is prepared, and the anode 3 is formed on this substrate 2.

The anode 3 can be formed using a chemical vapor deposition (CVD) method such as plasma CVD or thermal CVD, a dry plating method such as vacuum deposition, a wet plating method such as electrolytic plating, a thermal spraying method, a sol-gel method, an MOD method, or the bonding of metal foils, for example.

[2] The positive hole injecting layer 4 is formed on the anode 3.

It is preferable to form the positive hole injecting layer 4 by a vapor-phase process using a CVD method or a dry plating method such as vacuum deposition or sputtering, for example.

It should be noted that the positive hole injecting layer 4 can be also formed by, for example, supplying, on the anode 3, a material for forming a positive hole injecting layer obtained by dissolving a positive hole injecting material in a solvent or dispersing the positive hole injecting material in a dispersion medium, and then drying it (removing the solvent or the dispersion medium).

It is possible to also use various application methods such as a spin coat method, a roll coat method, and an inkjet printing method as a method for supplying the material for forming a positive hole injecting layer. It is possible to relatively easily form the positive hole injecting layer 4 by using these application methods.

Examples of the solvent or the dispersion medium used for the preparation of the material for forming a positive hole injecting layer include various inorganic solvents and various organic solvents, or mixed solvents thereof.

It should be noted that the material for forming a positive hole injecting layer can be dried by allowing it to stand in an atmospheric pressure or reduced pressure environment, heating it, spraying an inert gas thereon, or the like.

Moreover, oxygen plasma treatment may be performed on the upper surface of the anode 3 prior to this step. This makes it possible to cause the upper surface of the anode 3 to be lyophilic, to remove (wash away) organic substances attached to the upper surface of the anode 3, to adjust the work function of the vicinity of the upper surface of the anode 3, and so on.

Here, it is preferable that the oxygen plasma treatment is performed under conditions in which the plasma power is about 100 to 800 W, the flow rate of oxygen gas is about 50 to 100 mL/min, the conveying speed of the member (anode 3) to be treated is about 0.5 to 10 mm/sec, and the temperature of the substrate 2 is about 70 to 90° C., for example.

[3] The light emitting layer 5 is formed on the positive hole injecting layer 4.

The light emitting layer 5 can be formed by a vapor-phase process using a dry plating method such as vacuum deposition, for example.

[4] The electron transporting layer 6 (the first electron transporting layer 6b and the second electron transporting layer 6a) is formed on the light emitting layer 5.

It is preferable to form the electron transporting layer 6 (the first electron transporting layer 6b and the second electron transporting layer 6a) by a vapor-phase process using a dry plating method such as vacuum deposition, for example.

It should be noted that the electron transporting layer 6 can also be formed by, for example, supplying, on the light emitting layer 5, a material for forming an electron transporting layer obtained by dissolving an electron transporting material in a solvent or dispersing the electron transporting material in a dispersion medium, and then drying it (removing the solvent or the dispersion medium).

[5] The electron injecting layer 7 is formed on the electron transporting layer 6.

In the case where an inorganic material is used as the component material of the electron injecting layer 7, the electron injecting layer 7 can be formed by using a CVD method, a vapor-phase process using a dry plating method such as vacuum deposition or sputtering or the like, or application and firing of inorganic fine-particle ink, for example.

[6] The cathode 8 is formed on the electron injecting layer 7.

The cathode 8 can be formed by using a vacuum deposition method, a sputtering method, the bonding of metal foils, or application and firing of metal fine-particle ink, for example.

The light emitting element 1 is obtained through these steps.

Lastly, the sealing member 9 is placed over the obtained light emitting element 1 so as to cover it, and is bonded to the substrate 2.

Light Emitting Device

Next, an embodiment of a light emitting device according to an aspect of the invention will be described.

Figure 2:
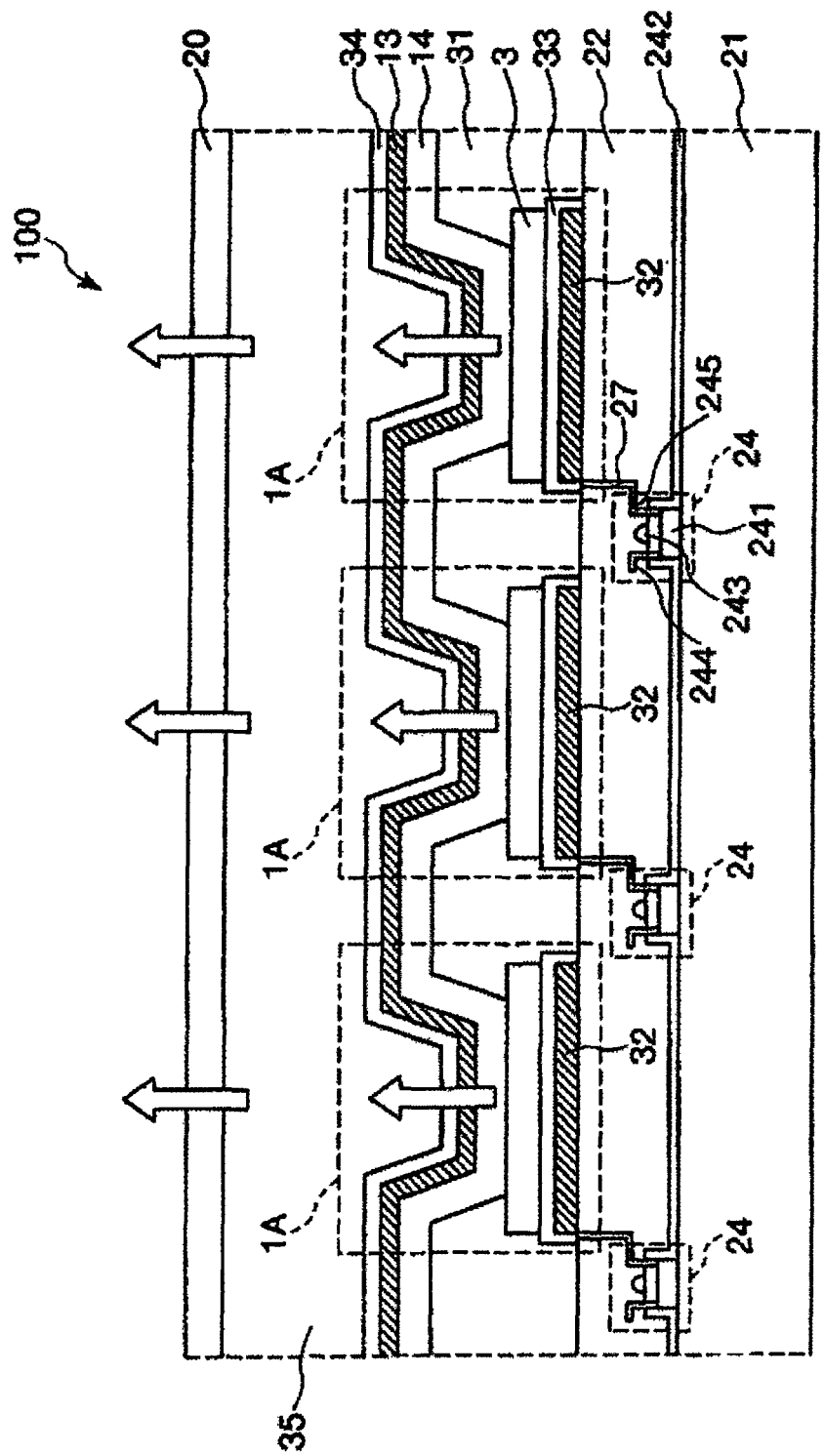
FIG. 2 is a longitudinal cross-sectional view of an embodiment of a display device in which a light emitting device according to an aspect of the invention is applied.

FIG. 2 is a longitudinal cross-sectional view of an embodiment of a display device in which a light emitting device according to an aspect of the invention is applied.

A display device 100 shown in FIG. 2 has a substrate 21, a plurality of light emitting elements 1A, and a plurality of driving transistors 24 for driving the respective light emitting elements 1A. Here, the display device 100 is a display panel having a top emission structure.

The driving transistors 24 are provided on the substrate 21, and a planarizing layer 22 made of an insulating material is formed so as to cover these driving transistors 24.

The driving transistors 24 each have a semiconductor layer 241 made of silicon, a gate insulating layer 242 formed on the semiconductor layer 241, a gate electrode 243 formed on the gate insulating layer 242, a source electrode 244, and a drain electrode 245.

The light emitting elements 1A are provided on the planarizing layer in correspondence with the respective driving transistors 24.

In the light emitting element 1A, a reflecting film 32, a corrosion preventing film 33, an anode 3, a laminated body (organic EL light emitting portion) 14, a cathode 13, and a cathode cover 34 are laminated on the planarizing layer 22 in this order. In this embodiment, the anode 3 of each light emitting element 1A constitutes a pixel electrode, and is electrically connected to the drain electrode 245 of the driving transistor 24 with a conductive portion (wiring) 27. Moreover, the cathodes 13 of the light emitting elements 1A serve as a common electrode.

The light emitting elements 1A in FIG. 2 emit light in a near-infrared region.

Partition walls 31 are provided between adjacent light emitting elements 1A. Moreover, an epoxy layer 35 made of an epoxy resin is formed on these light emitting elements 1A so as to cover them.

A sealing substrate 20 is provided on the epoxy layer 35 so as to cover it.

The display device 100 can be used as, for example, a near-infrared display for military use or the like.

With this display device 100, it is possible to emit light in a near-infrared region. Moreover, the display device 100 includes the light emitting elements 1A with a high efficiency and a long life, and thus is superior in terms of reliability.

Authentication Device

Next, an embodiment of an authentication device according to an aspect of the invention will be described.

Figure 3:
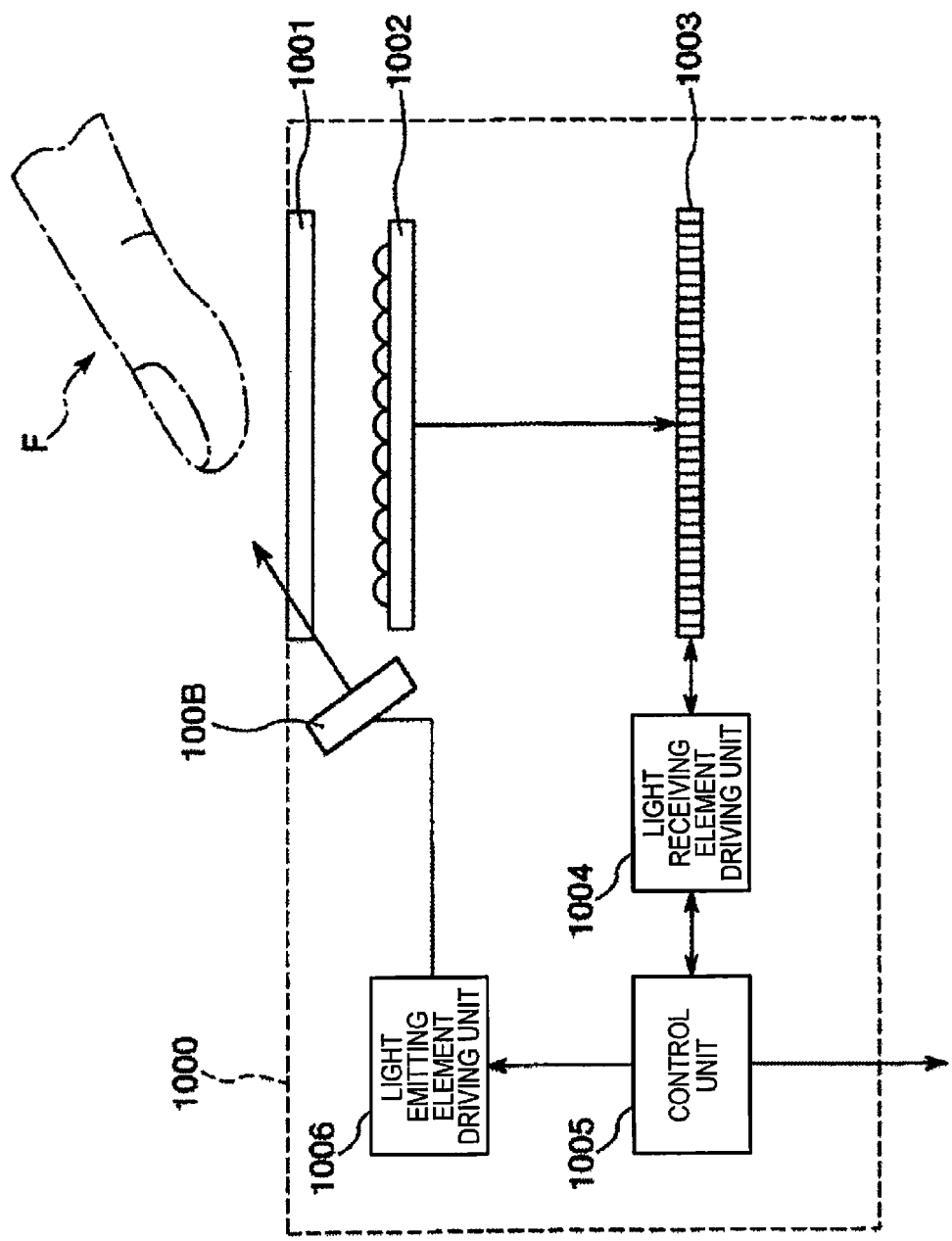
FIG. 3 shows an embodiment of an authentication device according to an aspect of the invention.

FIG. 3 shows an embodiment of an authentication device according to an aspect of the invention.

An authentication device 1000 shown in FIG. 3 is a biometric authentication device for performing authentication on an individual using biological information regarding a body portion F (a fingertip in this embodiment).

This authentication device 1000 has a light source 100B, a cover glass 1001, a microlens array 1002, a light receiving element group 1003, a light emitting element driving unit 1006, a light receiving element driving unit 1004, and a control unit 1005.

The light source 100B includes a plurality of the previously-described light emitting elements 1, and the body portion F to be imaged is irradiated with light in a near-infrared region. For example, the light emitting elements 1 of the light source 100B are disposed along the outer peripheral portion of the cover glass 1001.

The cover glass 1001 is a portion that the body portion F comes into contact with or comes close to.

The microlens array 1002 is provided on a side opposite to the side that the body portion F comes into contact with or comes close to with respect to the cover glass 1001. This microlens array 1002 is configured by a plurality of microlenses arranged in a matrix.

The light receiving element group 1003 is provided on a side opposite to the cover glass 1001 with respect to the microlens array 1002. This light receiving element group 1003 is configured by a plurality of light receiving elements provided in a matrix in correspondence with the microlenses of the microlens array 1002. A CCD (charge coupled device), CMOS, or the like can be used as the light receiving elements in the light receiving element group 1003.

The light emitting element driving unit 1006 is a driving circuit for driving the light source 100B.

The light receiving element driving unit 1004 is a driving circuit for driving the light receiving element group 1003.

The control unit 1005 is an MPU for example, and has a function for controlling the driving of the light emitting element driving unit 1006 and the light receiving element driving unit 1004.

Also, the control unit 1005 has a function for performing authentication on the body portion F by comparing the result of the light received by the light receiving element group 1003 with biometric authentication information stored in advance.

For example, the control unit 1005 generates an image pattern (e.g., a vein pattern) regarding the body portion F based on the result of the light received by the light receiving element group 1003. Then, the control unit 1005 compares the image pattern with an image pattern stored in advance as biometric authentication information, and performs authentication on the body portion F (e.g., vein authentication) based on the comparison result.

With this authentication device 1000, it is possible to perform biometric authentication using near-infrared light. Moreover, the authentication device 1000 includes the light emitting elements 1 with a high efficiency and a long life, and thus is superior in terms of reliability.

This authentication device 1000 can be integrated in various electronic devices.

Electronic Device

Figure 4:
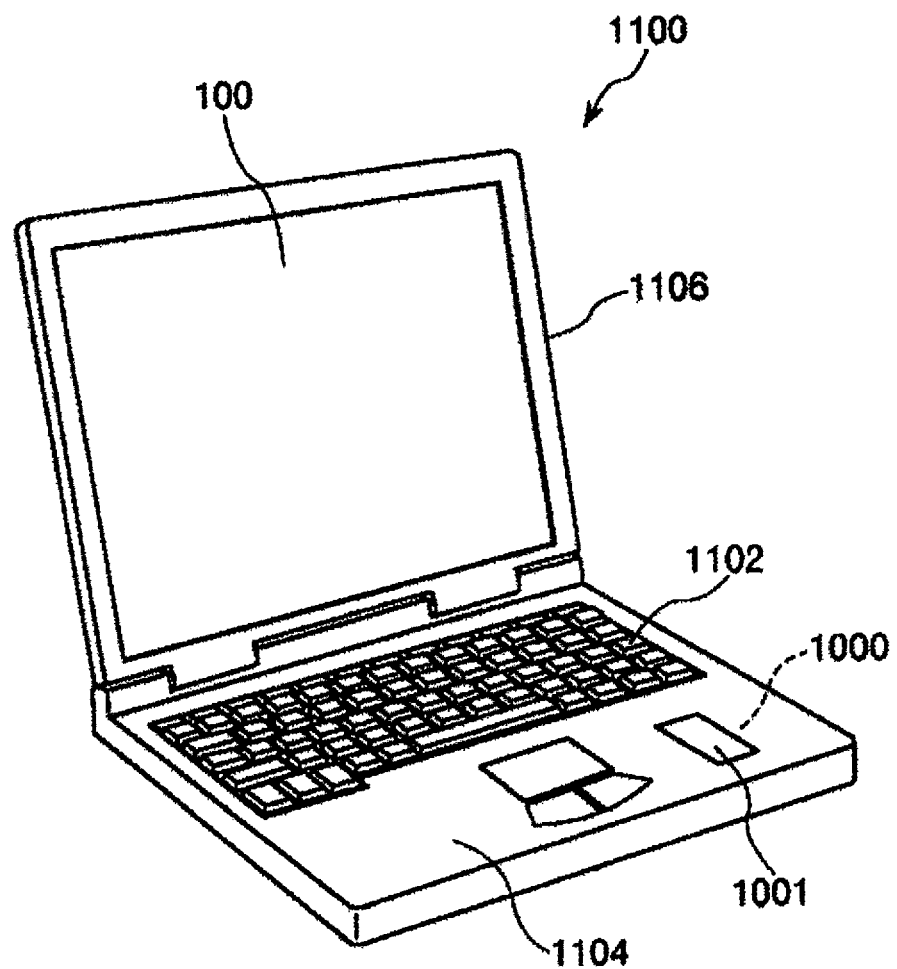
FIG. 4 is a perspective view showing a configuration of a mobile type (or notebook type) personal computer in which an electronic device according to an aspect of the invention is applied.

FIG. 4 is a perspective view showing a configuration of a mobile type (or notebook type) personal computer in which an electronic device according to an aspect of the invention is applied.

In this figure, a personal computer 1100 includes a main body portion 1104 provided with a keyboard 1102 and a display unit 1106 provided with a display portion, and the display unit 1106 is pivotably supported to the main body portion 1104 via a hinge structure portion.

In this personal computer 1100, the main body portion 1104 is provided with the authentication device 1000.

This personal computer 1100 includes the light emitting elements 1 with a high efficiency and a long life, and thus is superior in terms of reliability.

It should be noted that in addition to the personal computer (mobile type personal computer) shown in FIG. 4, an electronic device according to an aspect of the invention can also be applied in a mobile phone, a digital still camera, a television, a video camera, a viewfinder type or a direct monitor viewing type video tape recorder, a laptop type personal computer, a car navigation device, a pager, an electronic organizer (including one with a communication function), an electronic dictionary, an electronic calculator, an electronic game device, a word processor, a work station, a videophone, a television monitor for crime prevention, electronic binoculars, a POS terminal, a device provided with a touch panel (e.g., a cash dispenser for a financial institution or an automatic ticket vending machine), a medical device (e.g., an electronic thermometer, a blood pressure meter, a blood sugar meter, a pulse measuring device, a pulse wave measuring device, an electrocardiogram display device, an ultrasonic diagnostic device, or an endoscope display device), a fish finder, various measuring devices, meters (e.g., meters in a vehicle, aircraft, or ship), a flight simulator, other various monitors, a projection type display device such as a projector, and the like.

While a light emitting element, a light emitting device, an authentication device, and an electronic device according to aspects of the invention have been described based on the embodiments shown in the drawings, the invention is not limited thereto.

For example, a light emitting element and a light emitting device according to an aspect of the invention may be used as a light source for lighting.

WORKING EXAMPLES

Next, specific working examples according to aspects of the invention will be described.
1. Production of Light Emitting Material
A pyrromethene-based boron complex represented by the formula IRD-1 was synthesized through the following steps 1 to 6.

Step 1: Synthesis of ethyl ester
(5-methyl-thiophene-2-carboxylic acid ethyl ester)

[Chemical Formula 22]

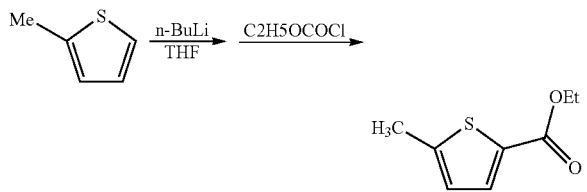

2-Methyl thiophene (1.7 g, 0.175 mol) was added to dehydrated THF (150 ml) in a 1-liter three-neck flask under an Ar gas flow, and the mixture was cooled to −65° C. Then, a 1.6 M hexane solution of n-BuLi (120 ml, 0.19 mol) was dripped therein at a temperature of −60° C. or lower, and the mixture was stirred for 1 hour as is.

Then, 2-ethyl chloroformate ($C_2H_5OCOCl$: 2.1 g, 0.19 mol) was added to dehydrated THF (10 ml), and the mixture was cooled to −55° C. or lower. This solution was dripped into the former solution at a temperature of −50° C. or lower. After the end of the dripping, cooling of the reaction solution was stopped, and the temperature of the solution was raised to room temperature overnight.

After the end of the reaction, 50 ml of water was dripped into the solution, and the mixture was stirred. An organic layer was isolated using a separating funnel, and was concentrated under a reduced pressure.

The obtained crude substance (35 g) was purified by silica gel chromatography (500 g; development: $CH_2Cl_2$/Hep=½→$CH_2Cl_2$/Hep=1/1). Thus the target ethyl ester was obtained (product amount: 8.1 g, yield: 27%).

Step 2: Synthesis of hydrazide
(5-methyl-thiophene-2-carboxylic acid hydrazide)

[Chemical Formula 23]

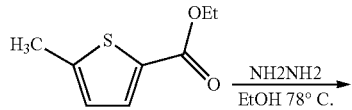

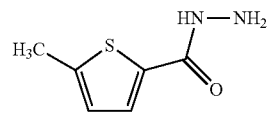

Under an Ar gas flow, the ethyl ester (8.1 g, 48 mmol) obtained in Step 1 was suspended in ethanol (100 ml) in a 300-ml three-neck flask, $NH_2NH_2.H_2O$ (7 ml, 140 mmol) was added thereto, and then the mixture was heated to 78° C. and allowed to react overnight. The reaction solution was monitored. After confirming that no ethyl ester remained, the reaction solution was cooled to room temperature.

The reaction solution was transferred to a 1-liter beaker, 300 ml of $CH_2Cl_2$ and 100 ml of distilled water were added thereto, and the mixture was stirred. All of the mixture was transferred to a 1-liter separating funnel. An organic layer was isolated, and was washed twice with distilled water. Lastly, after being isolated, the organic layer was concentrated. About 20 ml of heptane was added thereto, and the precipitation was filtered. Thus, the target hydrazide was obtained (product amount: 3 g, yield: 40%).

Step 3: Synthesis of intermediate (5-methyl-thiophene-2-carboxylic acid [1-(2-hydroxy-4-methoxyphenyl)-ethylidene]-hydrazide)

[Chemical Formula 24]

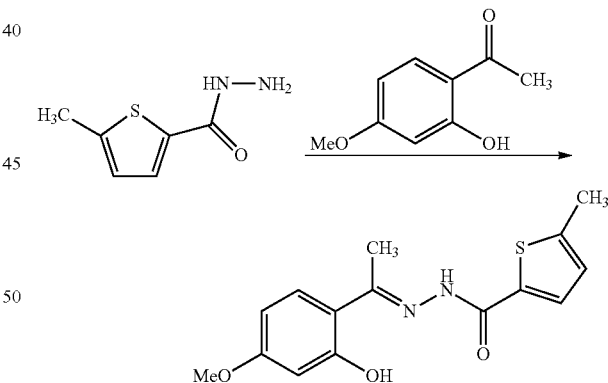

Under an Ar gas flow, the hydrazide (2.64 g, 16.9 mmol) obtained in Step 2 and 2-hydroxy-4-methoxy acetophenone (2.84 g, 17.1 mmol) were added to a 30 ml three-neck flask, and stirred at an outside temperature of 80° C. for 10 hours.

After the mixture was cooled to room temperature, in order to isolate the target intermediate from the reaction solution, THF was added and the mixture was concentrated under a reduced pressure. Then, heptane was added thereto to cause precipitation. Thus, the target intermediate was obtained (product amount: 4.4 g, yield: 85%).

Step 4: Synthesis of diketone (1-[4-methoxy-2-(5-methyl-thiophene-2-carbonyl)-phenyl]-ethanone)

[Chemical Formula 25]

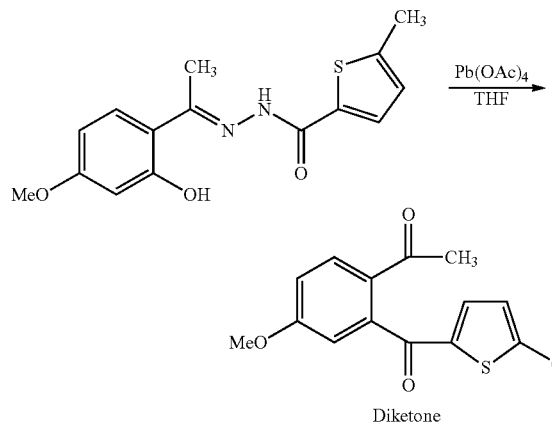

Diketone

Under an Ar gas flow, the intermediate (2.25 g, 7.39 mmol) obtained in Step 3 was suspended in dehydrated THF (35 ml) in a 100-ml three-neck flask, and Pb(OAc)$_4$ (3.93 g, 8.86 mmol) was slowly added thereto at a temperature of 30° C. or lower. After being stirred overnight, the reaction solution was filtered. The filtrate was concentrated under a reduced pressure, was washed/extracted with CH$_2$Cl$_2$ (100 ml) and distilled water (100 ml), and then was concentrated. Thus, the target diketone was obtained (product amount: 2.2 g).

Step 5: Synthesis of Precursor

[Chemical Formula 26]

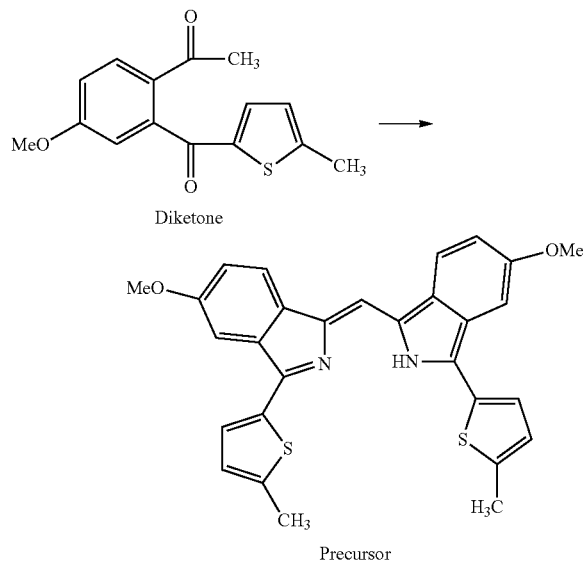

Precursor

Under an Ar gas flow, the diketone (3.0 g, 10.9 mmol) obtained in Step 4 was added to 30 ml of acetic acid and EtOH (100 ml) in a 100-ml three-neck flask, and the mixture was heated at an inner temperature of 65° C. Then, ammonium acetate (5.1 g, 66.4 mmol) and ammonium chloride (583 mg, 10.9 mmol) were added thereto, and the mixture was stirred for 5 hours as is. Furthermore, the reaction temperature was raised to 85° C., and the mixture was stirred for about 1 hour.

The reaction solution was cooled to room temperature, and was concentrated under a reduced pressure. The residue was poured into water (300 ml), and extraction was performed using CH$_2$Cl$_2$. The obtained organic layer was concentrated under a reduced pressure, and the obtained crude substance was purified by silica gel chromatography (100 g; development: CH$_2$Cl$_2$→CH$_2$Cl$_2$+THF (50:50)). Thus, the target precursor was obtained (product amount: 830 mg, yield: 29%).

Step 6: Synthesis of IRD-1

[Chemical Formula 27]

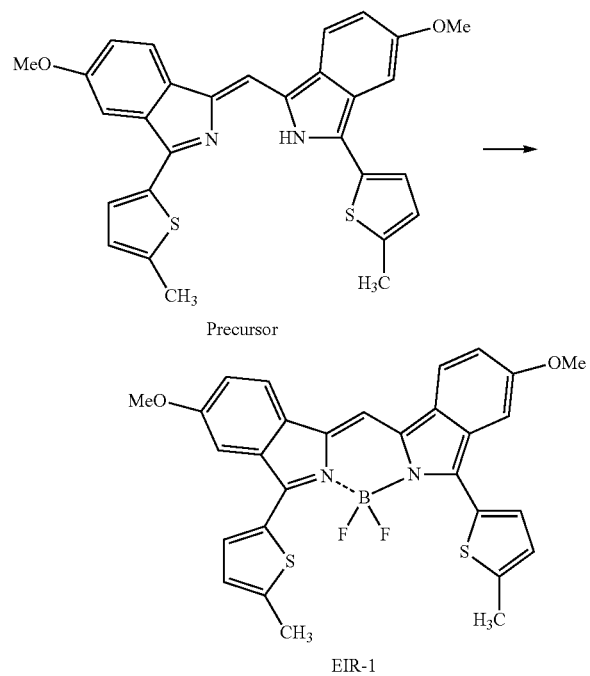

EIR-1

Under an Ar gas flow, the precursor (830 mg, 1.58 mmol) obtained in Step 5 was dissolved in dehydrated CH$_2$Cl$_2$ (100 ml) in a 100-ml three-neck flask, and the solution was cooled to 5° C. N,N-diisopropylethylamine (611 mg, 4.73 mmol) and BF$_3$·OEt$_2$ (1.34 g, 9.46 mmol) were dripped therein in this order, and the temperature of the mixture was raised to room temperature. After being stirred for about 2 hours, water (100 ml) was added and washing was performed. The obtained organic layer was purified by silica gel chromatography (100 g; development: CH$_2$Cl$_2$). Thus, the target compound represented by the formula IRD-1 was obtained (product amount: 600 mg, yield: 70%).

The obtained compound had a dark blue appearance. Moreover, the obtained compound was subjected to sublimation purification at the set temperature of 280° C. for 10 hours.

Figure 5:
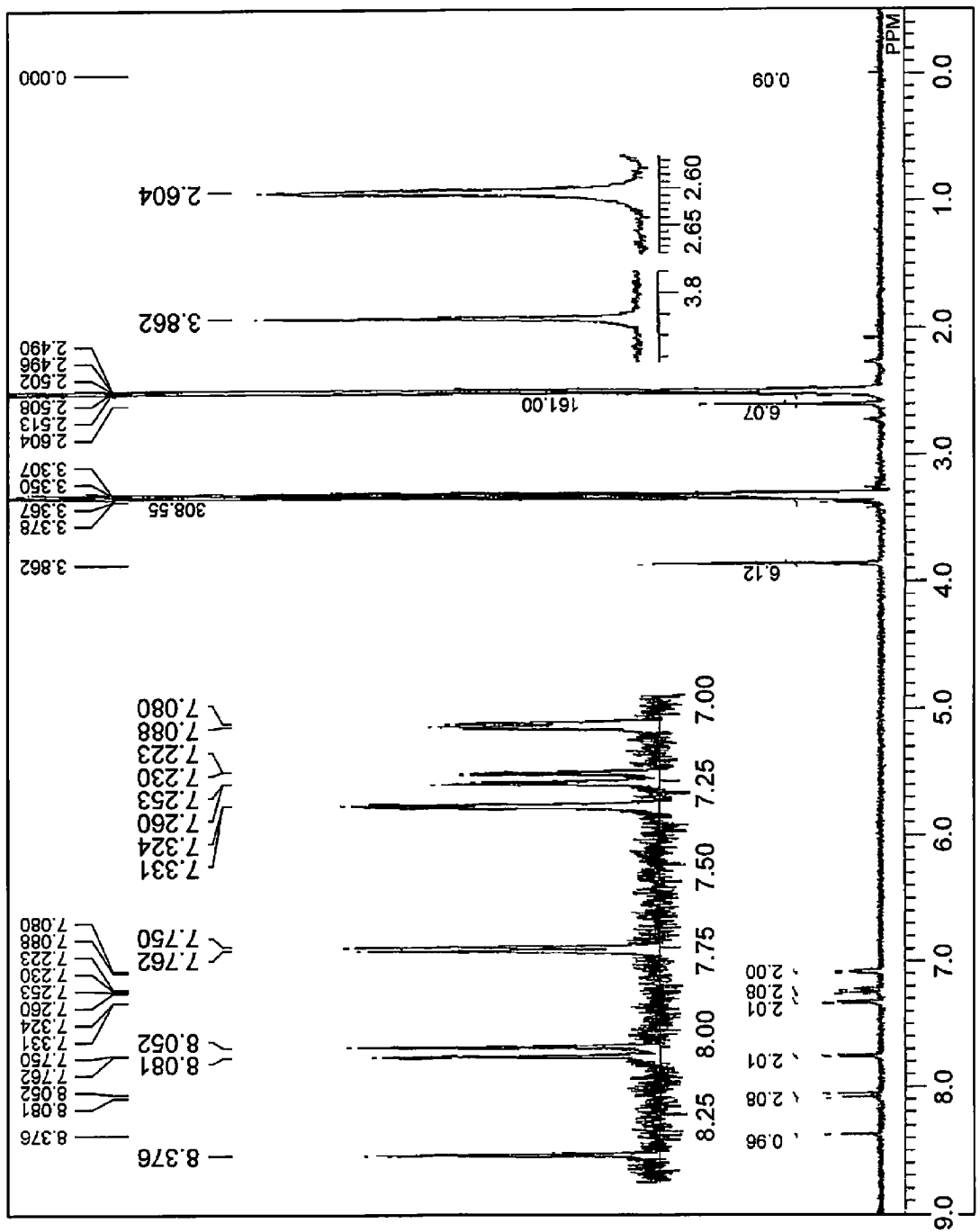
FIG. 5 is an NMR spectrum of a light emitting material (IRD-1) used in working examples of the invention.
Figure 6:
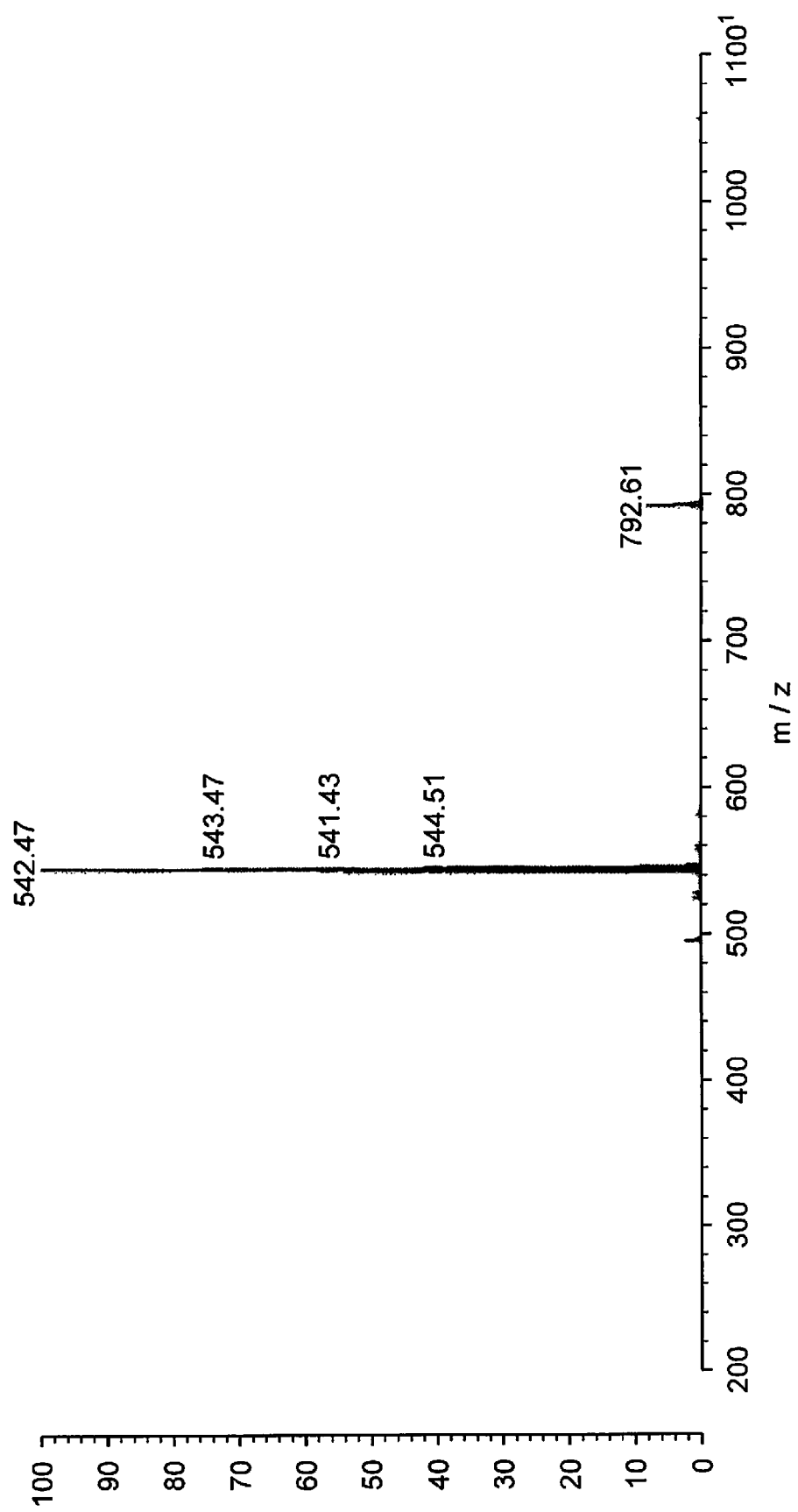
FIG. 6 is an MS spectrum of a light emitting material (IRD-1) used in working examples of the invention.
Figure 7A:
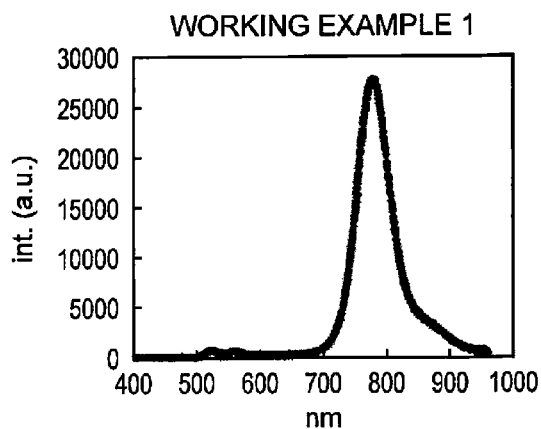
FIGS. 7A to 7F are graphs illustrating light emission spectra of light emitting elements according to Working Examples 1 to 6 of the invention.
Figure 7B:
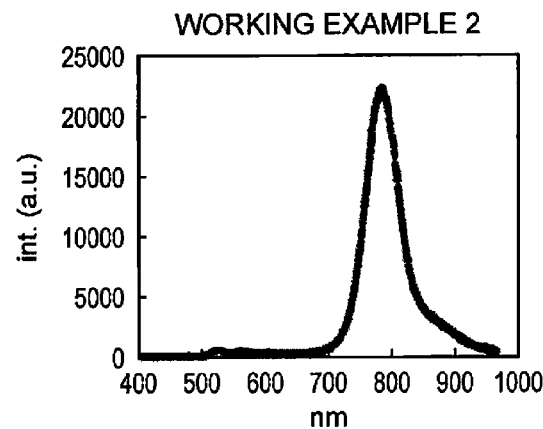
Figure 7C:
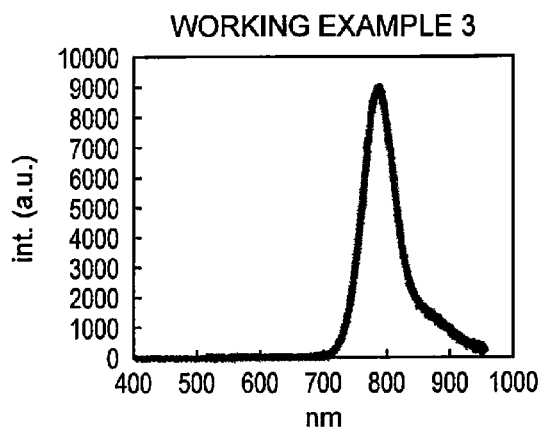
Figure 7D:
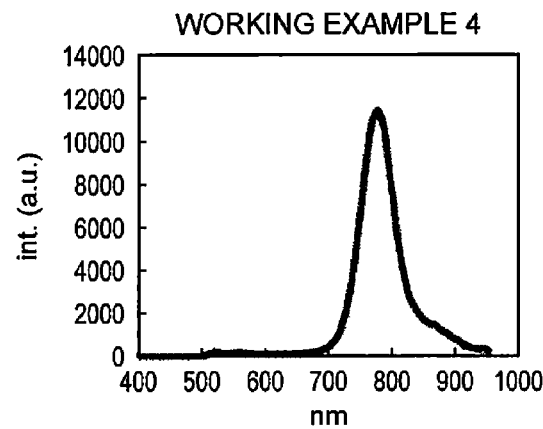
Figure 7E:
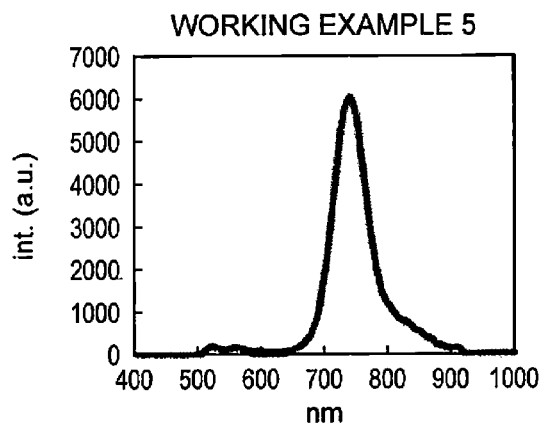
Figure 7F:
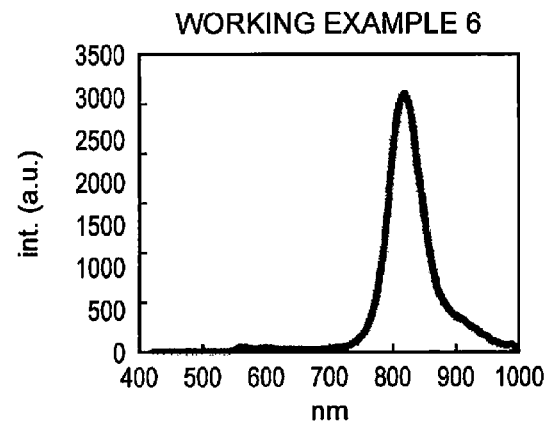
Figure 8A:
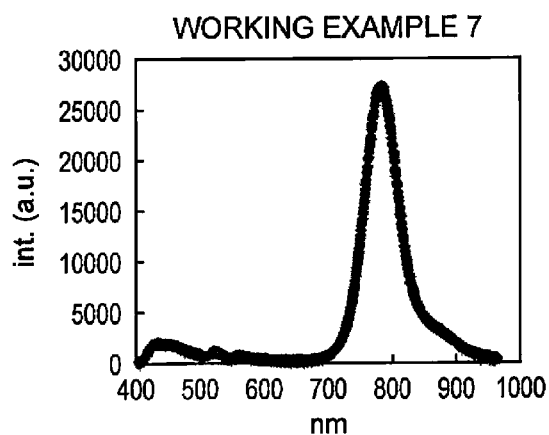
FIGS. 8A to 8E are graphs illustrating light emission spectra of light emitting elements according to Working Examples 7 to 11 of the invention.
Figure 8B:
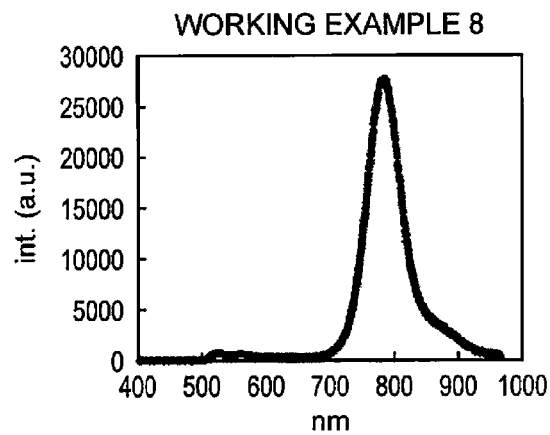
Figure 8C:
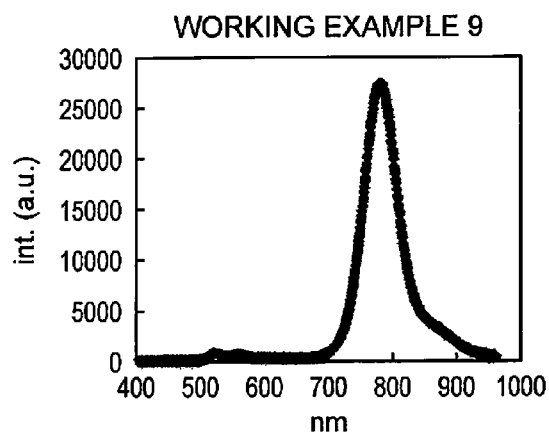
Figure 8D:
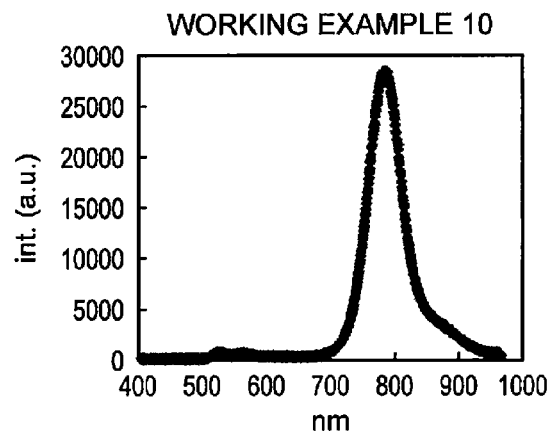
Figure 8E:
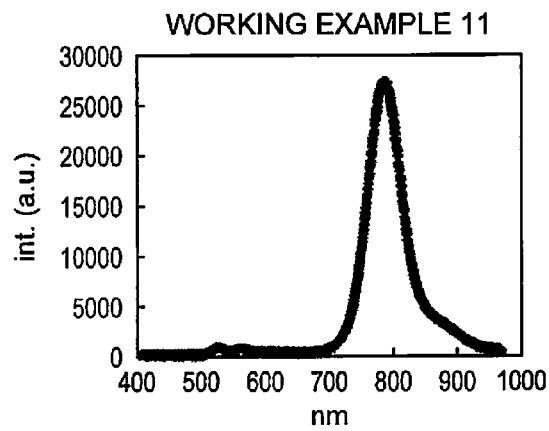
Figure 9A:
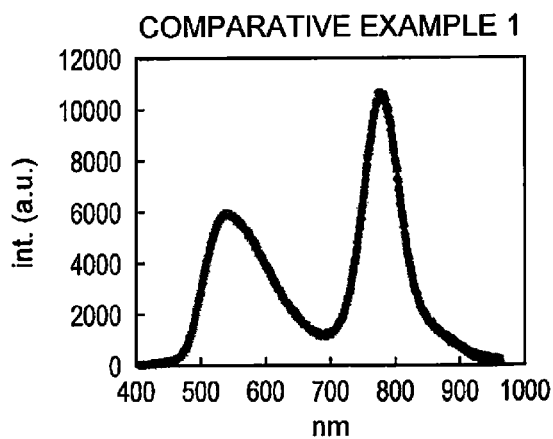
FIGS. 9A to 9E are graphs illustrating light emission spectra of light emitting elements according to Comparative Examples 1 to 3 and Reference Examples 1 and 2.
Figure 9B:
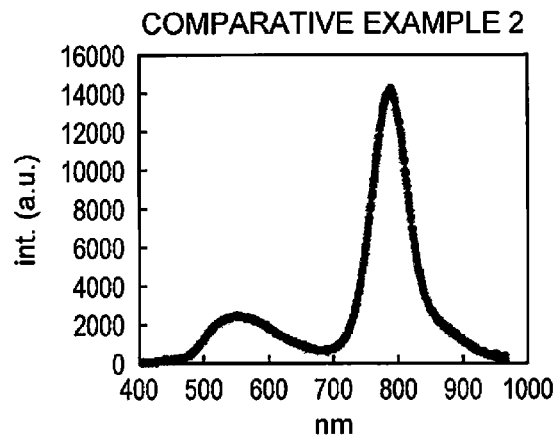
Figure 9C:
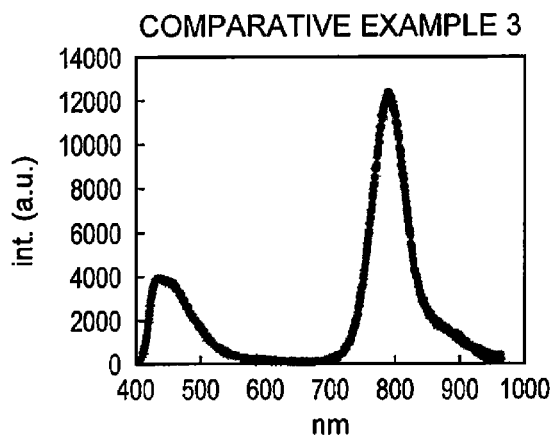
Figure 9D:
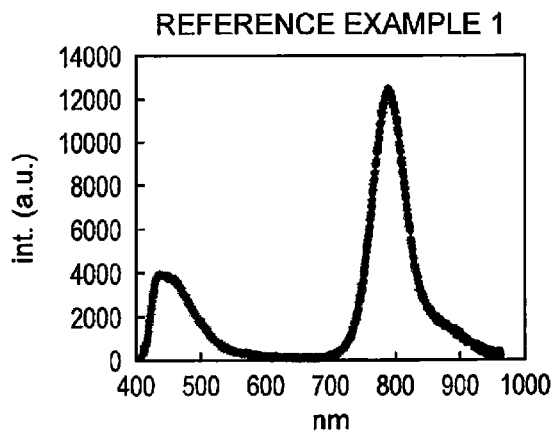
Figure 9E:
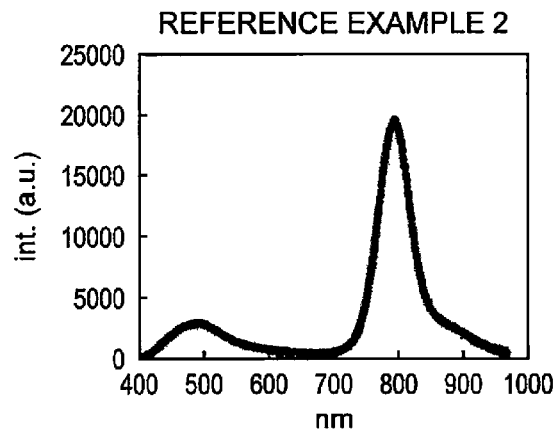

FIG. 5 shows NMR spectrum data (solvent species: DMSO ((CD$_3$)$_2$SO)) of the obtained compound (IRD-1). In addition, FIG. 6 shows MS spectrum data (M+=544) of the obtained compound (IRD-1).

2. Production of Light Emitting Element

Working Example 1

<1> First, a transparent glass substrate having an average thickness of 0.5 mm was prepared. Next, an ITO electrode (anode) having an average thickness of 100 nm was formed on this substrate by a sputtering method.

The substrate was subjected to ultrasonic cleaning while being immersed in acetone and 2-propanol in this order, and then oxygen plasma treatment and argon plasma treatment were performed thereon. These plasma treatments were performed under conditions in which the plasma power was 100 W, the flow rate of the gas was 20 sccm, and the treatment time was 5 seconds in a state in which the substrate was heated to 70 to 90° C.

<2> The compound represented by the formula HTL-1 was deposited on the ITO electrode by a vacuum deposition method to form a positive hole injecting layer having an average thickness of 50 nm.

<3> The component material of the light emitting layer was deposited on the positive hole injecting layer by a vacuum deposition method to form a light emitting layer having an average thickness of 25 nm. Regarding the component material of the light emitting layer, the compound represented by the formula IRD-1 (pyrromethene-based boron complex) was used as the light emitting material (guest material), and the compound represented by the formula H-5 (tetracene-based material) was used as the host material. Moreover, the content (doping concentration) of the light emitting material (dopant) in the light emitting layer was set to 0.25 wt %.

<4> The compound represented by the formula ETL1-3 (azaindolizine-based compound) was deposited on the light emitting layer by a vacuum deposition method to form an electron transporting layer (first electron transporting layer) having an average thickness of 80 nm.

<5> Lithium fluoride (LiF) was deposited on the electron transporting layer by a vacuum deposition method to form an electron injecting layer having an average thickness of 1 nm.

<6> Al was deposited on the electron injecting layer by a vacuum deposition method. Thus, a cathode that was constituted by Al and had an average thickness of 100 nm was formed.

<7> A protection cover (sealing member) made of glass was placed over the formed layers so as to cover them, and was fixed and sealed with an epoxy resin.

A light emitting element was produced through these steps.

Working Example 2

A light emitting element was produced in the same manner as in Working Example 1, except that the content (doping concentration) of the light emitting material (dopant) in the light emitting layer was set to 0.5 wt %.

Working Example 3

A light emitting element was produced in the same manner as in Working Example 1, except that the content (doping concentration) of the light emitting material (dopant) in the light emitting layer was set to 1.0 wt %.

Working Example 4

A light emitting element was produced in the same manner as in Working Example 2, except that the compound represented by the formula IRD-2 was used as the light emitting material of the light emitting layer.

Working Example 5

A light emitting element was produced in the same manner as in Working Example 2, except that the compound represented by the formula IRD-4 was used as the light emitting material of the light emitting layer.

Working Example 6

A light emitting element was produced in the same manner as in Working Example 2, except that the compound represented by the formula IRD-5 was used as the light emitting material of the light emitting layer.

Working Example 7

A light emitting element was produced in the same manner as in Working Example 1, except that the thickness of the light emitting layer was set to 10 nm and the thickness of the electron transporting layer was set to 95 nm.

Working Example 8

A light emitting element was produced in the same manner as in Working Example 1, except that the thickness of the light emitting layer was set to 50 nm and the thickness of the electron transporting layer was set to 55 nm.

Working Example 9

A light emitting element was produced in the same manner as in Working Example 1, except that a second electron transporting layer was provided between the light emitting layer and the electron transporting layer (first electron transporting layer).

The second electron transporting layer was formed by depositing the compound represented by the formula ETL2-30 (anthracene-based compound) on the first electron transporting layer by a vacuum deposition method. Moreover, the thickness of the first electron transporting layer was set to 70 nm and the thickness of the second electron transporting layer was set to 10 nm.

Working Example 10

A light emitting element was produced in the same manner as in Working Example 9, except that the thickness of the first electron transporting layer was set to 30 nm and the thickness of the second electron transporting layer was set to 50 nm.

Working Example 11

A light emitting element was produced in the same manner as in Working Example 9, except that the thickness of the first electron transporting layer was set to 5 nm and the thickness of the second electron transporting layer was set to 75 nm.

Comparative Example 1

A light emitting element was produced in the same manner as in Working Example 1, except that $Alq_3$ was used as the host material of the light emitting layer.

Comparative Example 2

A light emitting element was produced in the same manner as in Working Example 2, except that $Alq_3$ was used as the host material of the light emitting layer.

Comparative Example 3

A light emitting element was produced in the same manner as in Working Example 3, except that Alga was used as the host material of the light emitting layer.

Reference Example 1

A light emitting element was produced in the same manner as in Working Example 2, except that an anthracene-based material (BH513, manufactured by Idemitsu Kosan Co., Ltd.) was used as the host material of the light emitting layer.

Reference Example 2

A light emitting element was produced in the same manner as in Working Example 2, except that a mixture of two anthracene-based materials (BH513 and HT550, manufactured by Idemitsu Kosan Co., Ltd.) was used as the host material of the light emitting layer.

3. Evaluation

A constant current of 100 mA/cm² was applied to the light emitting element of each of the working examples, comparative examples and reference examples using a constant current power source (KEITHLEY 2400, manufactured by TOYO Corporation), and the light emission peak wavelengths at that time were measured using a miniature fiber optic spectrometer (S2000, manufactured by Ocean Optics, Inc.). Light emission power was measured using an optical power measuring instrument (Optical Power Meter 8230, manufactured by ADC Corporation). Also, the voltage value (driving voltage) at that time was measured. Also, the external quantum efficiency at that time in the wavelength region of 650 nm to 1000 nm was measured.

Furthermore, a constant current of 400 mA/cm² was applied to the light emitting element, and the initial luminance was measured. Then, the period of time (LT80) until the luminance became 80% of the initial luminance was measured.

Table 1, and FIGS. 7 to 10 show the measurement results.

TABLE 1

| | Element composition | | | | | | Evaluation | | | | Life span evaluation @400 mA/cm² | |
|---|---|---|---|---|---|---|---|---|---|---|---|---|
| | Light emitting layer | | | | Electron transporting layer | | Element characteristics@100 mA/cm² | | | | | |
| | Host | Light emitting material | Doping concentration (%) | Film thickness (nm) | ETL1 film thickness (nm) | ETL2 film thickness (nm) | Peak wavelength (nm) | Voltage (V) | PW (mW/cm²) | IR portion EQE (%) 650-1000 nm | LT80/hr | P.W. (mW/cm²) |
| Work. Exp. 1 | H-5 | IRD-1 | 0.25 | 25 | 80 | — | 775 | 5.0 | 3.2 | 2.0 | 30 | 11.2 |
| Work. Exp. 2 | | | 0.50 | 25 | 80 | — | 780 | 5.2 | 2.4 | 1.5 | 40 | 8.6 |
| Work. Exp. 3 | | | 1.00 | 25 | 80 | — | 780 | 5.9 | 0.9 | 0.6 | 390 | 1.7 |
| Work. Exp. 4 | | IRD-2 | 0.50 | 25 | 80 | — | 790 | 5.3 | 3.1 | 1.8 | 45 | 10.0 |
| Work. Exp. 5 | | IRD-4 | 0.50 | 25 | 80 | — | 740 | 5.2 | 1.5 | 0.9 | 50 | 5.0 |
| Work. Exp. 6 | | IRD-5 | 0.50 | 25 | 80 | — | 820 | 5.2 | 0.8 | 0.5 | 45 | 2.8 |
| Work. Exp. 7 | | IRD-1 | 0.25 | 10 | 95 | — | 775 | 4.9 | 3.2 | 2.0 | 15.0 | 11.0 |
| Work. Exp. 8 | | | 0.25 | 50 | 55 | — | 775 | 5.6 | 3.2 | 2.0 | 40.0 | 10.2 |
| Work. Exp. 9 | | | 0.25 | 25 | 70 | 10 | 775 | 5.5 | 3.2 | 2.0 | 50 | 11.2 |
| Work. Exp. 10 | | | 0.25 | 25 | 30 | 50 | 775 | 5.8 | 3.2 | 2.0 | 150 | 11.2 |
| Work. Exp. 11 | | | 0.25 | 25 | 5 | 75 | 775 | 6.0 | 3.2 | 2.0 | 300 | 11.2 |
| Comp. Exp. 1 | Alq | IRD-1 | 0.25 | 25 | 80 | — | 770 | 5.0 | 1.4 | 0.59 | 10 | 4.90 |
| Comp. Exp. 2 | | | 0.50 | 25 | 80 | — | 780 | 6.3 | 0.9 | 0.56 | 50 | 3.36 |
| Comp. Exp. 3 | | | 1.00 | 25 | 80 | — | 785 | 7.9 | 0.4 | 0.28 | 100 | 1.40 |
| Ref. Exp. 1 | BH513 | IRD-1 | 0.50 | 25 | 80 | — | 780 | 7.2 | 1.5 | 0.9 | <20 | 5.6* |
| Ref. Exp. 2 | BH513 + HT550 | | 0.50 | 25 | 80 | — | 785 | 5.6 | 2.2 | 1.3 | <20 | 7.5* |

*P.W. including visible light

As is clear from Table 1, the light emitting elements of the working examples emit light in a near-infrared region, and have a superior balance between light emission efficiency and life span compared with the light emitting elements of the comparative examples and reference examples.

Moreover, as shown in FIGS. 7 to 9, the light emitting elements of the working examples emit substantially no light outside of the near-infrared region. In contrast, it was observed that the light emitting elements of the comparative examples and reference examples emitted relatively strong light outside of the near-infrared region. It is inferred that this is because the host materials of the light emitting elements of the working examples emit no light, whereas the host materials of the light emitting elements of the comparative examples and reference examples emit light.

Figure 10:
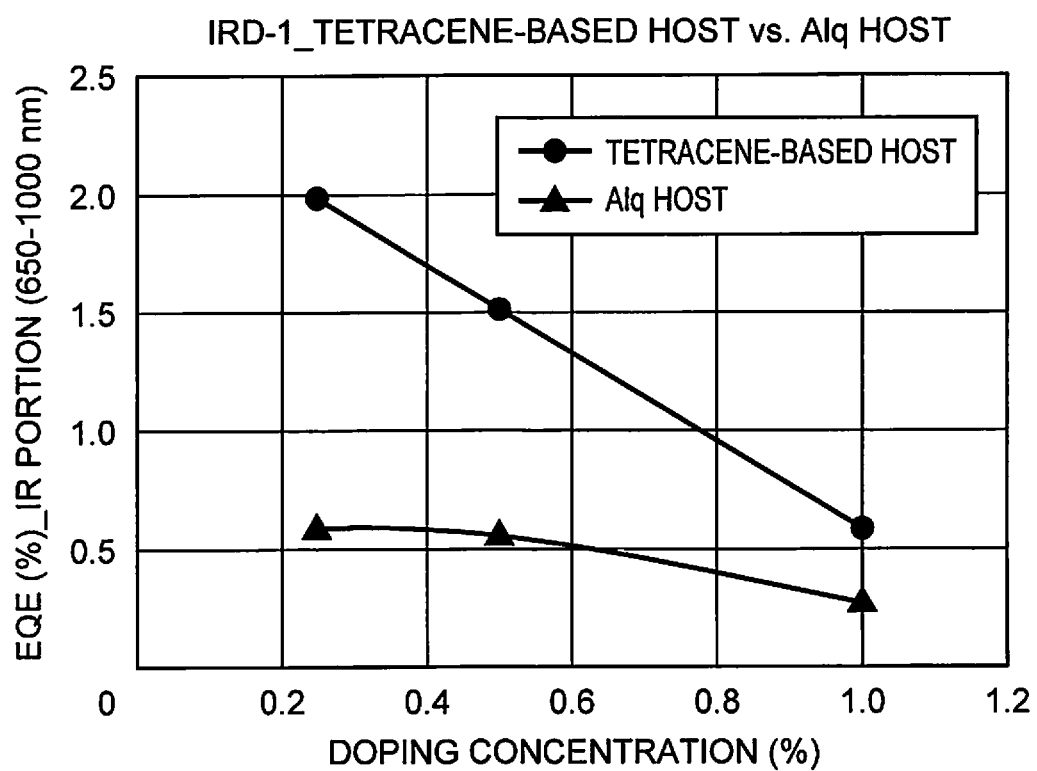
FIG. 10 is a graph illustrating a relationship between the light emitting material doping amount and an external quantum efficiency in the light emitting layers of the light emitting elements according to Working Examples 1 to 3 and Comparative Examples 1 to 3 of the invention.

Moreover, when the light emitting elements of Working Examples 1 to 3 are compared with those of Comparative Examples 1 to 3, the light emitting elements of Working Examples 1 to 3 have a higher external quantum efficiency than those of Comparative Examples 1 to 3 as shown in FIG. 10, and the concentration quenching property can be reduced.

What is claimed is:

1. A light emitting element comprising:
an anode;
a cathode; and
a light emitting layer that is provided between the anode and the cathode and that emits light having a wavelength of 700 nm or more in a near-infrared region by conducting current between the anode and the cathode,
wherein the light emitting layer includes a compound represented by one of the following formulas (2) to (6) as a light emitting material and a compound represented by the following formula IRH-1 as a host material for retaining the light emitting material (2)
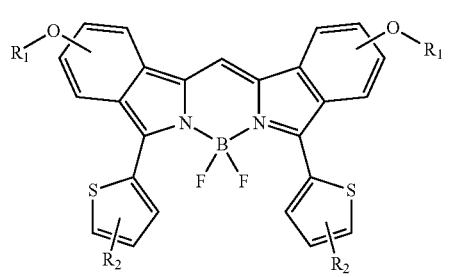

(3)
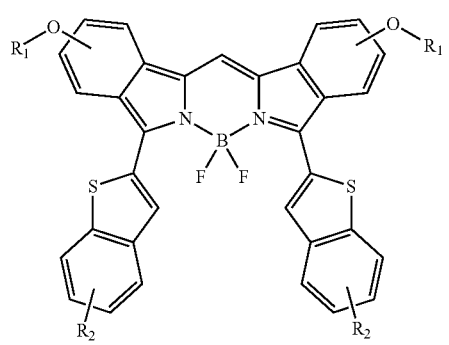

(4)
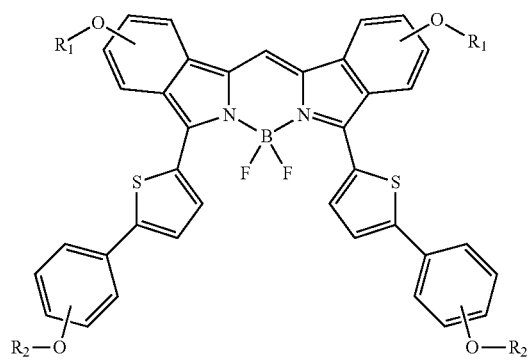

(5)
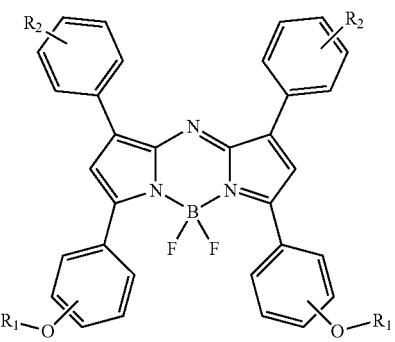

(6)
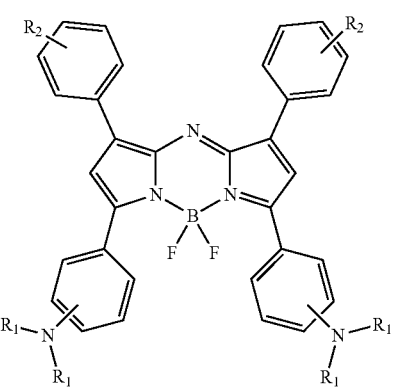

in the formulas (2) to (6), each $R_1$ independently represents an alkyl group or aryl group that has one to five carbon atoms, and each $R_2$ independently represents a hydrogen atom, or an alkyl group or aryl group that has one to five carbon atoms,

[Chemical Formula 2]

IRH-1
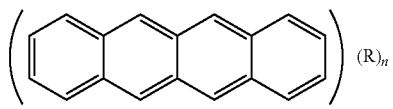

in the formula IRH-1, n represents a natural number from 1 to 12, and each R independently represents a hydrogen atom, an alkyl group, an aryl group that may have a substituent group, or an arylamino group.

2. The light emitting element according to claim 1, wherein the host material is a compound represented by the following formula IRH-2

[Chemical Formula 3]

IRH-2
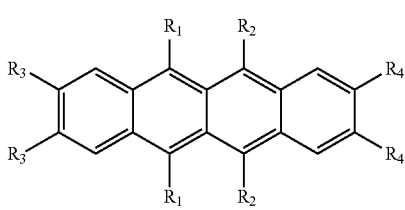

in the formula IRH-2, $R_1$ to $R_4$ independently represent a hydrogen atom, an alkyl group, an aryl group that may have a substituent group, or an arylamino group, and $R_1$ to $R_4$ may be the same as or different from each other.

3. The light emitting element according to claim 1, wherein the host material is a compound represented by the following formula IRH-3

[Chemical Formula 4]

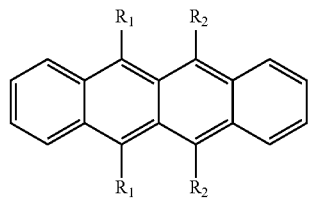

IRH-3 in the formula IRH-3, $R_1$ and $R_2$ independently represent a hydrogen atom, an alkyl group, an aryl group that may have a substituent group, or an arylamino group, and $R_1$ and $R_2$ may be the same as or different from each other.

4. The light emitting element according to claim 1, wherein the host material is constituted by a carbon atom and a hydrogen atom.

5. The light emitting element according to claim 1, wherein the light emitting material is contained in the light emitting layer in an amount of 0.25 wt % or more to 1.0 wt % or less.

6. The light emitting element according to claim 1, comprising an electron transporting layer that is provided between the light emitting layer and the cathode and that includes a compound having an anthracene skeleton.

7. The light emitting element according to claim 6, wherein the electron transporting layer includes a first electron transporting layer that includes an azaindolizine-based compound having an azaindolizine skeleton and an anthracene skeleton in a molecule thereof, and a second electron transporting layer that is provided between the first electron transporting layer and the light emitting layer and that includes an anthracene-based compound, the anthracene-based compound having an anthracene skeleton in a molecule thereof and being constituted by a carbon atom and a hydrogen atom.

8. The light emitting element according to claim 7, wherein the second electron transporting layer is thicker than the first electron transporting layer.

9. The light emitting element according to claim 7, wherein the second electron transporting layer has a thickness of 10 nm or more to 75 nm or less.

10. The light emitting element according to claim 6, wherein the electron transporting layer has a thickness of 55 nm or more to 95 nm or less.

11. The light emitting element according to claim 1, wherein the light emitting layer has a thickness of 10 nm or more to 50 nm or less.

12. A light emitting device, comprising the light emitting element according to claim 1.

13. An authentication device, comprising the light emitting element according to claim 1.

14. An electronic device, comprising the light emitting element according to claim 1.

* * * * *